(12) United States Patent
Lim et al.

(10) Patent No.: US 12,342,677 B2
(45) Date of Patent: Jun. 24, 2025

(54) DISPLAY DEVICE AND METHOD FOR FABRICATING ELECTRONIC DEVICE BY USING THE SAME

(71) Applicant: Samsung Display Co., Ltd., Yongin-si (KR)

(72) Inventors: Heesung Lim, Seoul (KR); Kyoungwoo Park, Hwaseong-si (KR); Seyoon Park, Seoul (KR); Sanghee Choi, Cheonan-si (KR); Minsu Kim, Cheonan-si (KR); Jinhyuk Park, Hwaseong-si (KR); Jong-Nam Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/882,957

(22) Filed: Aug. 8, 2022

(65) Prior Publication Data

US 2023/0072104 A1    Mar. 9, 2023

(30) Foreign Application Priority Data

Sep. 6, 2021    (KR) .................. 10-2021-0118644
Sep. 6, 2021    (KR) .................. 10-2021-0118645

(51) Int. Cl.
| H10K 50/844 | (2023.01) |
| H10K 59/40 | (2023.01) |
| H10K 71/00 | (2023.01) |
| H10K 102/00 | (2023.01) |

(52) U.S. Cl.
CPC .......... *H10K 50/844* (2023.02); *H10K 59/40* (2023.02); *H10K 71/00* (2023.02); *H10K 2102/311* (2023.02)

(58) Field of Classification Search
CPC ............ H10K 77/111; H10K 2102/311; H10K 59/12; G02F 1/133305; H05K 1/028
See application file for complete search history.

(56) References Cited

U.S. PATENT DOCUMENTS

| 9,535,522 B2 | 1/2017 | Ahn |
| 9,857,908 B2 | 1/2018 | Choi |
| 10,020,464 B2 | 7/2018 | Son et al. |
| 10,490,755 B2 | 11/2019 | Jang et al. |
| 11,061,497 B2 | 7/2021 | Son et al. |

(Continued)

FOREIGN PATENT DOCUMENTS

| KR | 1020170020626 A | 2/2017 |
| KR | 1020180033364 A | 4/2018 |

(Continued)

*Primary Examiner* — Yuzhen Shen
(74) *Attorney, Agent, or Firm* — CANTOR COLBURN LLP

(57) ABSTRACT

A display device includes a display module, a flexible circuit film, and a cover film. The display module is divided into a first area including pixels, a second area bent with respect to an imaginary axis extending in a first direction, and a third area, on which a driving chip connected to the pixels is disposed. The flexible circuit film is disposed at at least a portion of the third area of the display module and connected to the display module. The cover film covers the second area of the display module, at least a portion of the flexible circuit film, and an entirety of the driving chip.

25 Claims, 39 Drawing Sheets

(56) References Cited

U.S. PATENT DOCUMENTS

| | | | | |
|---|---|---|---|---|
| 2002/0041950 A1* | 4/2002 | Ueno | ............... | H05K 1/0218 |
| | | | | 428/209 |
| 2011/0308849 A1* | 12/2011 | Kondo | ............ | H05K 3/0055 |
| | | | | 174/266 |
| 2014/0152646 A1* | 6/2014 | Kang | ............. | G09G 3/035 |
| | | | | 29/829 |
| 2016/0249822 A1* | 9/2016 | Agricola | ......... | A61N 1/0541 |
| | | | | 600/544 |
| 2017/0153734 A1* | 6/2017 | Kim | ............... | G06F 3/0445 |
| 2017/0294495 A1 | 10/2017 | Shyu et al. | | |
| 2017/0323779 A1* | 11/2017 | Um | ............... | G02F 1/13454 |
| 2018/0275785 A1* | 9/2018 | Nakamura | ........ | G06F 3/041 |
| 2019/0221774 A1* | 7/2019 | Jeon | ............. | H10K 77/111 |
| 2019/0305234 A1* | 10/2019 | Jung | ............. | H10K 59/87 |
| 2019/0318689 A1* | 10/2019 | Kim | ............. | H10K 59/131 |
| 2020/0185641 A1 | 6/2020 | Jeong et al. | | |
| 2020/0271977 A1* | 8/2020 | Chen | ............. | G02F 1/13452 |
| 2020/0381671 A1 | 12/2020 | Cha et al. | | |
| 2021/0104695 A1 | 4/2021 | Jung | | |
| 2021/0110782 A1 | 4/2021 | Hur et al. | | |
| 2021/0168973 A1 | 6/2021 | Sim et al. | | |
| 2021/0202460 A1* | 7/2021 | Shin | ............. | H10K 50/844 |
| 2022/0246871 A1* | 8/2022 | Kim | ............. | H10K 59/123 |
| 2022/0293016 A1* | 9/2022 | Yang | ............. | H10K 71/00 |
| 2022/0320239 A1* | 10/2022 | Wei | ............. | G09F 9/33 |

FOREIGN PATENT DOCUMENTS

| | | |
|---|---|---|
| KR | 1020180041775 A | 4/2018 |
| KR | 101910622 B1 | 10/2018 |
| KR | 1020190121469 A | 10/2019 |
| KR | 1020210012563 A | 2/2021 |
| KR | 102230122 B1 | 3/2021 |
| KR | 1020210042761 A | 4/2021 |

\* cited by examiner

DISPLAY DEVICE AND METHOD FOR FABRICATING ELECTRONIC DEVICE BY USING THE SAME

This application claims priority under 35 U.S.C. § 119 to Korean Patent Application No. 10-2021-0118644, filed on Sep. 6, 2021, and Korean Patent Application No. 10-202Q1-0118645, filed on Sep. 6, 2021, and all the benefits accruing therefrom under 35 U.S.C. § 119, the content of which in their entirety is herein incorporated by reference.

BACKGROUND

1. Field

Embodiments of the invention described herein relate to a display device and a method for fabricating an electronic device by the same, and more particularly, to a display device having an improved reliability and simplified process, and a method for fabricating an electronic device by the same.

2. Description of the Related Art

Electronic devices, such as smartphones, tablets, notebook computers, and smart televisions ("TVs"), are being developed. The electronic devices include a display device for providing information. The electronic devices further include various electronic modules, in addition to the display device.

An electronic device is fabricated by assembling the display device and the electronic modules. Then, the electronic modules are organically disposed by an outer case and a bracket of the electronic device.

SUMMARY

Embodiments of the invention provide a display device that may supplement a strength of a bending area of a display module and prevent cracks of lines disposed in the bending area.

Embodiments of the invention also provide a display device that may protect a display module in a product assembling process, and a method for fabricating an electronic device by the display device.

A display device according to the invention includes a display module, a flexible circuit film, and a cover film. The display module is divided into a first area including pixels, a second area bent with respect to an imaginary axis extending in a first direction, and a third area, on which a driving chip connected to the pixels is disposed. The flexible circuit film is disposed at at least a portion of the third area of the display module and connected to the display module. The cover film covers the second area of the display module and at least a portion of the flexible circuit film. The cover film may cover an entirety of the driving chip.

In an embodiment, the cover film may include a first cover insulating layer, an intermediate layer disposed on the first cover insulating layer, and a second cover insulating layer disposed on the intermediate layer.

In an embodiment, the intermediate layer may include any one of a metal and a conductive fiber.

In an embodiment, each of the first cover insulating layer and the second cover insulating layer may include a polymeric material.

In an embodiment, the second cover insulating layer may have a black color.

In an embodiment, the cover film may include a first cover adhesive layer disposed under the first cover insulating layer, a second cover adhesive layer disposed between the first cover insulating layer and the intermediate layer, and a third cover adhesive layer disposed between the intermediate layer and the second cover insulating layer.

In an embodiment, the cover film may include a first cover layer including a metallic material and a first cover adhesive layer disposed under the first cover layer, and the first cover adhesive layer may include an insulating adhesive.

In an embodiment, the cover film may have a thickness equal to or greater than about 30 micrometers and equal to or less than about 120 micrometers.

In an embodiment, the display device may further include a window disposed on the display module and including a bezel pattern, and one end of the bezel pattern may define a border of a transmission area that transmits light provided from the display module and a bezel area that shields the light.

In an embodiment, the cover film may extend to the first area, and one end of the cover film may overlap the bezel area.

In an embodiment, the display device may further include an optical film disposed between the window and the display module.

In an embodiment, one end of the optical film and the one end of the cover film, which face each other in the first area, may be spaced apart from each other.

In an embodiment, the optical film may contact the cover film in the bezel area.

In an embodiment, the window may include a flat part, and a curved part bent from the flat part while having a predetermined curvature.

In an embodiment, a width of the cover film may be larger than a width of the second area of the display module in the first direction.

In an embodiment, a cutoff groove may be defined in the cover film by removing at least a portion of the cover film, and the cutoff groove may be spaced apart in the first direction from the second area of the display module and may not overlap the second area.

In an embodiment, the display device may further include a bending protection layer disposed between the display module and the cover film and overlapping the second area.

In an embodiment, a width of the cover film that overlaps the second area in the first direction may be smaller than or equal to a width of the second area in the first direction, in a plan view.

In an embodiment, a shape of the first area of the display module may be circular in a plan view, and a width of the second area of the display module in the first direction may be smaller than a diameter of the first area of the display module.

In an embodiment, an electronic device according to the invention may include a display module, and a cover film. The display module may be divided into a first area including pixels, a second area bent with respect to an imaginary axis extending in a first direction, and a third area, on which a driving chip connected to the pixels is disposed. The cover film may cover at least a portion of the third area, and the second area. The cover film may include a conductive material.

In an embodiment, the display device may further include a flexible circuit film disposed at at least the portion of the third area of the display module and connected to the display module, and the cover film may cover at least a portion of the flexible circuit film and an entirety of the driving chip.

In an embodiment, the cover film may include a first cover insulating layer, an intermediate layer disposed on the first cover insulating layer and including the conductive material, and a second cover insulating layer disposed on the intermediate layer.

In an embodiment, each of the first cover insulating layer and the second cover insulating layer may include a polymeric material, and the conductive material may include any one of a metal and a conductive fiber.

In an embodiment, the cover film may include a first cover adhesive layer disposed under the first cover insulating layer, a second cover adhesive layer disposed between the first cover insulating layer and the intermediate layer, and a third cover adhesive layer disposed between the intermediate layer and the second cover insulating layer, and the second cover adhesive layer may include a conductive adhesive.

In an embodiment, the display device may further include a window disposed on the display module, and including a flat part, and a curved part surrounding at least a portion of the flat part and bent while having a predetermined curvature.

In an embodiment, a width of the cover film may be larger than a width of the second area of the display module in the first direction.

In an embodiment, the display device may further include a bending protection layer disposed between the display module and the cover film and overlapping the second area, and the bending protection layer may be covered by the cover film.

In an embodiment, a width of the cover film that overlaps the second area in the first direction may be smaller than or equal to a width of the second area in the first direction, in a plan view.

A display device according to the invention includes a window, a display module, a flexible circuit film, and a cover film. The display module is disposed under the window, and including a bending area bent with respect to a bending axis. The flexible circuit film is coupled to the display module and disposed under the display module. The cover film covers a portion of the flexible circuit film and the bending area of the display module. A plurality of slits is defined in the cover film in correspondence to the bending area of the display module.

A display according to the invention includes a window, a display module, a flexible circuit film, and a cover film. The display panel is disposed under the window. A first end of the flexible circuit film is coupled to the display panel, and a second end is bent to be disposed under the display panel. The cover film is disposed on the flexible circuit film, and covers at least a bending portion of the flexible circuit film. A plurality of slits is defined in the cover film in correspondence to the bending portion of the flexible circuit film.

In an embodiment, a method for fabricating an electronic device according to the invention may include coupling a driving module to a display module including a bending area that is bent with respect to a bending axis, coupling the display module to a window to finish a display device, and coupling components of the electronic device to the display device.

The driving module may include a flexible circuit film coupled to the display module and disposed under the display module, a driving chip disposed on the display module, and a cover film covering a portion of the flexible circuit film, the driving chip, and the bending area of the display module. A plurality of slits may be defined in the cover film in correspondence to the bending area of the display module.

BRIEF DESCRIPTION OF THE DRAWINGS

The above and other objects and features of the invention will become apparent by describing in detail embodiments thereof with reference to the accompanying drawings.

DETAILED DESCRIPTION

Figure 1A:
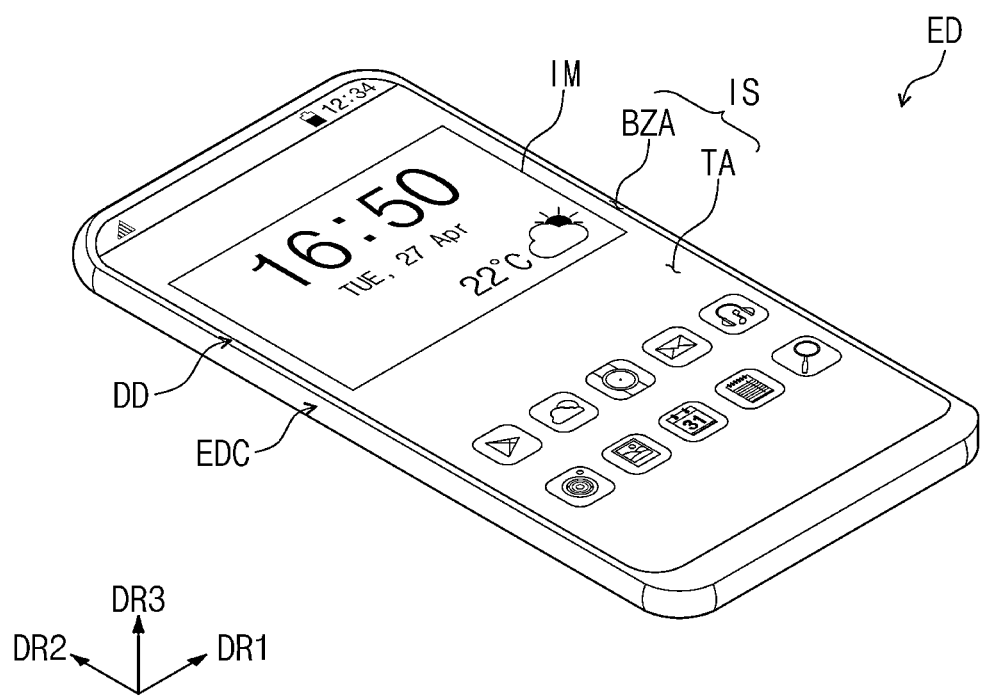
FIG. 1A is a perspective view of an embodiment of an electronic device according to the invention.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. Without departing from the scope of the invention, a first component may be referred to as a second component, and similarly, the second component may also be referred to as the first component, for example. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

The terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms used herein, including technical or scientific terms, have the same meanings as those generally understood by those skilled in the art to which the disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the application.

Hereinafter, embodiments of the invention will be described with reference to the accompanying drawings.

Figure 1B:
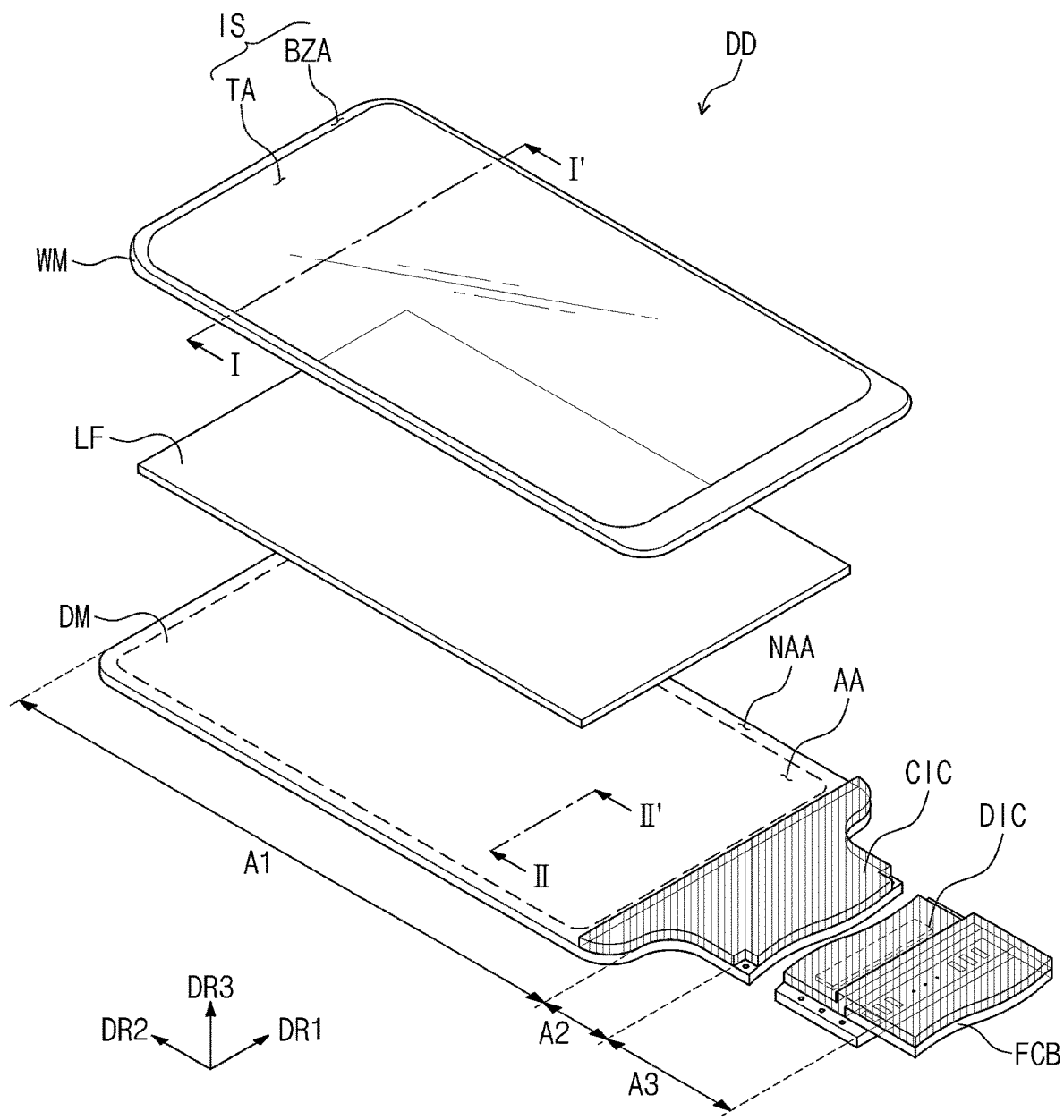
FIG. 1B is an exploded perspective view of an embodiment of a display device according to the invention.
Figure 1C:
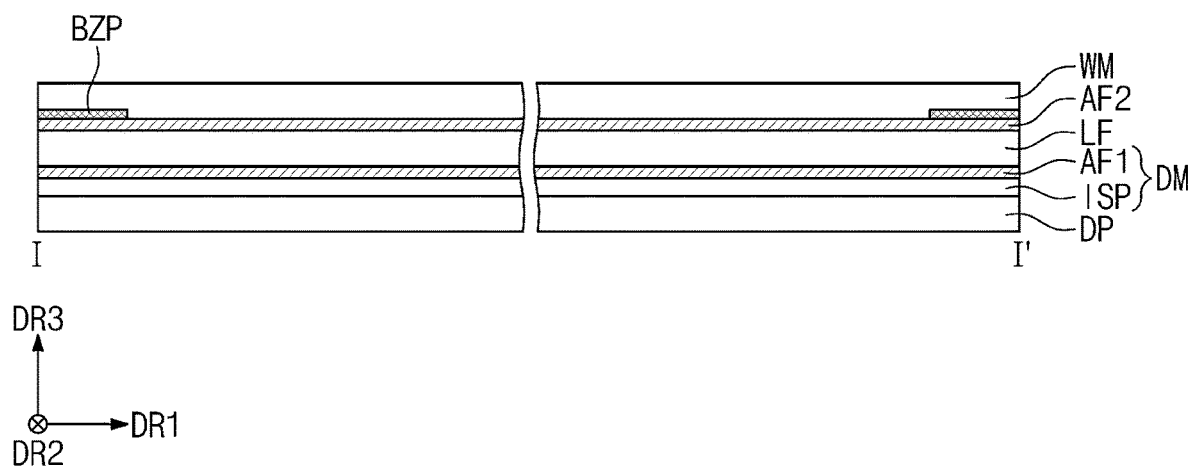
FIG. 1C is a cross-sectional view taken along cutting line I-I' illustrated in FIG. 1B.

FIG. 1A is a perspective view of an embodiment of an electronic device according to the invention. FIG. 1B is an exploded perspective view of an embodiment of a display device according to the invention. FIG. 1C is a cross-sectional view taken along cutting line I-I' illustrated in FIG. 1B.

Referring to FIGS. 1A to 1C, an electronic device ED may be a device that becomes active according to an electrical signal. The electronic device ED may include various embodiments. In embodiments, the electronic device ED may be an electronic device such as a smart watch, a tablet, a notebook, a computer, or a smart TV, for example.

The electronic device ED may display an image IM on a display surface IS that is parallel to a first direction DR1 and a second direction DR2, toward a third direction DR3. The display surface IS, in which the image IM is displayed, may correspond to a front surface of the electronic device ED. The image IM may include a still image as well as a moving image.

In the illustrated embodiment, front surfaces (or upper surfaces) and rear surfaces (or lower surfaces) of members are defined with respect to the third direction DR3, in which the image IM is displayed. The front surfaces and the rear surface are opposing to each other in the third direction DR3, and normal directions of the front surfaces and the rear surfaces may be parallel to the third direction DR3.

A spacing distance between the front surface and the rear surface in the third direction DR3 may correspond to a thickness of the electronic device ED in the third direction DR3. Directions indicated by the first to third directions DR1, DR2, and DR3 may be relative concepts and may be converted to other directions.

The electronic device ED may sense an external input applied from an outside. The external input may include various forms of inputs provided from the outside of the electronic device ED. In an embodiment, the external input may include an external input (e.g., hovering) that is applied when a portion of a human body, such as a hand of a user, approaches the electronic device ED or becomes closer to the electronic device ED by a predetermined distance, as well as a contact of the portion of the human body, for example. Furthermore, the external input may be various forms such as a force, a pressure, a temperature, and light.

The front surface of the electronic device ED may be classified into a transmission area TA and a bezel area BZA. The transmission area TA may be an area, in which the image IM is displayed. The user visually recognizes the image IM through the transmission area TA. In the illustrated embodiment, it is illustrated that the transmission area TA has a quadrangular (e.g., rectangular) shape having round apexes. However, this is merely one of embodiments, and the transmission area TA may have various shapes in other embodiments.

The bezel area BZA is adjacent to the transmission area TA. The bezel area BZA may have a predetermined color. The bezel area BZA may surround the transmission area TA. Accordingly, a shape of the transmission area TA may be defined substantially by the bezel area BZA. In other embodiments, the bezel area BZA may be disposed adjacent only to one side of the transmission area TA and may be omitted. The electronic device ED of the invention may include various embodiments in other embodiments.

The electronic device ED may include a display device DD and an external case EDC. The display device DD may include a window WM, an optical film LF, and a display module DM.

The window WM may include a transparent material that may output an image. In an embodiment, the window WM may include glass, sapphire, or plastic. Although it is illustrated that the window WM has a single layer, for example, the invention is not limited thereto and the window WM may include a plurality of layers. The above-described bezel area BZA of the display device DD may be an area, in which a material including a predetermined color is substantially printed in an area of the window WM. In an embodiment of the invention, the window WM may include a bezel pattern BZP for defining the bezel area BZA. The bezel pattern BZP is a colored organic film, and for example, may be formed or provided through coating.

The display module DM may include a display panel DP and an input sensing layer ISP. The display panel DP in an embodiment of the invention may be a light emission type display panel, and is not particularly limited thereto. In an embodiment, the display panel DP may be an organic light-emitting display panel, an inorganic light-emitting display panel, or a quantum-dot light-emitting display panel, for example. A light-emitting layer of the organic light-emitting display panel may include an organic light-emitting material, and a light-emitting layer of the inorganic light-emitting display panel may include an inorganic light-emitting material. A light-emitting layer of the quantum-dot light-emitting display panel may include quantum dots and quantum rods. Hereinafter, the display panel DP will be described with the organic light-emitting display panel.

The input sensing layer ISP may be directly disposed on the display panel DP. In an embodiment of the invention, the input sensing layer ISP may be formed or disposed on the display panel DP through continuous processes. That is, when the input sensing layer ISP is directly disposed on the display panel DP, an adhesive film is not disposed between the input sensing layer ISP and the display panel DP.

The display panel DP generates the image IM, and the input sensing layer ISP acquires coordinate information of the external input (e.g., a touch event). The optical film LF may be disposed under the window WM. The optical film LF decreases a reflectivity of external light input from an upper side of the window WM. The optical film LF in an embodiment of the invention may include a retarder and a polarizer. In an embodiment, the retarder may be of a film type or a liquid crystal type, and may include a λ/2 retarder and/or a λ/4 retarder. The polarizer also may be of a film type or a liquid crystal coating type. The film type may include an elongation type synthetic resin film, and the liquid crystal coating type may include liquid crystals disposed in a predetermined arrangement. The retarder and the polarizer may be implemented by one polarization film. The optical film LF may further include a protection film disposed on or under the polarization film.

The optical film LF may be disposed on the display module DM. In detail, the optical film LF may be disposed between the input sensing layer ISP and the window WM. The display module DM, the optical film LF, and the window WM may be coupled to each other through the adhesive film. A first adhesive film AF1 is disposed between the display module DM and the optical film LF, and a second adhesive film AF2 is disposed between the optical film LF and the window WM. Accordingly, the optical film LF is coupled to the display module DM by the first adhesive film AF1, and the window WM is coupled to the optical film LF by the second adhesive film AF2.

In an embodiment of the invention, each of the first and second adhesive films AF1 and AF2 may include an optically clear adhesive ("OCA") film. However, materials of the first and second adhesive films AF1 and AF2 are not limited thereto, and may include a general adhesive or a gluing agent. In an embodiment, each of the first and second adhesive films AF1 and AF2 may include a pressure sensitive adhesive ("PSA"), an OCA, or an optically clear resin ("OCR"), for example.

In addition to the optical film LF, a functional layer for another function, e.g., a protection layer, may be further disposed between the display module DM and the window WM.

The display module DM may be defined by an active area AA and a non-active area NAA. The active area AA may be defined as an area that outputs an image. The non-active area NAA is adjacent to the active area AA. In an embodiment, the non-active area NAA may surround the active area AA. However, this is merely one of embodiments, and the non-active area NAA may have various shapes in other embodiments. In an embodiment, the active area AA of the display module DM may correspond to at least a portion of the transmission area TA.

According to the invention, the display module DM may include a first area A1, a second area A2, and a third area A3 that are arranged in the second direction DR2. The first area A1 may be an area corresponding to the display surface IS. The first area A1 may include the active area AA. The second area A2 and the third area A3 may include the non-active area NAA. The second area A2 may be a bending area that is bent with respect to the bending axis, and the first and third areas A1 and A3 may be non-bending areas.

The display device DD may further include a flexible circuit film FCB, a driving chip DIC, and a cover film CIC. The flexible circuit film FCB may be electrically connected to the display panel DP. The flexible circuit film FCB may be coupled to an end of the third area A3 of the display module DM through a bonding process. The flexible circuit film FCB may be electrically connected to the display module DM through an anisotropic conductive adhesive layer. The driving chip DIC may be disposed (e.g., mounted) on the third area A3 of the display module DM. The driving chip DIC may include driving circuits for driving pixels of the display panel DP, e.g., a data driving circuit.

The cover film CIC may cover the flexible circuit film FCB. Furthermore, the cover film CIC be disposed on the display module DM, and may cover the third area A3 and the second area A2. Then, the cover film CIC may cover an entirety of the driving chip DIC disposed (e.g., mounted) on the third area A3. In an embodiment, as illustrated in FIG.

1B, the cover film CIC may continuously extend from the flexible circuit film FCB to the second area A2 of the display module DM.

According to the invention, the second area A2 of the display module DM may be bent such that the third area A3 faces a rear surface of the display module DM. Then, the driving chip DIC and the flexible circuit film FCB may be disposed under the first area A1. The cover film CIC may be bent together when the second area A2 of the display module DM is bent.

The external case EDC accommodates the display device DD. The external case EDC may be coupled to the window WM to define an external appearance the electronic device ED. The external case EDC protects the components accommodated in the external case EDC by absorbing an impact applied from an outside and preventing foreign substances/moisture that penetrates into the electronic device ED. In an embodiment of the invention, the external case EDC may be provided in a form, in which a plurality of reception members is coupled to each other.

Before the display device DD is received in the external case EDC, the cover film CIC is not removed from the display module DM and the flexible circuit film FCB. Accordingly, the window WM, the optical film LF, and the display module DM may be accommodated in the external case EDC. The cover film CIC may cover the second area A2 of the display module DM even after the display device DD is received in the external case EDC.

Figure 2:
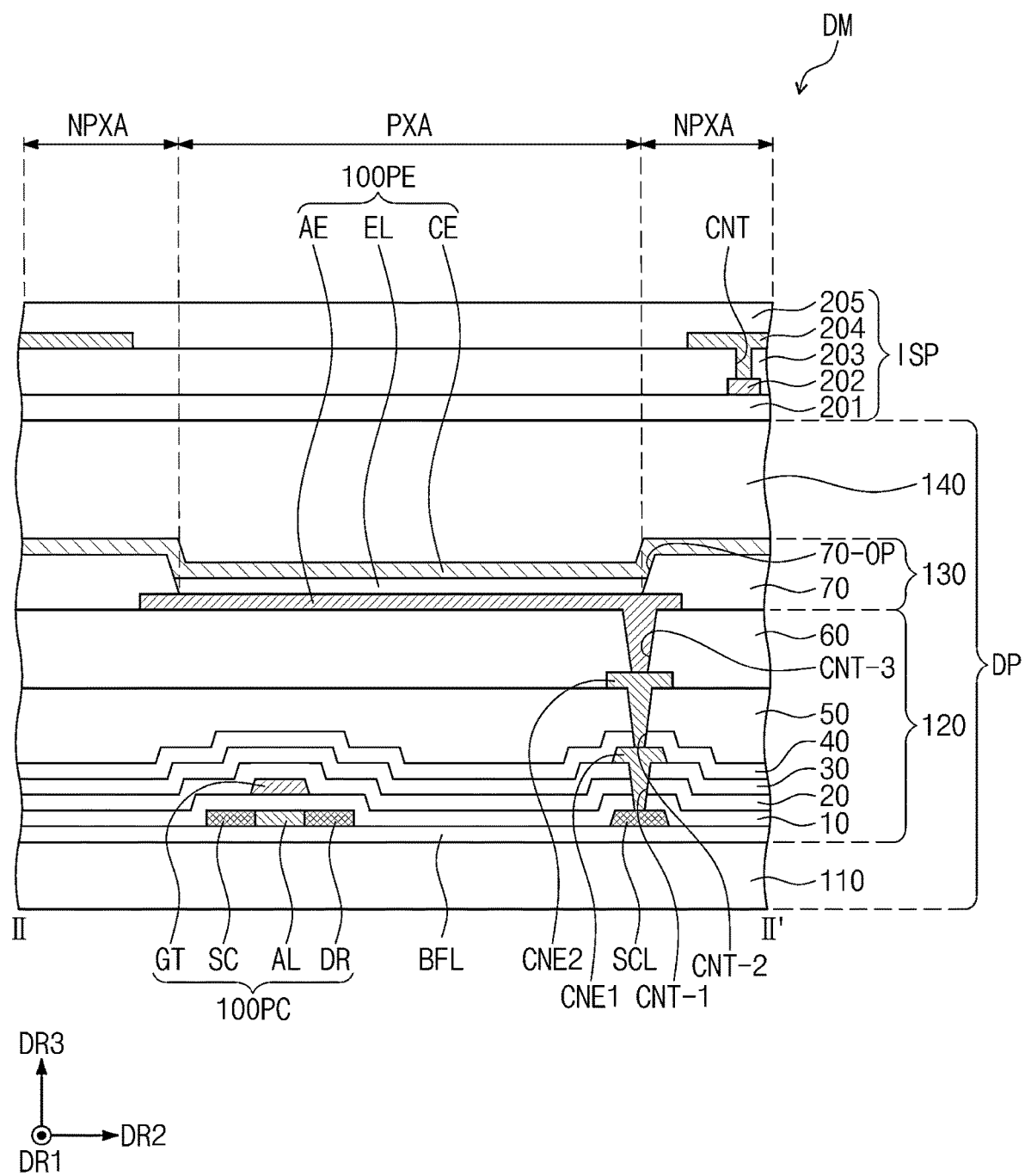
FIG. 2 is a cross-sectional view of a display module, taken along cutting line II-II' illustrated in FIG. 1B.

FIG. 2 is a cross-sectional view of a display module, taken along cutting line II-II' illustrated in FIG. 1B.

Referring to FIG. 2, the display panel DP may include a base layer 110, a circuit element layer 120, a light-emitting element layer 130, and an encapsulation layer 140. The base layer 110 may be a member that provides a base surface, on which the circuit element layer 120 is disposed. In an embodiment, the base layer 110 may be a glass substrate, a metal substrate, or a polymer substrate. However, the invention is not limited thereto, and the base layer 110 may be an inorganic layer, an organic layer, or a composite material layer.

The base layer 110 may have a multilayered structure. In an embodiment, the base layer 110 may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer, for example. The silicon oxide layer and the amorphous silicon layer may be also referred to as base barrier layers.

Each of the first and second synthetic resin layers may include a polyimide-based layer. Furthermore, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perilene-based resin. In the specification, an "element"-based resin may mean a functional group of the "element".

The circuit element layer 120 may be disposed on the base layer 110. The circuit element layer 120 may include an insulation layer, a semiconductor pattern, a conductive pattern, and a signal line. The insulation layer, the semiconductor layer, and the conductive layer may be formed or disposed on the base layer 110 through a scheme, such as coating or deposition, and thereafter, the insulation layer, the semiconductor layer, and the conductive layer may be selectively patterned through a plurality of photolithography processes. Thereafter, the semiconductor pattern, the conductive pattern, and the signal line included in the circuit element layer 120 may be formed or provided.

At least one inorganic layer is formed or disposed on an upper surface of the base layer 110. In an embodiment, the inorganic layer may include at least one of an aluminum oxide, a titanium oxide, a silicon oxide, a silicon nitride, a silicon oxynitride, a zirconium oxide, and a hafnium oxide. The inorganic layer may have multiple layers. The multilayered inorganic layers may include a barrier layer and/or a buffer layer. In the illustrated embodiment, it is illustrated that the display panel DP includes a buffer layer BFL.

The buffer layer BFL may enhance a coupling force between the base layer 110 and the semiconductor pattern. In an embodiment, the buffer layer BFL may include at least one of a silicon oxide, a silicon nitride, and a silicon oxynitride. In an embodiment, the buffer layer BFL may include a structure, in which the silicon oxide layers and the silicon nitride layers are alternately stacked on each other, for example.

The semiconductor pattern may be disposed on the buffer layer BFL. The semiconductor pattern may include polysilicon. However, the invention is not limited thereto, and the semiconductor pattern may include amorphous silicon, low-temperature poly-crystal silicon, or an oxide semiconductor.

FIG. 2 simply illustrates s some semiconductor patterns, and semiconductor patterns may be further disposed in another area. The semiconductor patterns may be arranged in a predetermined rule over the pixels. Electrical properties of the semiconductor patterns may be different according to whether the semiconductor patterns are doped. The semiconductor pattern may include a high-conductivity area having a high conductivity and a low-conductivity area having a low conductivity. The high-conductivity area may be doped with an N-type dopant or a P-type dopant. A P-type transistor may include a doping area doped with a P-type dopant, and an N-type transistor may include a doping area doped with an N-type dopant. The low-conductivity area may be a non-doping area, and may be an area doped with a low concentration as compared with the high-conductivity area.

The conductivity of the high-conductivity area is higher than the conductivity of the low-conductivity area, and may substantially function as an electrode or a signal line. The low-conductivity area may correspond to a channel area of the transistor. In other words, a portion of the semiconductor pattern may be a channel area of the transistor, another portion thereof may be a source area or a drain area of the transistor, and another portion thereof may be a connection electrode or a connection signal line.

Each of the pixels may include an equivalent circuit including a plurality of transistors, at least one capacitor, and a light-emitting element, and the equivalent circuit of the pixel may be modified into various forms. FIG. 2 illustrates one transistor 100PC and a light-emitting element 100PE included in each of the pixels.

A source area SC, a channel area AL, and a drain area DR of the transistor 100PC may include the semiconductor patterns. The source area SC and the drain area DR may be disposed in opposite directions from the channel area AL in a cross-section. FIG. 2 illustrates a portion of a connection signal line SCL including the semiconductor patterns. Although not illustrated separately, the connection signal line SCL may be connected to the drain DR of the transistor 100PC in a plan view.

A first insulation layer 10 may be disposed on the buffer layer BFL. The first insulation layer 10 may commonly overlap the plurality of pixels, and may cover the semiconductor patterns. The first insulation layer 10 may be an inorganic layer and/or an organic layer, and may have a monolayered or multilayered structure. In an embodiment, the first insulation layer 10 may include at least one of an aluminum oxide, a titanium oxide, a silicon oxide, a silicon nitride, a silicon oxynitride, a zirconium oxide, and a hafnium oxide. In the illustrated embodiment, the first insulation layer 10 may be a monolayered silicon oxide layer. The insulation layers of the circuit element layer 120, which will be described below, as well as the first insulation layer 10 may be an inorganic layer and/or an organic layer, and may have a monolayered or multilayered structure. The inorganic layer may include at least one of the above-described materials, but the invention is not limited thereto.

A gate GT of the transistor 100PC is disposed on the first insulation layer 10. The gate GT may be a portion of a metal pattern. The gate GT overlaps the channel area AL. In a process of doping the semiconductor pattern, the gate GT may function as a mask.

A second insulation layer 20 may be disposed on the first insulation layer 10, and may cover the gate GT. The second insulation layer 20 may commonly overlap the pixels. The second insulation layer 20 may be an inorganic layer and/or an organic layer, and may have a monolayered or multilayered structure. In an embodiment, the second insulation layer 20 may include at least one of a silicon oxide, a silicon nitride, and a silicon oxynitride. In the illustrated embodiment, the second insulation layer 20 may have a multilayered structure including a silicon oxide layer and a silicon nitride layer.

A third insulation layer 30 may be disposed on the second insulation layer 20. The third insulation layer 30 may have a monolayered or multilayered structure. In an embodiment, the third insulation layer 30 may have a multilayered structure including a silicon oxide layer and a silicon nitride layer, for example.

A first connection electrode CNE1 may be disposed on the third insulation layer 30. The first connection electrode CNE1 may be connected to the connection signal line SCL through a contact hole CNT-1 that passes through the first, second, and third insulation layers 10, 20, and 30.

A fourth insulation layer 40 may be disposed on the third insulation layer 30. The fourth insulation layer 40 may be a monolayered silicon oxide layer. A fifth insulation layer 50 may be disposed on the fourth insulation layer 40. The fifth insulation layer 50 may be an organic layer.

A second connection electrode CNE2 may be disposed on the fifth insulation layer 50. The second connection electrode CNE2 may be connected to the first connection electrode CNE1 through a contact hole CNT-2 that passes through the fourth insulation layer 40 and the fifth insulation layer 50.

A sixth insulation layer 60 may be disposed on the fifth insulation layer 50, and may cover the second connection electrode CNE2. The sixth insulation layer 60 may be an organic layer.

The light-emitting element layer 130 may be disposed on the circuit element layer 120. The light-emitting element layer 130 may include light-emitting elements. In an embodiment, the light-emitting element layer 130 may include an organic light-emitting material, a quantum dot, a quantum rod, a micro-light-emitting diode ("LED"), or a nano-LED, for example. Hereinafter, it will be described that the light-emitting element 100PE in an embodiment is an organic light-emitting element, but the invention is not particularly limited thereto.

The light-emitting element 100PE may include a first electrode AE, a light-emitting layer EL, and a second electrode CE. The first electrode AE may be disposed on the sixth insulation layer 60. The first electrode AE may be connected to the second connection electrode CNE2 through a contact hole CNT-3 that passes through the sixth insulation layer 60.

A pixel definition film 70 may be disposed on the sixth insulation layer 60, and may cover a portion of the first electrode AE. An opening 70-OP is defined in the pixel definition film 70. The opening 70-OP of the pixel definition film 70 exposes at least a portion of the first electrode AE.

The active area AA (refer to FIG. 1B) may include a light-emitting area PXA and a non-light-emitting area NPXA that is adjacent to the light-emitting area PXA. The non-light-emitting area NPXA may surround the light-emitting area PXA. In the illustrated embodiment, the light-emitting area PXA is defined to correspond to a partial area of the first electrode AE exposed through the opening 70-OP.

The light-emitting layer EL may be disposed on the first electrode AE. The light-emitting layer EL may be disposed in an area corresponding to the opening 70-OP. That is, the light-emitting layers EL may be formed or provided in the pixels separately. When the light-emitting layers EL are formed or provided in the pixels separately, each of the light-emitting layers EL may emit light of at least one of a blue color, a red color, and a green color. However, the invention is not limited thereto, and the light-emitting layers EL may be connected to the pixels to be commonly provided. In this case, the light-emitting layers EL may provide light of a blue color or may provide light of a white color.

The second electrode CE may be disposed on the light-emitting layer EL. The second electrode CE may have an integral shape, and may be commonly disposed in the plurality of pixels.

Although not illustrated, a hole control layer may be disposed between the first electrode AE and the light-emitting layer EL. The hole control layer may be commonly disposed in the light-emitting area PXA and the non-light-emitting area NPXA. The hole control layer may include a hole transport layer, and may further include a hole injection layer. An electron control layer may be disposed between the light-emitting layer EL and the second electrode CE. The electron control layer may include an electron transport layer, and may further include an electron injection layer. The hole control layer and the electron control layer may be commonly formed or provided in the plurality of pixels by an open mask.

The encapsulation layer 140 may be disposed on the light-emitting element layer 130. The encapsulation layer 140 may include an inorganic layer, an organic layer, an inorganic layer, which are stacked sequentially, and the layers that constitute the encapsulation layer 140 are not limited thereto.

The inorganic layers may protect the light-emitting element layer 130 from moisture and oxygen, and the organic layer may protect the light-emitting element layer 130 from foreign substances such as dust particles. In an embodiment, the inorganic layers may include a silicon nitride layer, a silicon oxynitride layer, a silicon oxide layer, a titanium oxide layer, or an aluminum oxide layer. In an embodiment, the organic layer may include an acryl-based organic layer, but the invention is not limited thereto.

The input sensing layer ISP may be formed or disposed on the display panel DP through continuous processes. In this case, it may be expressed that the input sensing layer ISP is 'directly disposed' on the display panel DP. The expression 'directly disposed' may mean that a third component is not disposed between the input sensing layer ISP and the display panel DP. That is, a separate adhesive member may not be disposed between the input sensing layer ISP and the display panel DP. Furthermore, the input sensing layer ISP may be provided as a separate module, and may be coupled to the display panel DP through the adhesive member. The adhesive member may include a general adhesive or gluing agent.

The input sensing layer ISP may include a first sensing insulation layer 201, a first conductive layer 202, a second sensing insulation layer 203, a second conductive layer 204, and a cover insulating layer 205.

In an embodiment, the first sensing insulation layer 201 may be an inorganic layer including at least any one of a silicon nitride, a silicon oxynitride, and a silicon oxide. Furthermore, the first sensing insulation layer 201 may be an organic layer including an epoxy resin, an acryl resin, or an imide-based resin. The first sensing insulation layer 201 may have a monolayered structure, or may have a multilayered structure stacked along the third direction DR3.

Each of the first conductive layer 202 and the second conductive layer 204 may have a monolayered structure, or may have a multilayered structure stacked along the third direction DR3. In the illustrated embodiment, a metal layer of a monolayered structure may include molybdenum, silver, titanium, copper, aluminum, or an alloy thereof. The conductive layer of a multilayered structure may include metal layers. In an embodiment, the metal layers may have a three-layered structure of titanium, aluminum, and titanium, for example. The conductive layer of the multilayered structure may include at least one metal layer and at least one transparent conductive layer.

When the first conductive layer 202 and the second conductive layer 204 include a metal layer, the first conductive layer 202 and the second conductive layer 204 may be opaque. Accordingly, the first conductive layer 202 and the second conductive layer 204 may not overlap the light-emitting area PXA, and may be patterned to overlap the non-light-emitting area NPXA.

At least any one of the second sensing insulation layer 203 and the cover insulating layer 205 may include an inorganic film. In an embodiment, the inorganic film may include at least one of an aluminum oxide, a titanium oxide, a silicon oxide, a silicon nitride, a silicon oxynitride, a zirconium oxide, and a hafnium oxide.

At least any one of the second sensing insulation layer 203 and the cover insulating layer 205 may include an organic film. In an embodiment, the organic film may include at least any one of an acryl-based resin, a metacryl-based resin, a polyisoprene-based resin, a vinyl-based resin, an epoxy-based resin, a urethane-based resin, a cellulose-based resin, a siloxane-based resin, a polyimide-based resin, a polyimide-based resin, and a perylene-based resin.

Portions of the first conductive layer 202 and the second conductive layer 204 may be connected to each other through a contact hole CNT defined in the second sensing insulation layer 203.

Figure 3A:
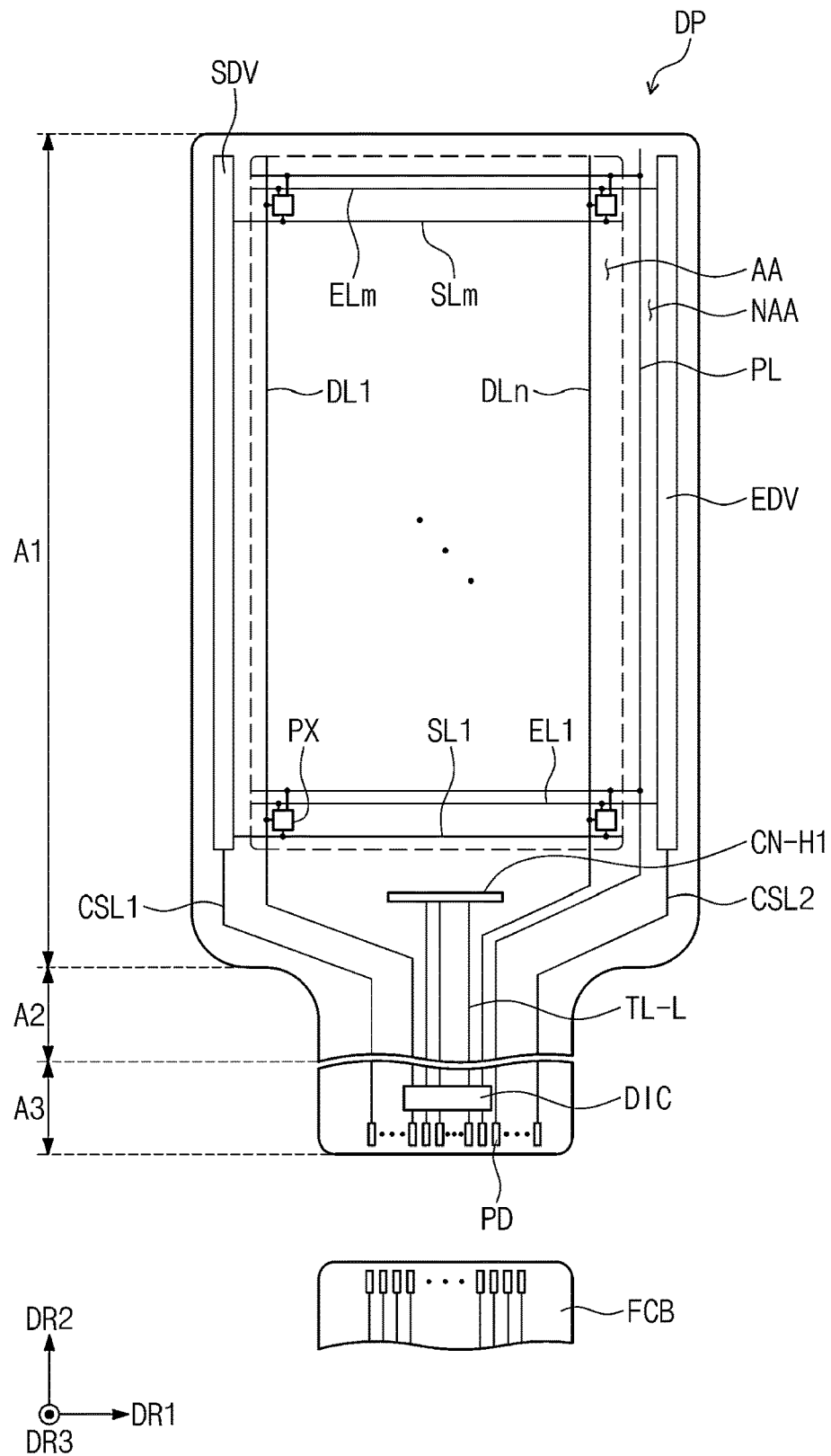
FIG. 3A is a plan view of an embodiment of a display panel according to the invention.
Figure 3B:
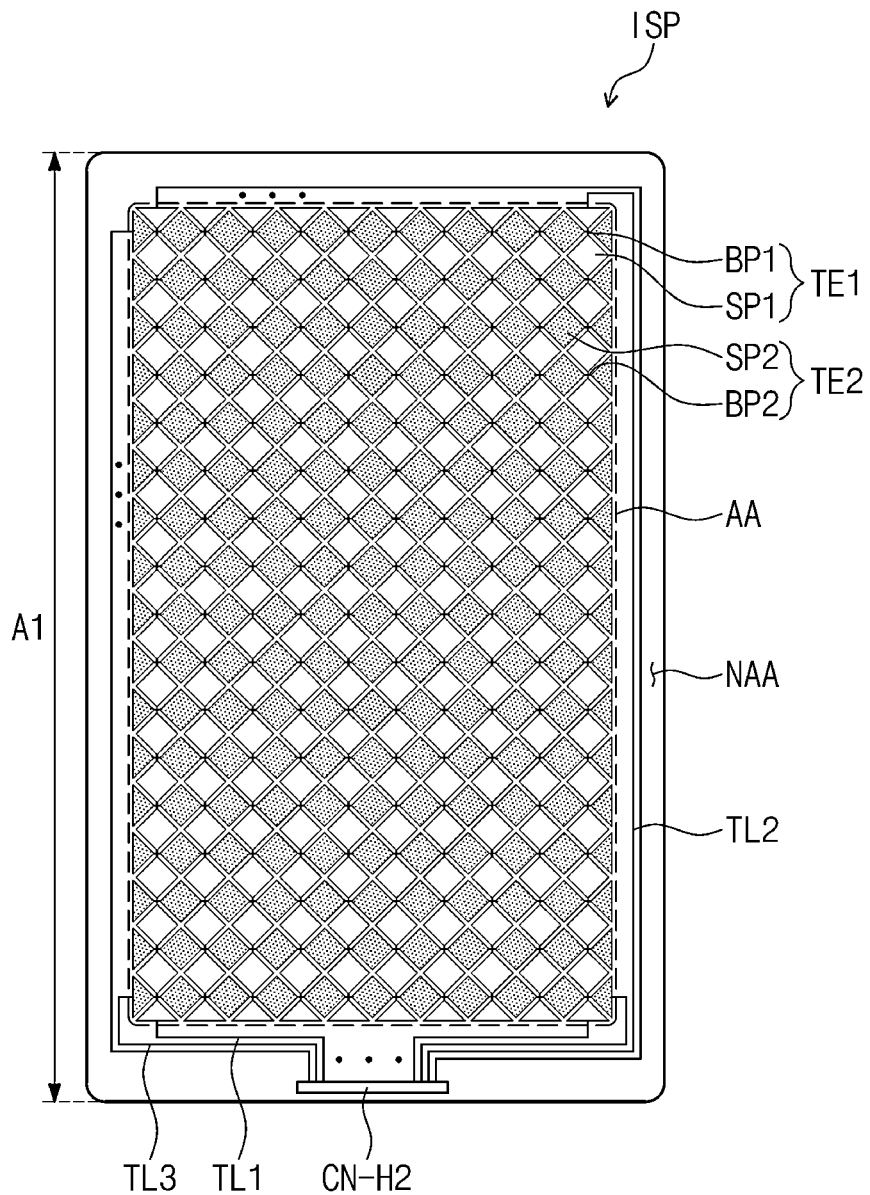
FIG. 3B is a plan view of an embodiment of an input sensing layer according to the invention.

FIG. 3A is a plan view of an embodiment of a display panel according to the invention. FIG. 3B is a plan view of an embodiment of an input sensing layer according to the invention.

Referring to FIG. 3A, the display panel DP in an embodiment of the invention may be divided into a first area A1, a second area A2, and a third area A3. The first to third areas A1, A2, and A3 of the display panel DP illustrated in FIG. 3A correspond to the first to third areas A1, A2, and A3 of the display module DM illustrated in FIG. 1B. In the specification, the expression "an area/part corresponds to another area/part" means that they overlap each other, and is not limited to a meaning that they have the same extent.

The display panel DP in an embodiment may include an active area AA, in which pixels are disposed, and a non-active area NAA that is adjacent to the active area AA. The active area AA and the non-active area NAa correspond to the active area AA and the non-active area NAA described in FIG. 1B. The active area AA corresponds to an area, in which the pixels PX are disposed in the first area A1, and the non-active area NAA includes the first area A1, except for the area, in which the pixels PX are disposed, and the second area A2 and the third area A3.

The display panel DP may include a scan driver SDV, an emission driver EDV, and a driving chip DIC, in the non-active area NAA. The driving chip DIC may be a data driver.

The display panel DP may include a plurality of pixels PX, a plurality of scan lines SL1 to SLm, a plurality of data lines DL1 to DLn, a plurality of light-emitting lines EL1 to ELm, first and second control lines CSL1 and CSL2, a power line PL, and a plurality of pads PD. Here, "m" and "n" are natural numbers. The pixels may be connected to the scan lines SL1 to SLm, the data lines DL1 to DLn, and the light-emitting lines EL1 to ELm.

The scan lines SL1 to SLm may extend in the first direction DR1 and may be connected to the scan driver SDV. The data lines DL1 to DLn may extend in the second direction DR2, and may be connected to the driving chip DIC disposed in the third area A3 from the first area A1 via the second area A2. The light-emitting lines EL1 to ELm may extend in the first direction DR1 and may be connected to the emission driver EDV.

The power line PL may include a part that extends in the first direction DR1 and a part that extends in the second direction DR2. The part that extends in the first direction DR1 and the part that extends in the second direction DR2 may be disposed on different layers. The part of the power line PL, which extends in the second direction DR2, may extend from the first area A1 to the third area A3 via the second area A2. The power line PL may provide a reference voltage to the pixels PX.

The first control line CSL1 may be connected to the scan driver SDV, and may extend from the first area A1 to the third area A3 via the second area A2. The second control line CSL2 may be connected to the emission driver EDV, and may extend from the first area A1 to the third area A3 via the second area A2.

The pads PD may be disposed adjacent to an end of the third area A3. The driving chip DIC, the power line PL, the first control line CSL1, and the second control line CSL2 may be connected to the pads PD. The flexible circuit film FCB may overlap an end of the third area A3 of the display panel DP and may be disposed on the display panel DP. The flexible circuit film FCB may include pads corresponding to the pads PD, and may be electrically connected to the pads PD through an anisotropic conductive adhesive layer.

A first contact hole CN-H1 may be defined in the display panel DP in the first area A1. The display panel DP may include extension sensing lines TL-L that extends from the first contact hole CN-H1 to the third area A3 via the first area A1 and the second area A2. The extension sensing lines TL-L may be connected to the corresponding sensing lines of sensing lines TL1, TL2, and TL3 (refer to FIG. 3B), which will be described below, in one-to-one correspondence.

FIG. 3A illustrates that the extension sensing lines TL-L are disposed between the data lines DL1 to DLn, but the invention is not limited thereto, and the data lines DL1 to DLn may be disposed between the extension sensing lines TL-L, and accordingly, a plurality of first contact holes CN-H1 may be provided between the data lines DL1 to DLn, but is not limited thereto.

Referring to FIG. 3B, the input sensing layer ISP in an embodiment may include first and second sensing electrodes TE1 and TE2, and the sensing lines TL1, TL2, and TL3. When the input sensing layer ISP is directly disposed on the display panel DP through continuous processes, the input sensing layer ISP may be formed or disposed only on an area that overlaps the first area A1 of the display panel DP.

The input sensing layer ISP may obtain information on an external input through a change in a capacitance between the first sensing electrodes TEL and the second sensing electrodes TE2. The first sensing electrodes TE1 are arranged along the first direction DR1 and extend along the second direction DR2. Each of the first sensing electrodes TE1 may include a first sensing pattern SP1 and a first connection pattern BP1.

The first sensing pattern SP1 is disposed in the active area AA. The first sensing pattern SP1 may have a rhombus shape. However, this is merely one of embodiments, and the first sensing pattern SP1 may have various shapes in other embodiments.

The first connection pattern BP1 is disposed in the active area AA. The first connection pattern BP1 may be disposed between adjacent first sensing patterns SP1. The first connection pattern BP1 may be disposed in a layer that is different from the layer, in which the first sensing pattern SP1 is disposed, to be connected thereto through a contact hole.

The second sensing electrodes TE2 are arranged along the second direction DR2 and extend along the first direction DR1. Each of the second sensing electrodes TE2 may include a second sensing pattern SP2 and a second connection pattern BP2.

The second sensing pattern SP2 may be spaced apart from the first sensing pattern SP1. The first sensing pattern SP1 and the second sensing pattern SP2 do not contact each other to transmit and receive independent electrical signals.

The second sensing pattern SP2 may have the same shape as that of the first sensing pattern SP1. In an embodiment, the second sensing pattern SP2 may have a rhombus shape, for example. However, this is merely one of embodiments, and the second sensing pattern SP2 may have various shapes in other embodiments.

The second connection pattern BP2 may be disposed between adjacent second sensing patterns SP2. For convenience of description, each of the second sensing electrodes TE2 is distinguished from the second sensing pattern SP2 and the second connection pattern BP2, but each of the second sensing electrodes TE2 may be provided by substantially one pattern.

In an embodiment, the first connection pattern BP1 may correspond to the first conductive layer 202 described in FIG. 2. The first sensing pattern SP1, the second sensing pattern SP2, and the second connection pattern BP2 may correspond to the second conductive layer 204 described in FIG. 2. That is, the second sensing electrodes TE2 may be disposed in the same layer as the first sensing pattern SP1, and then, the first sensing pattern SP1 and the second sensing electrodes TE2 may be provided by a plurality of mesh lines that extend in a diagonal direction between the first direction DR1 and the second direction DR2.

The sensing lines TL1, TL2, and TL3 are disposed in the non-active area NAA. The sensing lines TL1, TL2, and TL3 may include first sensing lines TL1, second sensing lines TL2, and third sensing lines TL3.

The first sensing lines TL1 are connected to the first sensing electrodes TE1, respectively. In the illustrated embodiment, the first sensing lines TL1 are connected to lower ends of the first sensing electrodes TE1, respectively. The second sensing lines TL2 are connected to upper ends of the first sensing electrodes TE1, respectively. According to the invention, the first sensing electrodes TE1 may be connected to the first sensing lines TL1 and the second sensing lines TL2, respectively. Accordingly, sensitivities of areas of the first sensing electrodes TE1 having a length that is larger than that of the second sensing electrodes TE2 may be uniformly maintained.

In another embodiment, the second sensing lines TL2 may be omitted from the input sensing layer ISP.

The third sensing lines TL3 are connected to ends of the second sensing electrodes TE2, respectively. In the illustrated embodiment, the third sensing lines TL3 are connected to left ends of the second sensing electrodes TE2, respectively.

A second contact hole CN-H2 that overlaps the non-active area NAA may be defined in the input sensing layer ISP. The second contact hole CN-H2 may overlap the first contact hole CN-H1 of the display panel DP. The sensing lines TL1, TL2, and TL3 may be connected to the corresponding extension sensing lines TL-L through the second contact hole CN-H2 defined in the input sensing layer ISP and the first contact hole CN-H1 defined in the display panel DP. Accordingly, the first and second sensing electrodes TE1 and TE2 may be electrically connected to the flexible circuit film FCB.

Figure 4A:
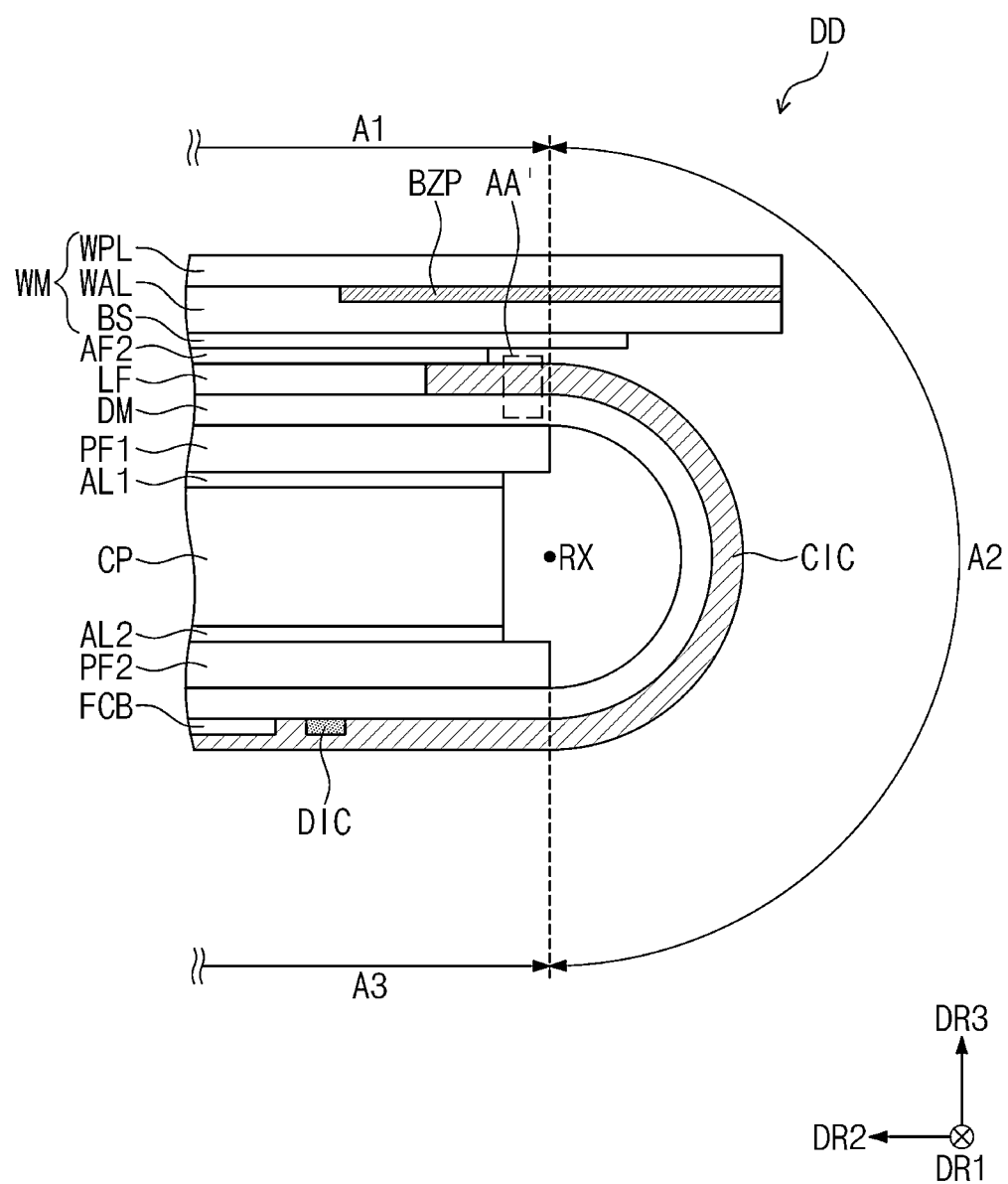
FIG. 4A is an enlarged cross-sectional view of an embodiment of a display device according to the invention.
Figure 4B:
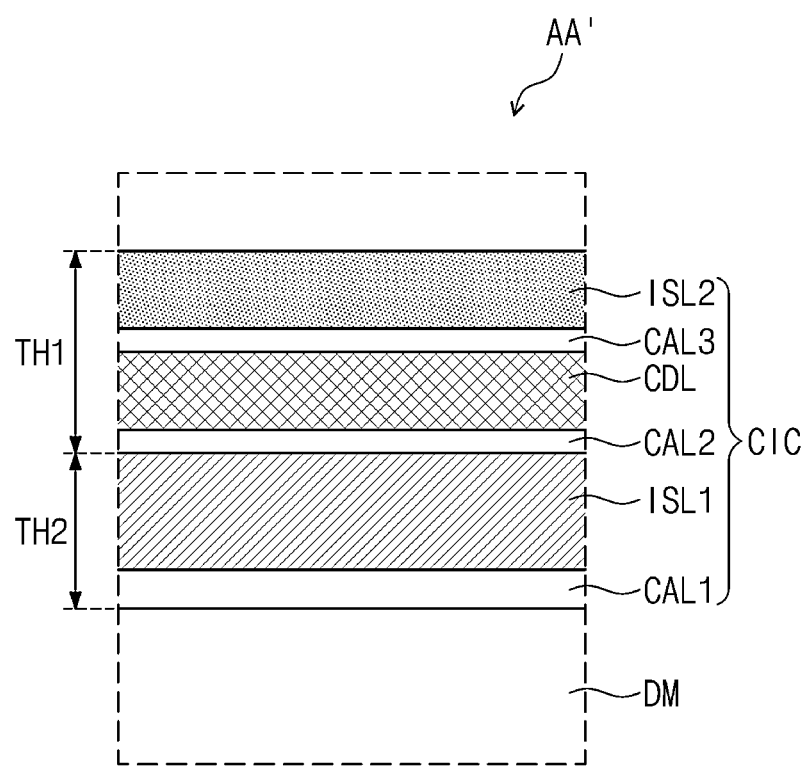
FIG. 4B is an enlarged cross-sectional view of area AA' of FIG. 4A.

FIG. 4A is an enlarged cross-sectional view of an embodiment of a display device according to the invention. FIG. 4B is an enlarged cross-sectional view of area AA' of FIG. 4A. FIG. 4A illustrates a cross-sectional view of the electronic device ED, in which the second area A2 is bent with respect to an imaginary axis RX (e.g., the bending axis) that extends in the first direction DR1.

In an embodiment, the display device DD may include the window WM, the optical film LF, the cover film CIC, the display module DM, lower protection films PF1 and PF2, and a cover panel CP.

In an embodiment, the window WM may include a base substrate BS, a window protection layer WPL disposed on the base substrate BS, and the bezel pattern BZP disposed on a lower surface of the window protection layer WPL. The window WM may further include a window adhesive layer WAL that couples the window protection layer WPL and the base substrate BS.

The bezel pattern BZP may define the bezel area BZA illustrated in FIG. 1A. In the illustrated embodiment, the bezel pattern BZP may be disposed on one surface of the window protection layer WPL, which faces the base substrate BS. FIG. 4A illustrates the bezel pattern BZP disposed on a lower surface of the window protection layer WPL, but the invention is not limited thereto, and the bezel pattern BZP may be disposed on any one of an upper surface of the window protection layer WPL, or an upper surface or a lower surface of the base substrate BS.

The bezel pattern BZP is a colored shield film, and for example, may be formed or provided through coating. The bezel pattern BZP may include a base material, and a dye or a pigment that is mixed with the base material. Accordingly, the user may recognize the non-active area NAA (refer to FIG. 1B) of the electronic device ED by a predetermined color of the bezel pattern BZP.

The optical film LF may be disposed between the window WM and the display module DM. The window WM and the optical film LF may be coupled to each other by a second lower adhesive layer AF2. The optical film LF may be disposed on the first area A1 of the display module DM.

In the display module DM, as illustrated in FIG. 4A, the second area A2 may be bent along the imaginary axis RX that extends in the first direction DR1, and thus the third area A3 may be disposed under the first area A1. That is, the first area A1 and the third area A3 may overlap each other in the third direction DR3. According to the invention, the cover film CIC may overlap at least a portion of the third area A3, and may entirely cover the driving chip DIC disposed (e.g., mounted) on the third area A3. Furthermore, the cover film CIC may continuously extend from the third area A3 to one end of the second area A2, which is adjacent to the first area A1. In an embodiment, the cover film CIC may cover an entirety of the second area A2. However, the invention is not limited thereto, and the cover film CIC may be disposed while exposing portions of opposite side surfaces of the display module DM, which are opposing to each other in the first direction DR1.

Referring to FIG. 4B, the cover film CIC may include a first cover insulating layer ISL1, an intermediate layer CDL, and a second cover insulating layer ISL2.

The first cover insulating layer ISL1 may be disposed on the display module DM. The first cover insulating layer ISL1 and the display module DM may be coupled to each other by a first cover adhesive layer CAL1.

In an embodiment, the first cover insulating layer ISL1 may include an insulating material. In an embodiment, the first cover insulating layer ISL1 may include a polymeric material, for example. The polymeric material in an embodiment may include at least any one of polyethylene terephthalate ("PET") and foam.

When the first cover insulating layer ISL1 includes PET, the cover film CIC may have a high modulus value, and may reduce stresses that occur in the lines disposed in the second area A2. This is because PET is a material that has a relatively high modulus value among polymeric materials. When the first cover insulating layer ISL1 includes foam, an impact absorption performance of the cover film CIC may be enhanced, and thus cracks that may be caused in the lines disposed in the second area A2 due to an external impact may be minimized.

In an embodiment, the cover film CIC may include a first cover layer ISL1 including a flexible metallic material instead of the first cover insulating layer ISL1, and the first cover adhesive layer CAL1 may include an insulating adhesive. In an embodiment, the first cover insulating layer ISL1 may include copper (Cu), for example. When the first cover insulating layer ISL1 includes copper (Cu), a minimum thickness of the first cover insulating layer ISL1, which the first cover insulating layer ISL1 has to have for a predetermined modulus value as compared with the polymeric material, may be small. Furthermore, a force, by which the first cover insulating layer ISL1 is to be restored to a state before bending after being bent together with the second area A2 (refer to FIG. 1B) of the display module DM (refer to FIG. 1B), is low. Accordingly, the cover film CIC may be prevented from being lifted from the display module DM.

However, the invention is not limited thereto, and the first cover insulating layer ISL1 may include a bonding insulation material. Then, the first cover adhesive layer CAL1 may be omitted.

The intermediate layer CDL may be disposed on the first cover insulating layer ISL1. The intermediate layer CDL and the first cover insulating layer ISL1 may be coupled to each other by a second cover adhesive layer CAL2.

The intermediate layer CDL may include a conductive material. In an embodiment, the intermediate layer CDL may include any one of a metallic material and a conductive fiber, for example. The conductive fiber in an embodiment may include non-woven fabric.

The intermediate layer CDL may be disposed between the first cover insulating layer ISL1 and the second cover insulating layer ISL2 to shield static electricity. Accordingly, the cover film CIC may prevent the display module DM from being damaged due to external static electricity.

The second cover adhesive layer CAL2 may include a conductive adhesive material. In an embodiment, the second cover adhesive layer CAL2 may be a film that is formed or provided by dispersing metal particles in a synthetic resin, for example. In an embodiment, the metal particles may include gold, silver, platinum, nickel, copper, and carbon. In an embodiment, the synthetic resin may include a material such as epoxy, silicon, polyimide, or polyurethane.

The second cover insulating layer ISL2 may be disposed on the intermediate layer CDL. The second cover insulating layer ISL2 and the intermediate layer CDL may be coupled to each other by a third cover adhesive layer CAL3.

The second cover insulating layer ISL2 may include an insulating material. The second cover insulating layer ISL2 may include an organic material, and for example, may include PET. In an embodiment, the second cover insulating layer ISL2 may have a black color, and may function as a shield.

In the illustrated embodiment, the cover film CIC may have a thickness equal to or greater than about 30 micrometers and equal to or less than about 120 micrometers. When the thickness of the cover film CIC is less than 30 micrometers, it may not have a modulus value that is high enough to protect the bent second area A2 and decrease stresses of the lines disposed in the second area A2. When the thickness of the cover film CIC is more than about 120 micrometers, the bezel area BZA may be widened by a dead space that is expanded by the thickness of the cover film CIC, and therefore the cover film CIC may be lifted from the display module DM.

A thickness of a part of the cover film CIC, which includes the second cover adhesive layer CAL2, the intermediate layer CDL, the third cover adhesive layer CAL3, and the second cover insulating layer ISL2, may be defined as a first thickness TH1, and a thickness of a part of the cover film CIC, which includes the first cover insulating layer ISL1 and the first cover adhesive layer CAL1, may be defined as a second thickness TH2.

In an embodiment, the first thickness TH1 may be equal to or greater than about 25 micrometers and equal to or less than about 35 micrometers. In an embodiment, the second thickness TH2 may be equal to or greater than about 25 micrometers and equal to or less than about 85 micrometers. Then, the thickness of the first cover insulating layer ISL1 may be different according to materials included in the first cover insulating layer ISL1, and the thickness of the first cover adhesive layer CAL1 also may be different according to materials included in the first cover insulating layer ISL1.

Referring back to FIG. 4A, the cover film CIC according to the invention may block noise caused around the flexible circuit film FCB and the driving chip DIC, and may protect the lines disposed on the flexible circuit film FCB from an external impact or the like by covering the lines.

Furthermore, the cover film CIC according to the invention also may protect the bent second area A2 of the display module DM from an impact provided from an outside by covering an entirety of the second area A2 together.

According to the invention, a process of forming a bending protection layer on the second area A2 of the display module DM may be omitted by expanding the cover film CIC that covers the flexible circuit film FCB and the driving chip DIC to the second area A2 of the display module DM.

The cover film CIC may include the first cover insulating layer ISL1 and the intermediate layer CDL that use a material having a modulus value that is higher than that of the bending protection layer that conventionally covers the second area A2. Accordingly, a process of attaching a separate cover member that surrounds the second area A2 to protect the bending protection layer may be omitted. Through this, the invention may provide the electronic device ED having a simplified process and reduced costs.

Furthermore, because the cover film CIC has a high modulus value due to the first cover insulating layer ISL1 and the intermediate layer CDL, a neutral surface defined by a surface, in which a tensile stress and a compression stress that are generated during bending are offset, may be disposed to be closer to the cover film CIC. The lines that are bent while overlapping the second area A2 may be cracked by a tensile stress applied during the bending, but according to the invention, a tensile stress caused in the lines disposed in the second area A2 may be reduced. Accordingly, cracks may be reduced by minimizing stresses caused in the lines disposed in the second area A2, and the electronic device ED having an improved reliability may be provided.

However, the invention is not limited thereto, and may further include the bending protection layer that covers the second area A2. The electronic device ED that desires a high strength in the bent area may further include the bending protection layer disposed on the second area A2 of the display module DM. Then, the bending protection layer may be covered by the cover film CIC. Because the bending protection layer is covered by the cover film CIC having a modulus value that is higher than that of the bending protection layer, a process of attaching the separate cover member that surrounds the second area A2 may be omitted.

In an embodiment, the cover film CIC may extend to overlap a portion of the first area A1 of the display module DM, and may contact the optical film LF disposed in the first area A1. In an embodiment, as illustrated in FIG. 4A, one end of the cover film CIC that overlaps the first area A1 and one end of the optical film LF, which is adjacent to the cover film CIC may contact each other, and a portion of the first area A1 of the display module DM, which is exposed from the optical film LF and the cover film CIC, may not be present, for example.

In an embodiment, a portion of the cover film CIC, which is disposed on the first area A1, may be coupled to the window WM by the second adhesive film AF2. Accordingly, the cover film CIC may be prevented from being lifted from the display module DM when being bent. However, the invention is not limited thereto, and the second adhesive film AF2 may be disposed only on the optical film LF.

The display device DD may include the lower protection films PF1 and PF2 disposed under the display module DM. The lower protection films PF1 and PF2 may include a first protection film PF1 disposed under the first area A1, and a second protection film PF2 disposed under the third area A3. Because the lower protection films PF1 and PF2 are not disposed under the second area A2, the display module DM may be smoothly bent.

The cover panel CP may be disposed under the first protection film PF1. The first protection film PF1 and the cover panel CP may be coupled to each other by the first lower adhesive layer AL1. As illustrated in FIG. 4A, because the second area A2 of the display module DM is bent, the second protection film PF2 may be coupled to a lower side of the cover panel CP. The second protection film PF2 and the cover panel CP may be coupled to each other by the second lower adhesive layer AL2. Because the cover panel CP may be disposed between the first protection film PF1 and the second protection film PF2 after the second area A2 of the display module DM is bent, it may support the bent display module DM.

Figure 5A:
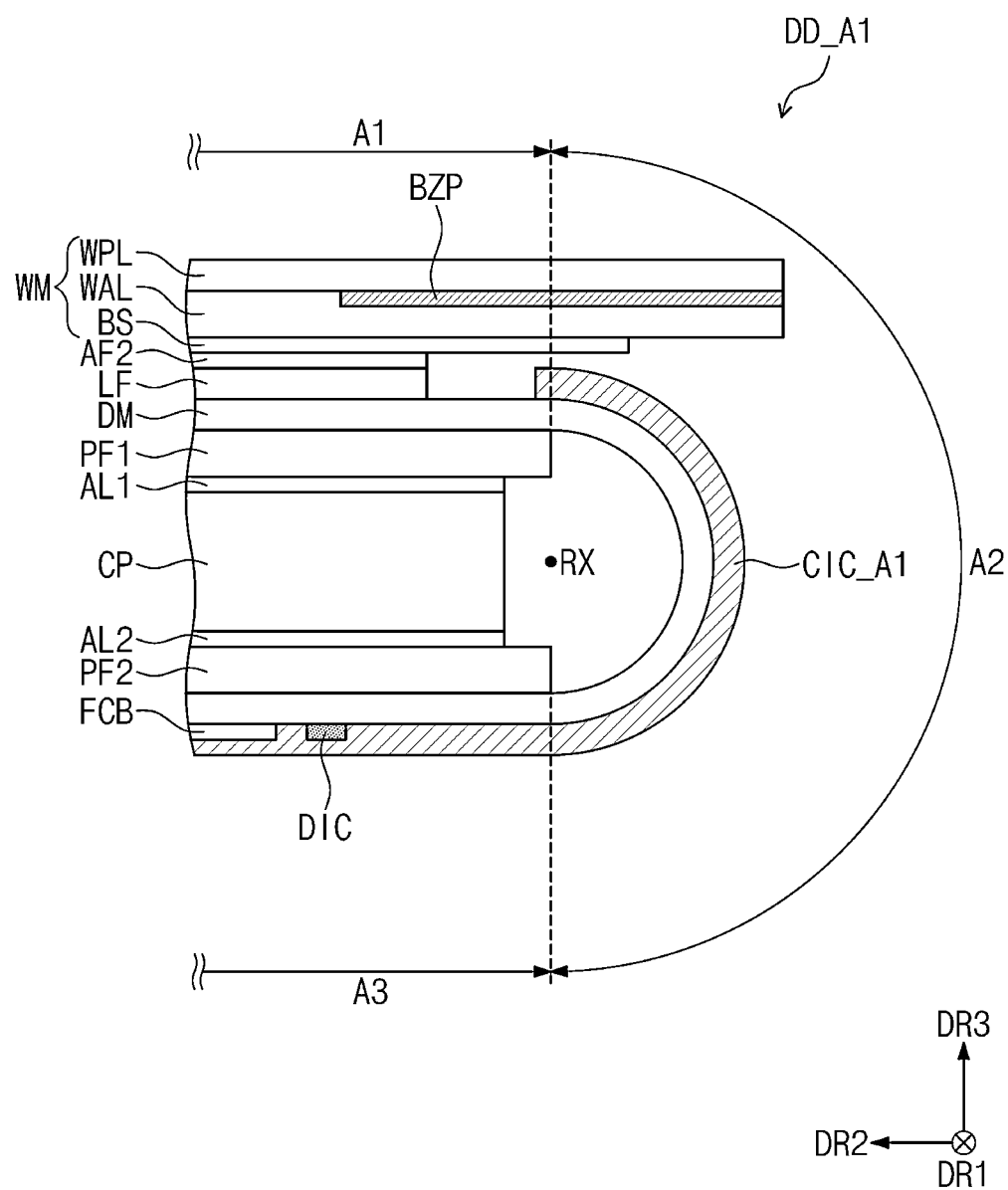
FIG. 5A is an enlarged cross-sectional view of an embodiment of a portion of a display device according to the invention.
Figure 5B:
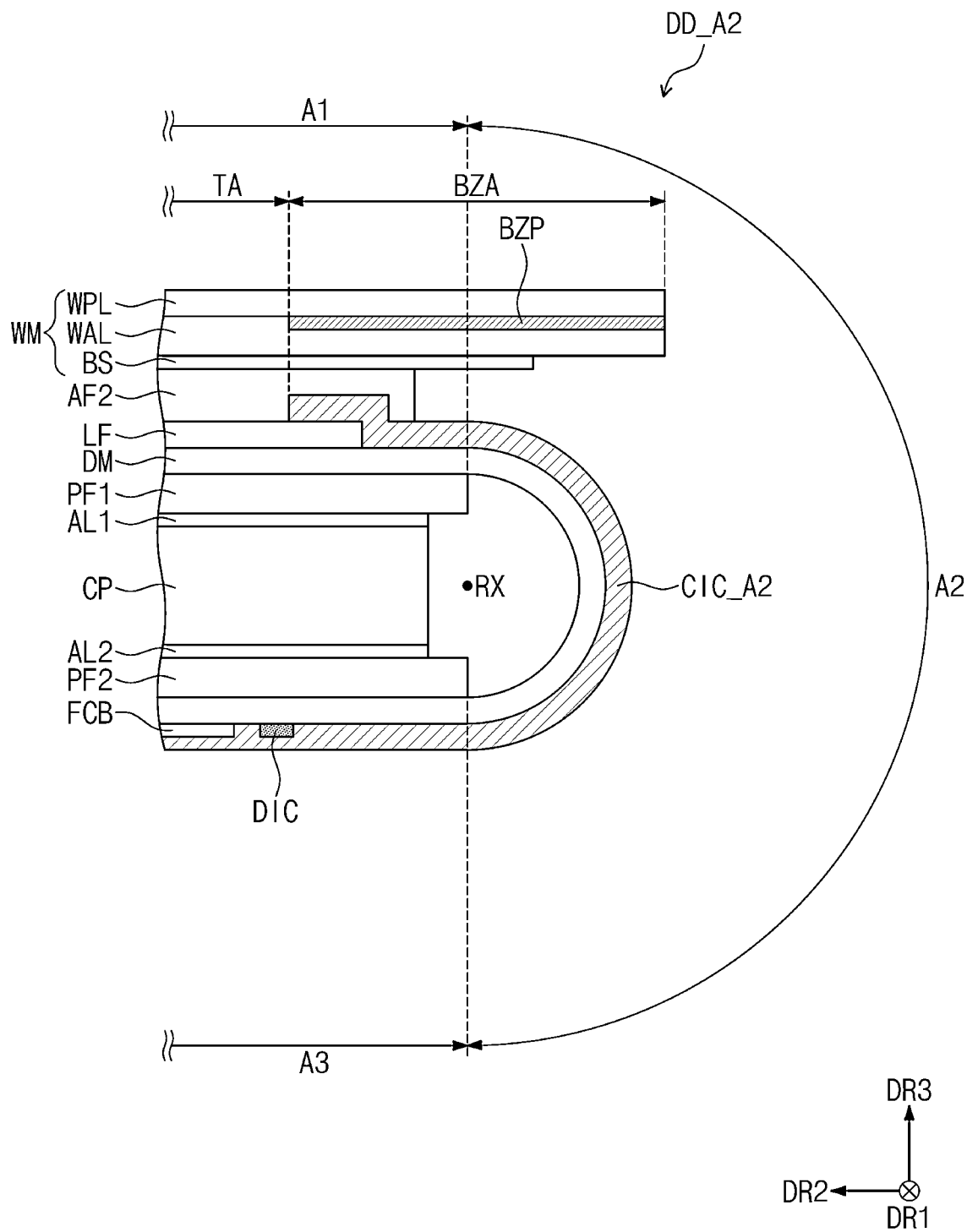
FIG. 5B is an enlarged cross-sectional view of an embodiment of a portion of a display device according to the invention.

FIG. 5A is an enlarged cross-sectional view of an embodiment of a display device according to the invention. FIG. 5B is an enlarged cross-sectional view of an embodiment of a display device according to the invention. The same or similar reference numerals are used for the configurations that are the same as or similar to the configurations described in FIGS. 1A to 4B, and a repeated description thereof will be omitted. FIG. 5A illustrates a display device DD_A1 including a cover film CIC_A1 in an embodiment, and FIG. 5B illustrates a display device DD_A2 including a cover film CIC_A2.

Referring to FIG. 5A, the cover film CIC_A1 in the embodiment illustrated in FIG. 5A is different from the cover film CIC described in FIG. 4A in that one end of the optical film LF and one end of the cover film CIC_A1, which face each other, are disposed in the first area A1 to be spaced apart from each other. Accordingly, a portion of the display module DM, which overlaps the first area A1 may be exposed.

In an embodiment, the second adhesive film AF2 may be disposed only on the optical film LF, and may not be disposed on the cover film CIC_A1. Because the cover film CIC_A1 and the window WM are not coupled to each other, a tensile stress caused when bending the cover film CIC_A1 may be reduced, and cracks of the cover film CIC_A1 itself may be prevented.

FIG. 5A illustrates that the cover film CIC_A1 covers a portion of the first area A1 of the display module DM, but the invention is not limited thereto. In an embodiment, the cover film CIC_A1 may not cover the first area A1, and one end of the cover film CIC_A1 may be arranged at a border of the first area A1 and the second area A2, for example.

Referring to FIG. 5B, the cover film CIC_A2 in an embodiment illustrated in FIG. 5B may cover a portion of the optical film LF when compared with the cover film CIC described in FIG. 4B. In an embodiment, one end of the cover film CIC_A2 disposed on the optical film LF may overlap the bezel pattern BZP of the window WM. This is because the bezel area BZA is defined by the second cover insulating layer ISL2 that functions as a shield, and decreases the transmission area TA when the cover film CIC_A2 is disposed not to overlap the bezel pattern BZP in the first area A1.

In an embodiment, a portion of the cover film CIC_A2, which is disposed on the first area A1, may be covered by the second adhesive film AF2 to be coupled to the window WM.

Because a portion of the cover film CIC_A2, which covers the optical film LF, has a step, the lifting may be prevented.

Figure 6A:
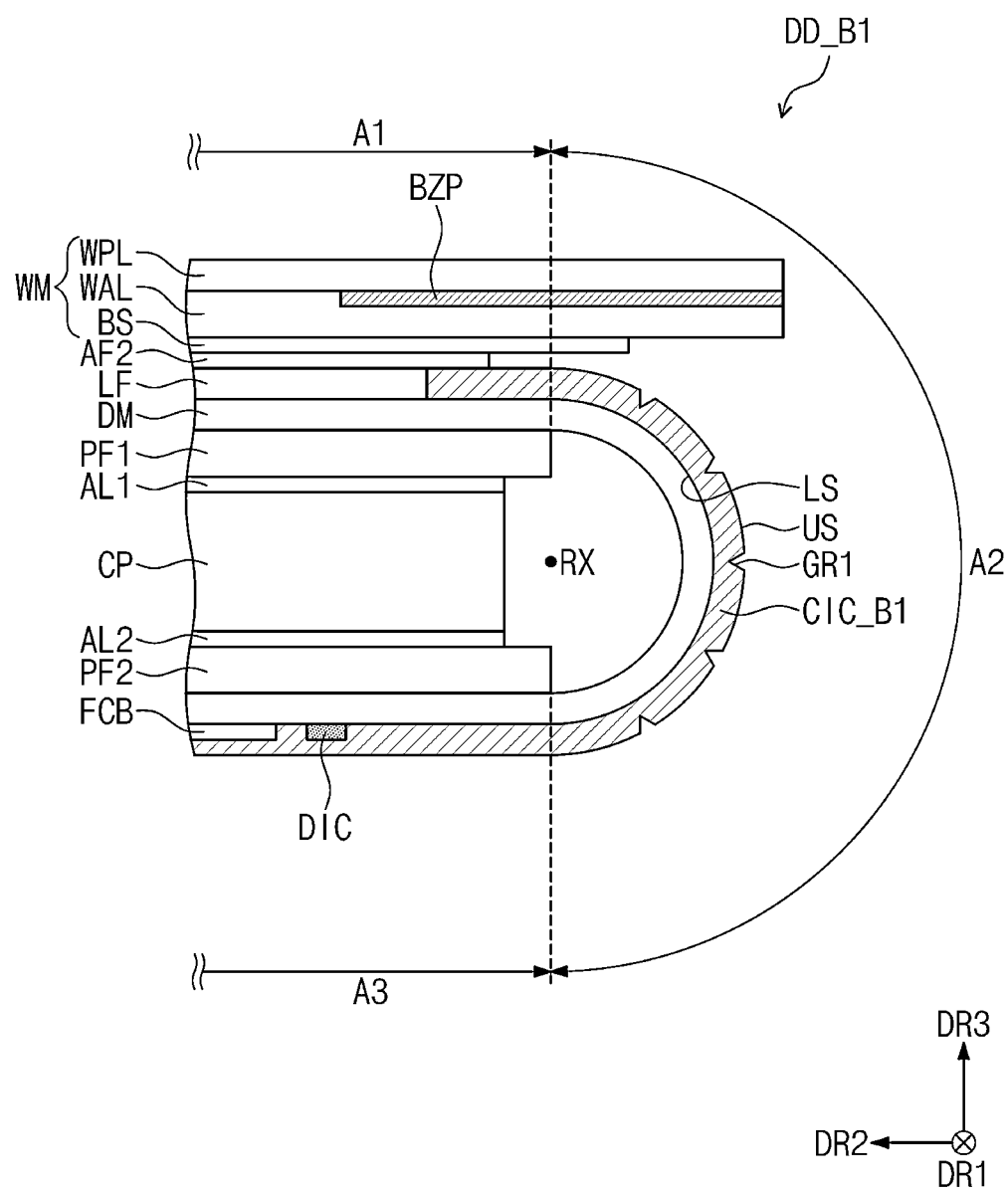
FIG. 6A is an enlarged cross-sectional view of an embodiment of a portion of a display device according to the invention.
Figure 6B:
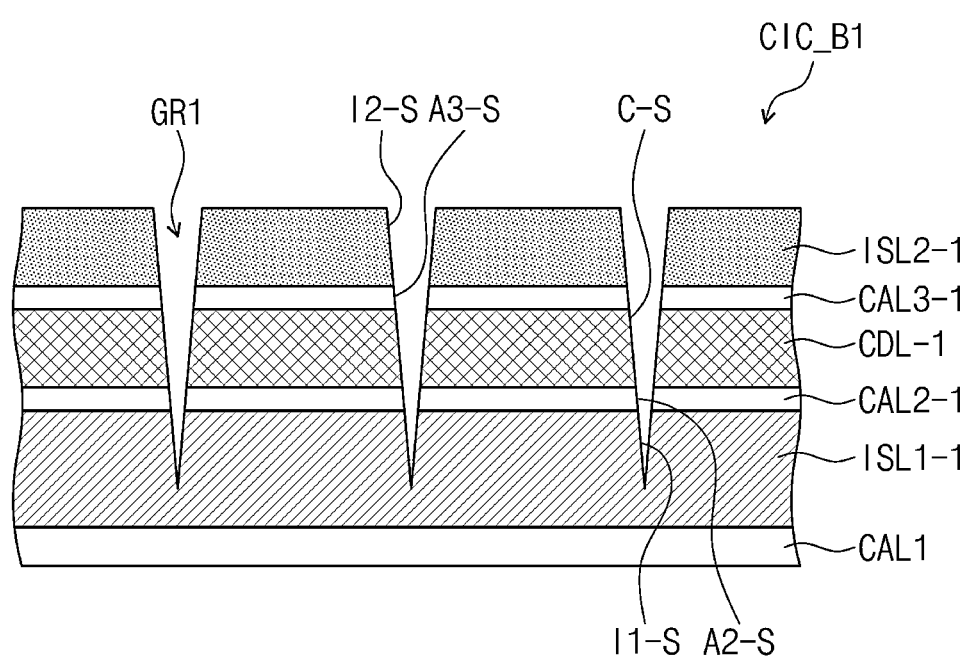
FIG. 6B is an enlarged cross-sectional view of an embodiment of a portion of a display device according to the invention.
Figure 6C:
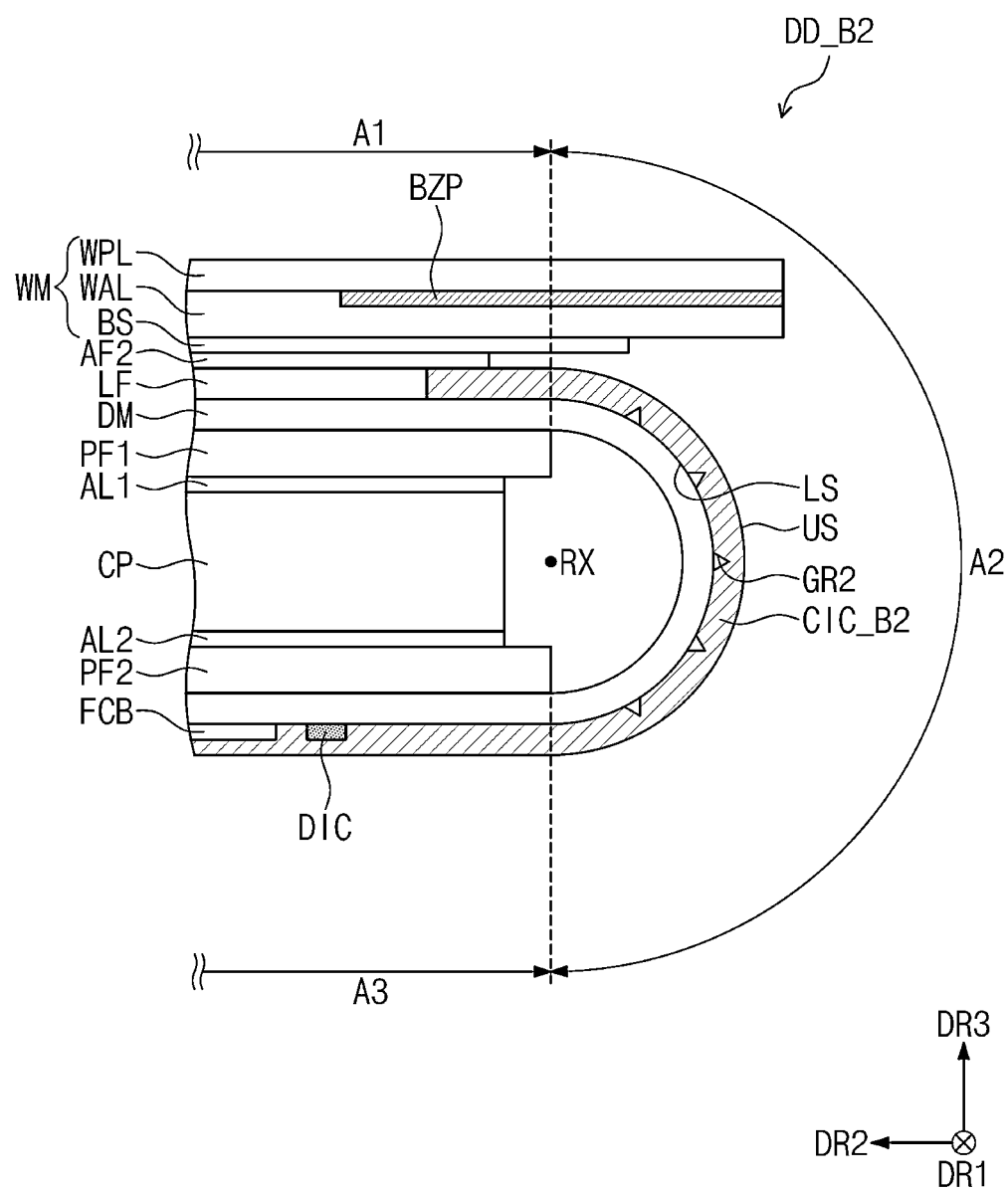
FIG. 6C is an enlarged cross-sectional view of an embodiment of a portion of a display device according to the invention.
Figure 6D:
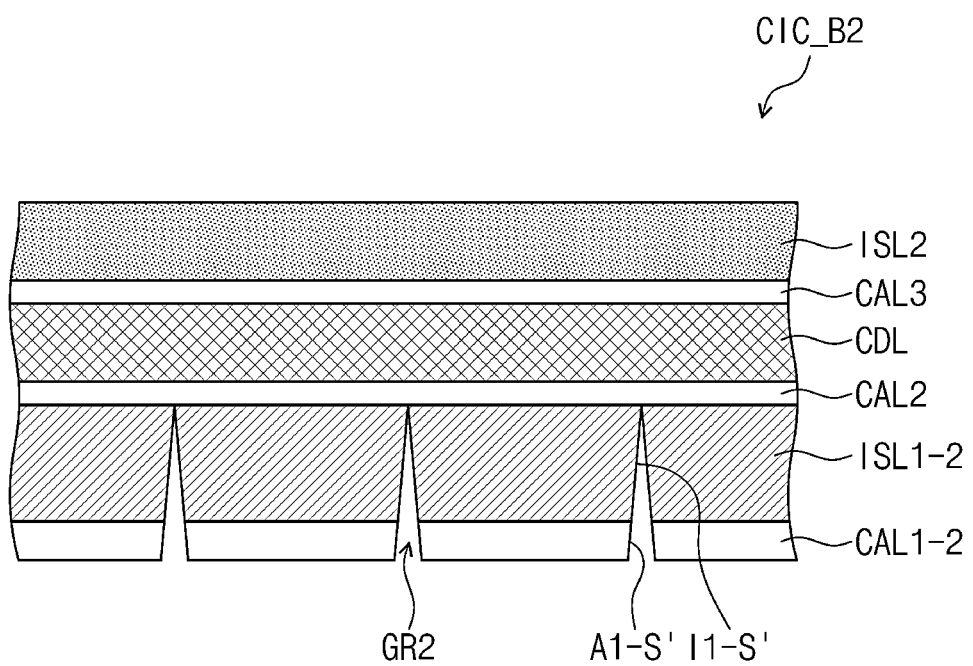
FIG. 6D is an enlarged cross-sectional view of an embodiment of a portion of a display device according to the invention.

FIG. 6A is an enlarged cross-sectional view of an embodiment of a portion of a display device according to the invention. FIG. 6B is an enlarged cross-sectional view of an embodiment of a portion of a display device according to the invention. FIG. 6C is an enlarged cross-sectional view of an embodiment of a portion of a display device according to the invention. FIG. 6D is an enlarged cross-sectional view of an embodiment of a portion of a display device according to the invention.

FIG. 6A illustrates a display device DD_B1 including a cover film CIC_B1 in an embodiment, and FIG. 6B is an enlarged cross-sectional view illustrating the cover film CIC_B1 of the display device DD_B1 illustrated in FIG. 6A. FIG. 6C illustrates a display device DD_B2 including a cover film CIC_B2. FIG. 6D is an enlarged cross-sectional view illustrating the cover film CIC_B2 of the display device DD_B2 illustrated in FIG. 6C. As illustrated in FIGS. 6A and 6C, each of the cover films CIC_B1 and CIC_B2 may include a lower surface LS that contact the display module DM and an upper surface US that is opposing thereto. The same or similar reference numerals are used for the configurations that are the same as or similar to the configurations described in FIGS. 1 to 4C, and a repeated description thereof will be omitted.

Referring to FIG. 6A, at least one first groove GR1 may be defined in the cover film CIC_B1 by removing a portion of the cover film CIC_B1 from the upper surface US in a thickness direction of the cover film CIC_B1. The first groove GR1 may be defined to overlap the second area A2 of the display module DM.

Because the first groove GR1 is defined in the cover film CIC_B1, a distance between inner surfaces that define the first groove GR1 may become distant when the cover film CIC_B1 is bent together with the display module DM, and a tensile stress caused in the cover film CIC_B1 may be reduced. Accordingly, the stresses delivered to the display module DM bonded to the cover film CIC_B1 may be reduced, and thus the stresses caused in the lines disposed in the second area A2 may be reduced.

Accordingly, cracks may be prevented from being caused in the lines due to the bending of the display module DM, and thus the display device DD_B1 having an improved reliability may be provided.

Referring to FIG. 6B, the first groove GR1 of the cover film CIC_B1 in an embodiment may be defined by arranging a side surface 12-S of a second cover insulating layer ISL2-1, a side surface A3-S of a third cover adhesive layer CAL3-1, a side surface C-S of an intermediate layer CDL-1, a side surface A2-S of a second cover adhesive layer CAL2-1, and a side surface I1-S of a first cover insulating layer ISL1-1 (hereinafter, first exposed surfaces), which are exposed.

The opposing first exposed surfaces define the first groove GR1, and a spacing distance between the first exposed surfaces may increase as it goes from the first cover insulating layer ISL1-1 toward the second cover insulating layer ISL2-1. In an embodiment, the opposing first exposed surfaces may be in a "V" shape, but the invention is not limited thereto. In an embodiment, the opposing first exposed surfaces may be in a "U" shape, for example.

FIG. 6B illustrates that the first groove GR1 is defined by removing at least a portion of a part from the second cover insulating layer ISL2-1 to the first cover insulating layer ISL1-1, and a depth of the first groove GR1 is not limited to a particular embodiment. The depth of the first groove GR1 may be different according to a material of the cover film CIC_B1 or a radius of curvature of cover film CIC_B1 defined when the second area A2 of the display module DM (refer to FIG. 6A) is bent.

Referring to FIG. 6C, at least one second groove GR2 may be defined in the cover film CIC_B2 by removing a portion of the cover film CIC_B2 from the lower surface LS in a thickness direction of the cover film CIC_B2. The second groove GR2 may be defined to overlap the second area A2 of the display module DM.

Because the second groove GR2 is defined in the cover film CIC_B2, a distance between inner surfaces that define the second groove GR2 may become smaller when the cover film CIC_B2 is bent together with the display module DM, and a radius of curvature of the lower surface LS may be reduced during bending. Accordingly, a compression stress caused at a portion of the cover film CIC_B2, which is adjacent to the display module DM, may be reduced. That is, the stresses delivered to the display module DM bonded to the cover film CIC_B2 may be reduced, and thus the stresses caused in the lines disposed in the second area A2 may be reduced.

Accordingly, cracks may be prevented from being caused in the lines due to the bending of the display module DM, and thus the display device DD_B2 having an improved reliability may be provided.

Referring to FIG. 6D, the second groove GR2 of the cover film CIC_B2 in an embodiment may be defined by arranging a side surface A1-S' of the first cover adhesive layer CAL1-2 and a side surface I1-S' of the first cover insulating layer ISL1-2 (hereinafter, second exposed surfaces), which are exposed.

The opposing second exposed surfaces define one second groove GR2, and a spacing distance between the second exposed surfaces may increase as it goes from the first cover insulating layer ISL1-2 toward the first cover adhesive layer CAL1-2.

In an embodiment, the opposing second exposed surfaces may be in an inverse "V" shape, but the invention is not limited thereto. In an embodiment, the opposing second exposed surface may be in an inverse "U" shape, for example.

FIG. 6D illustrates that the second groove GR2 is defined by removing at least a portion of a part from the first cover adhesive layer CAL1-2 to the first cover insulating layer ISL1-2, and a depth of the second groove GR2 is not limited to a particular embodiment. The depth of the second groove GR2 may be different according to a material of the cover film CIC_B2 or a radius of curvature of the cover film CIC_B2 defined when the second area A2 of the display module DM (refer to FIG. 6C) is bent.

Figure 7A:
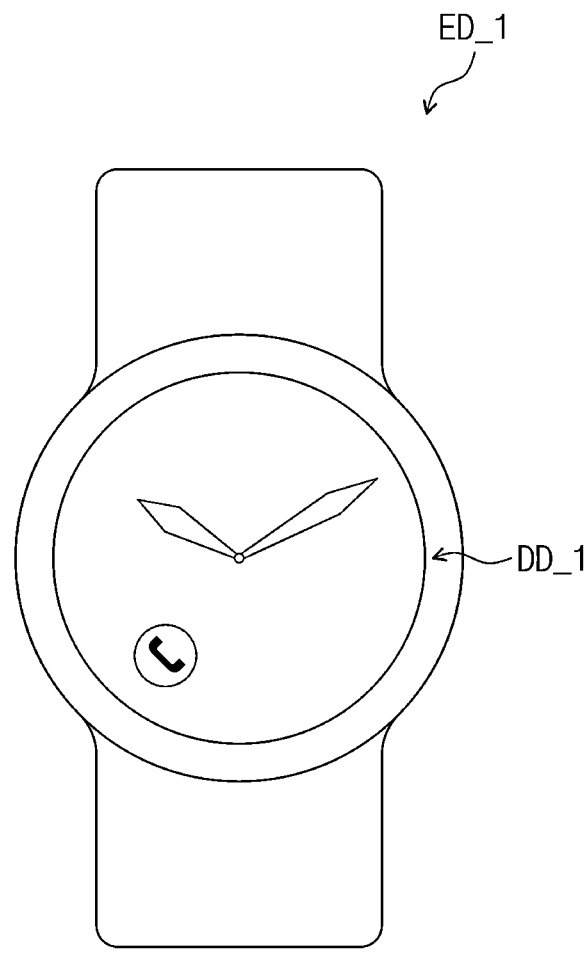
FIG. 7A is a plan view of an embodiment of an electronic device according to the invention.
Figure 7B:
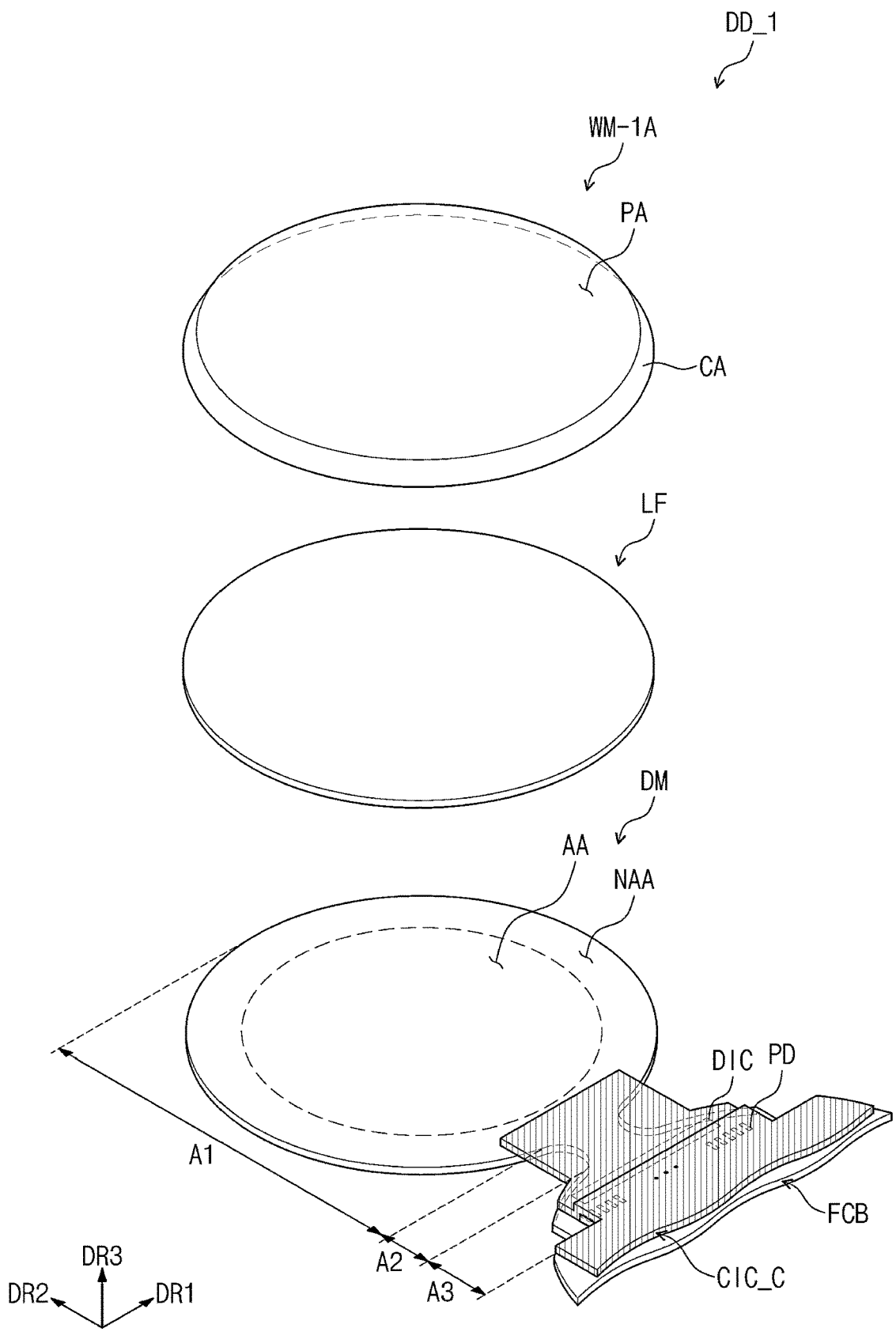
FIG. 7B is an exploded perspective view of an embodiment of a display device according to the invention.
Figure 7C:
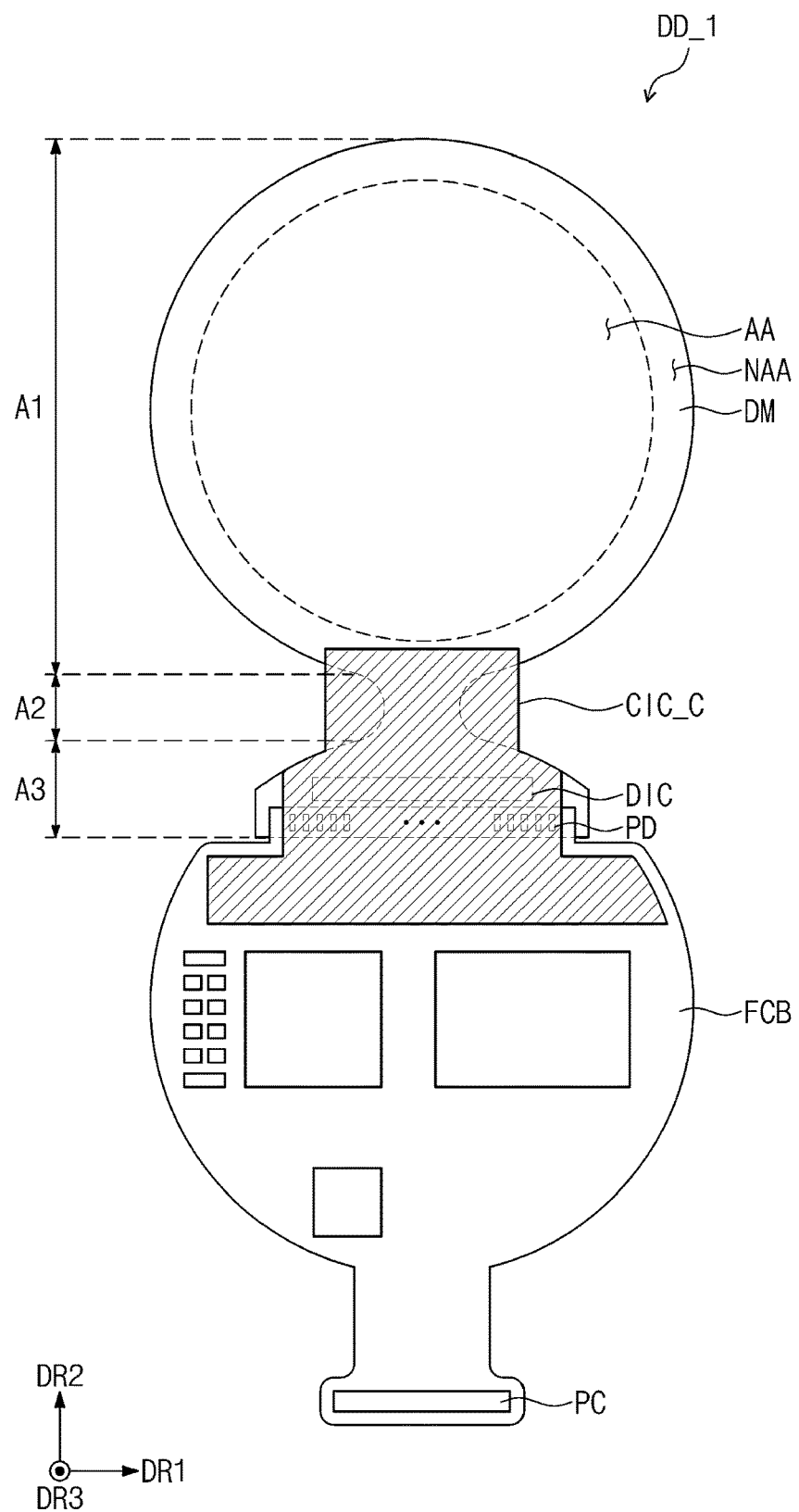
FIG. 7C is a plan view of some components of a display device according to the invention.
Figure 8:
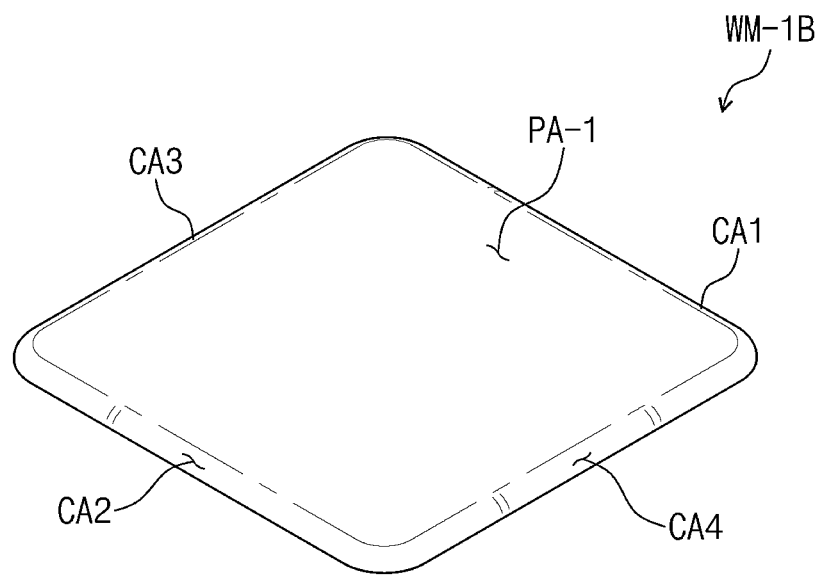
FIG. 8 is a perspective view illustrating an embodiment of a window according to the invention.
Figure 8:
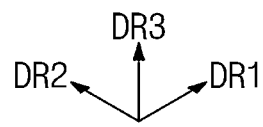

FIG. 7A is a plan view of an embodiment of an electronic device according to the invention. FIG. 7B is an exploded perspective view of an embodiment of a display device according to the invention. FIG. 7C is a plan view of an embodiment of some components of a display device according to the invention. FIG. 8 is a perspective view of an embodiment of a component of a display device according to the invention. The same or similar reference numerals are used for the configurations that are the same as or similar to the configurations described in FIGS. 1 to 6D, and a repeated description thereof will be omitted and different configurations will be mainly described.

FIG. 7B illustrates an exploded perspective view of a window WM-1A, an optical film LF, a display module DM, a flexible circuit film FCB, and a cover film CIC_C of a display device DD_1. FIG. 7C illustrates a plan view of, among them, the display module DM, the flexible circuit film FCB, and the cover film CIC_C. FIG. 8 illustrates a window WM-1B of the display device DD_1, and a window WM-1B illustrated in FIG. 8 is different from the window WM-1A illustrated in FIG. 7B in their shapes.

Referring to FIG. 7A, an electronic device ED_1 in an embodiment may be a wearable device. It is illustrated that an external shape of the electronic device ED_1 illustrated in FIG. 7A has a circular shape, but the invention is not limited thereto. In an embodiment, the external shape of the electronic device ED_1 may have a rounded square shape.

Referring to FIGS. 7B and 7C, the display device DD_1 in an embodiment may include the window WM-1A, the optical film LF, the display module DM, the flexible circuit film FCB, and the cover film CIC_C. The same or similar reference numerals are used for the configurations that are the same as or similar to the configurations described in FIG. 1B, and a repeated description thereof will be omitted.

In an embodiment, the window WM-1A may include a flat part PA having a circular shape, and a curved part CA that extends from the flat part PA and is bent in a predetermined direction. The curved part CA may surround the flat part PA.

That is, unlike the window WM having the flat shape illustrated in FIG. 1B, the window WM-1A illustrated in FIG. 7B may include a bent part. Accordingly, the window WM-1A in the illustrated embodiment may have a three-dimensional shape.

In an embodiment, the curved part CA may include at least a portion of the bezel area BZA (refer to FIG. 1B). In an embodiment, only a portion that is adjacent to an end of the curved part CA, which is spaced apart from the flat part PA, may form the bezel area BZA, and an entirety of the curved part CA may form the bezel area BZA, for example.

In an embodiment, the display module DM may include a first area A1, a second area A2, and a third area A3, which are sequentially arranged. The second area A2 may be defined by a portion that is bent with respect to a predetermined axis extending in the first direction DR1. As the second area A2 is bent, the first area A1 and the third area A3 may overlap each other in a plan view.

The first area A1 of the display module DM may have a circular shape in a plan view. A width of the second area A2 in the first direction DR1 may decrease and then increase as it goes from a direction that faces the third area A3 from the first area A1, that is, an opposite direction to the second direction DR2. A width of the second area A2 in the first direction DR1 may be smaller than a diameter of the first area A1 of the display module DM in the first direction DR1, and the second area A2 may include a part that has the smallest width in the first direction DR1.

The flexible circuit film FCB may be disposed on the pads PD of the third area A3 to be electrically connected to the display module DM. The flexible circuit film FCB may further include a plurality of driving elements. The plurality of driving elements may include a circuit part for converting a signal input from an outside to a signal that is necessary for the driving chip DIC. The flexible circuit film FCB may further include a connector PC connected to a main board.

According to the invention, the cover film CIC_C may overlap at least a portion of the third area A3 of the display module DM, and may cover an entirety of the driving chip DIC disposed (e.g., mounted) on the third area A3. Furthermore, the cover film CIC_C may cover the flexible circuit film FCB. In an embodiment, the cover film CIC_C may cover a part that is adjacent to the third area A3 of the flexible circuit film FCB, for example. The cover film CIC_C may extend to the second area A2 to cover an entire area of the second area A2.

In the illustrated embodiment, a width of a part of the cover film CIC_C, which overlaps the second area A2, in the first direction DR1 may be larger than a width of the second area A2 in the first direction DR1. Accordingly, the cover film CIC_C may enhance a support force of the second area A2 that is bent during a fabrication process, and may prevent cracks of the lines included in the display module DM. The detailed description thereof will be described later.

Referring to FIG. 8, the window WM-1B in an embodiment may include a flat part PA-1 having a quadrangular (e.g., rectangular) shape, and first to fourth curved parts CA1, CA2, CA3, and CA4 that extend from the flat part PA-1 and are bent in a predetermined direction.

The first curved part CA1 and the second curved part CA2 may extend along the second direction DR2, and may be spaced apart from each other in the first direction DR1 while the flat part PA-1 being interposed therebetween. The third curved part CA3 and the fourth curved part CA4 may extend along the first direction DR1, and may be spaced apart from each other in the second direction DR2 while the flat part PA-1 being interposed therebetween.

The first to fourth curved parts CA1, CA2, CA3, and CA4 may be bent from the flat part PA-1 while having a predetermined curvature. Curvatures between the first to fourth curved parts CA1, CA2, CA3, and CA4 and the flat part PA-1 may be the same, and curvatures between corners of the first to fourth curved parts CA1, CA2, CA3, and CA4 and the flat part PA-1 may be different from the above curvatures. Accordingly, the window WM-1B in the illustrated embodiment may include a double curvature.

The window WM-1B according to the invention may be used for the electronic device ED_1 (refer to FIG. 7A) having a square external shape. However, the invention is not limited thereto, and the window WM-1B having the double curvature also may be applied to the window WM (refer to FIG. 1B) of the display device DD (refer to FIG. 1B) described in FIGS. 1A and 1B.

Hereinafter, the display device DD_1 applied to the electronic device ED_1 of a circular shape will be described as a reference, but the description of all the configurations of the display device DD_1 also may be applied to the electronic device ED_1 having a quadrangular (e.g., rectangular) external shape and the display device DD_1.

Figure 9A:
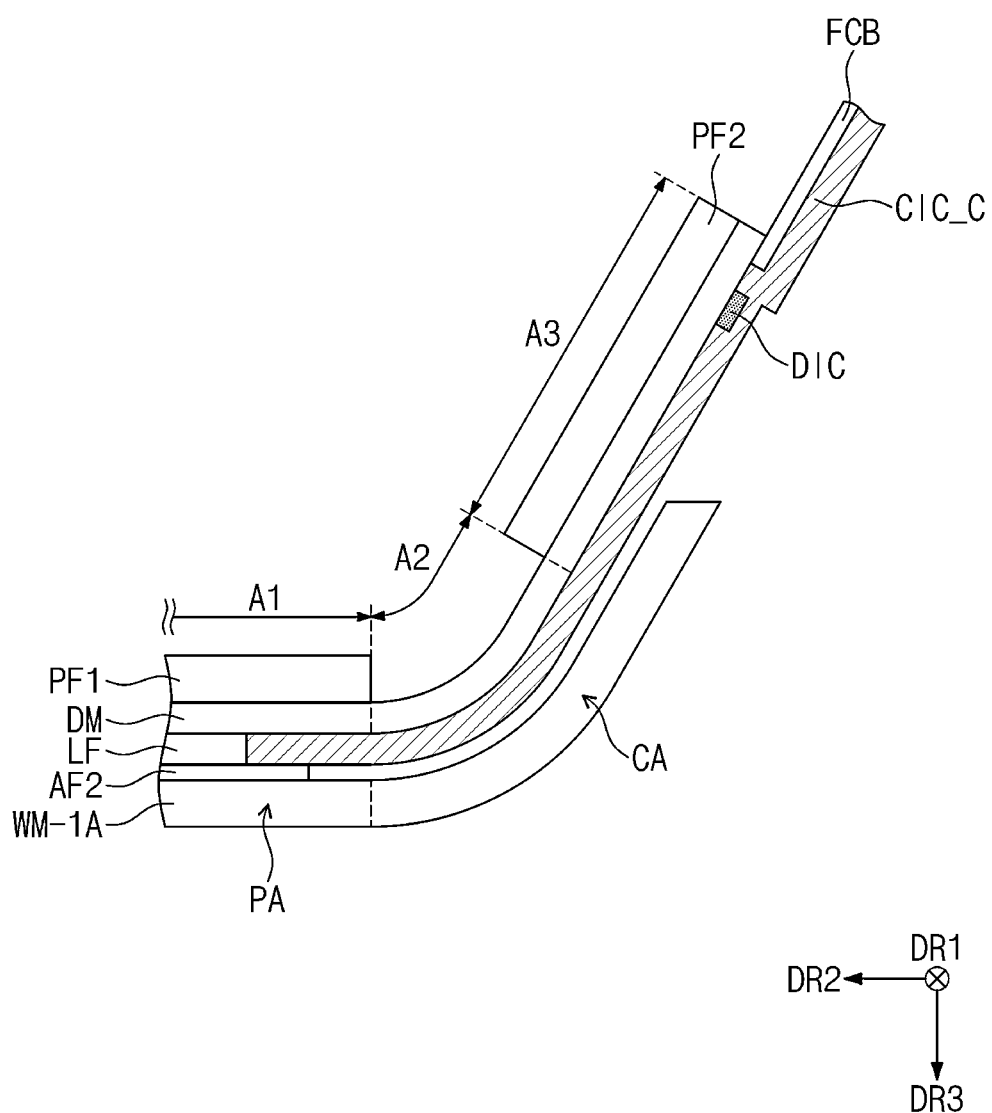
FIG. 9A is a cross-sectional view illustrating an embodiment of some components of a display device according to the invention.
Figure 9B:
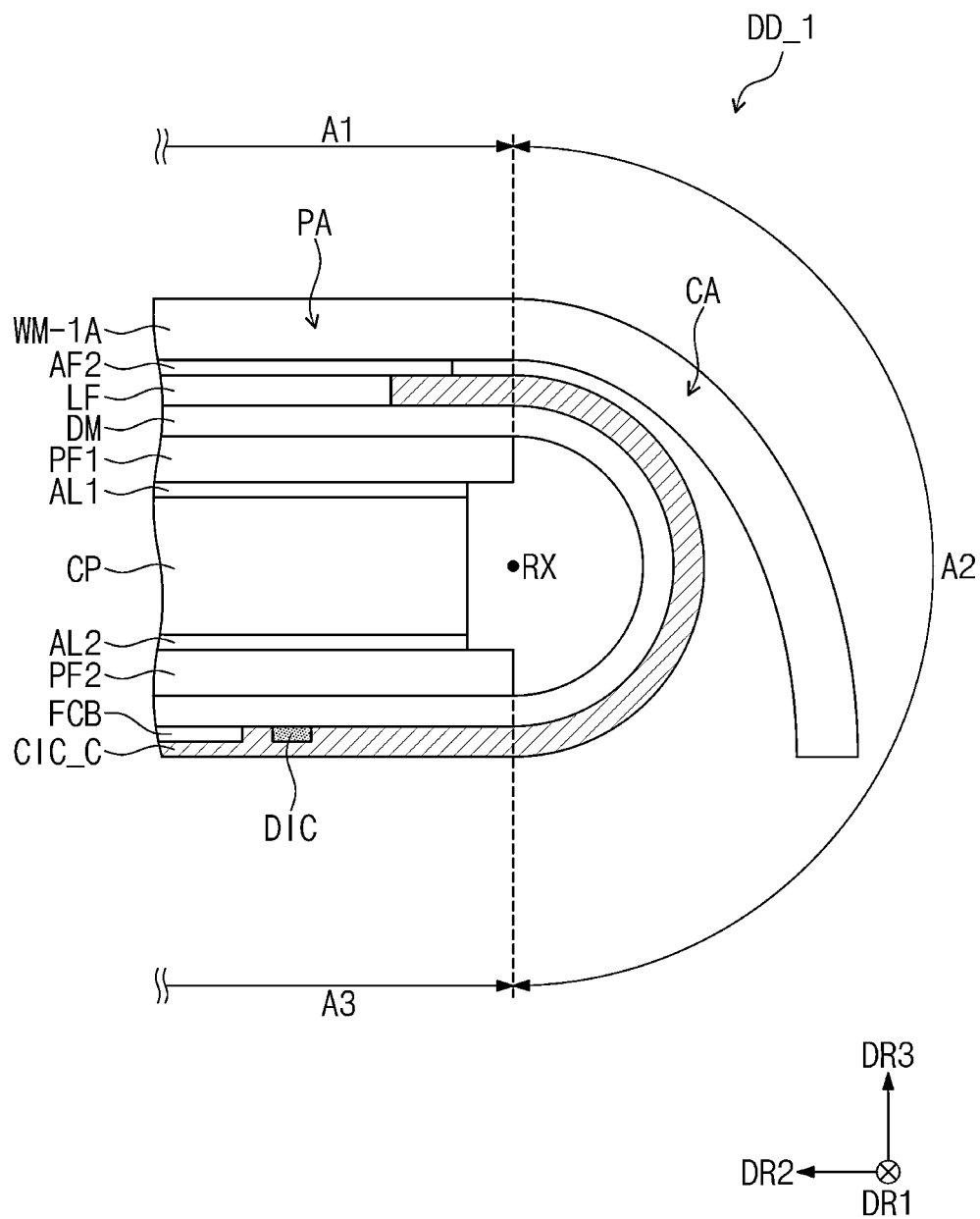
FIG. 9B is a cross-sectional view illustrating an embodiment of some components of a display device according to the invention.

FIG. 9A is a cross-sectional view illustrating an embodiment of some components of a display device according to the invention. FIG. 9B is a cross-sectional view illustrating an embodiment of some components of a display device according to the invention. FIG. 9A is a cross-sectional view illustrating a state, in which the second area A2 of the display module DM is bent. FIG. 9B illustrates a cross-sectional view in a state, in which the second area A2 is bent such that the third area A3 of the display module DM is disposed under the first area A1.

Referring to FIGS. 9A and 9B, the display device DD_1 in the illustrated embodiment may be fabricated by performing one process of coupling the display module DM, in a state where the optical film LF, the cover film CIC_C, and the lower protection films PF1 and PF2 are attached to the display module DM, to a lower side of the window WM-1A and then bending the second area A2 of the display module DM with respect to the imaginary axis RX that extends in the first direction DR1. In an embodiment, an operation of attaching the cover panel CP disposed between the first protection film PF1 and the second protection film PF2 before the second area A2 of the display module DM is bent may be included.

When the display module DM is coupled to a lower side of the window WM-1A, as illustrated in FIG. 9A, the curved part CA of the window WM-1A in an embodiment may overlap the second area A2 of the display module DM, and the second area A2 of the display module DM may have a shape, in which a portion of the second area A2 is bent by the curved part CA of the window WM-1A. That is, in a process of attaching the first area A1 of the display module DM to a lower side of the flat part PA of the window WM-1A, the second area A2 of the display module DM may be partially bent by the curved part CA of the window WM-1A, and accordingly, the third area A3 of the display module DM may protrude from the curved part CA of the window WM-1A.

Then, the third area A3 may be deflected downwards by a load of the flexible circuit film FCB connected to the third area A3, and a stress may be caused in the second area A2 as the second area A2 is bent. Furthermore, the third area A3 may contact the curved part CA of the window WM-1A, and a stress may be caused in the third area A3. Accordingly, a crack may occur in the lines included in the display module DM.

According to the invention, the cover film CIC_C may cover the second area A2 and the third area A3 of the display module DM, and at least a portion of the flexible circuit film FCB, and the cover film CIC_C that overlaps the second area A2 may have a width that is larger than a width of the second area A2 in the first direction DR1, whereby a phenomenon, in which the second area A2 is bent in the process of attaching the display module DM to the window WM-1A, may be prevented, and a phenomenon, in which the third area A3 is deflected downwards, also may be prevented.

Accordingly, cracks that may be caused in the lines included in the display module during a process of fabricating the electronic device ED_1 (refer to FIG. 7A) in the illustrated embodiment may be prevented, and the electronic device ED_1 having an improved reliability may be fabricated.

Figure 10:
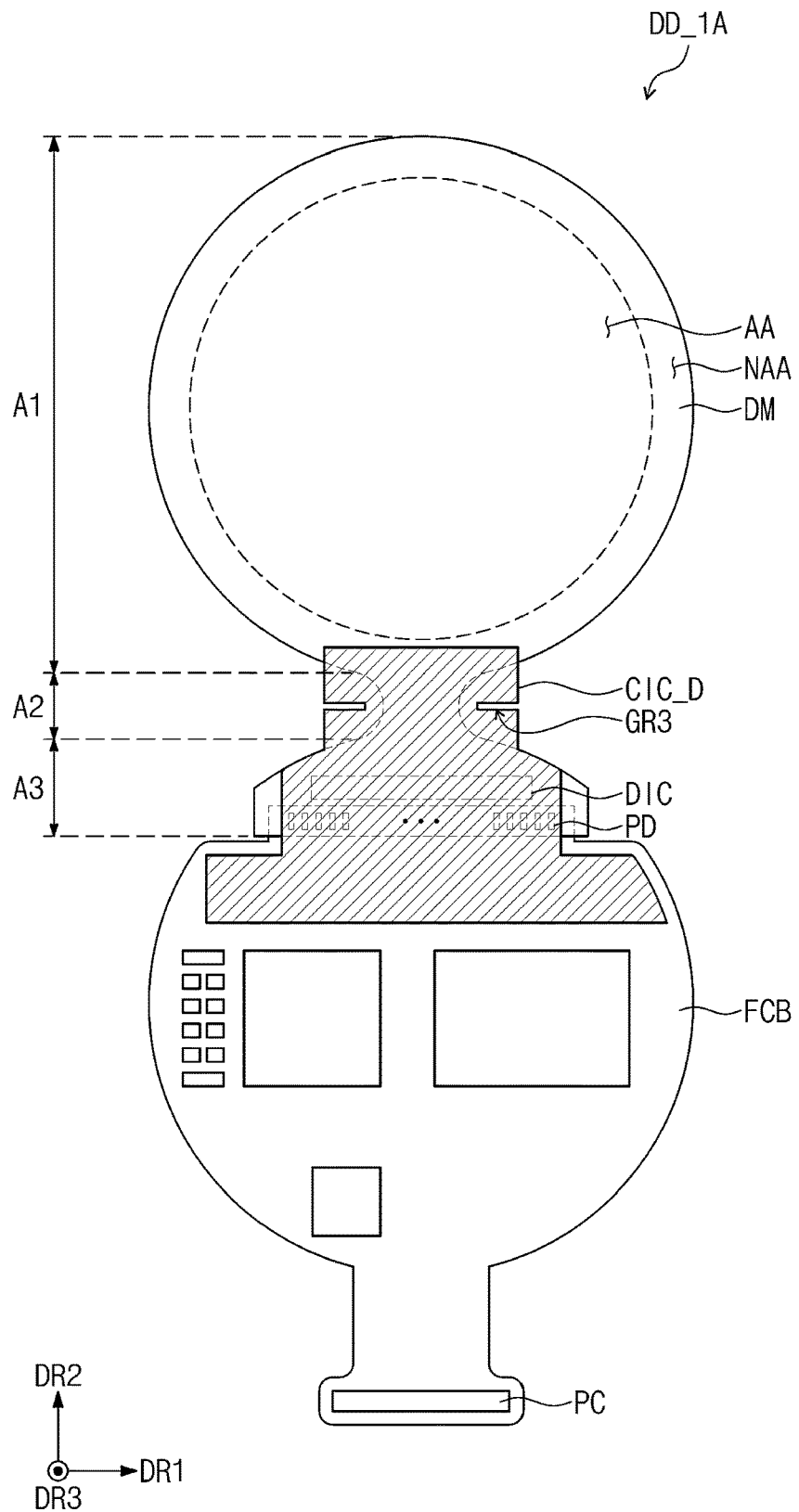
FIG. 10 is a plan view of an embodiment of some components of a display device according to the invention.

FIG. 10 is a plan view of an embodiment of some components of a display device according to the invention. FIG. 10 illustrates a plan view of the display module DM, the flexible circuit film FCB, and a cover film CIC_D of a display device DD_1A.

A cutoff groove GR3 may be defined in the cover film CIC_D illustrated in FIG. 10 by removing at least a portion of the cover film CIC_D. In an embodiment, the cutoff groove GR3 may be defined by removing a portion of the cover film CIC_D from one end of a portion of the cover film CIC_D, which is disposed not to overlap the display module DM in the first direction DR1.

In an embodiment, the cutoff groove GR3 may be spaced apart from the second area A2 of the display module DM in the first direction DR1 not to overlap the second area A2 of the display module DM.

FIG. 10 illustrates that one cutoff groove GR3 is defined at each of opposite ends of the cover film CIC_D. However, the number of cutoff grooves GR3 is not limited thereto, and two or more cutoff grooves GR3 may be defined. In an embodiment, the cutoff groove GR3 may include a plurality of slit patterns that is defined by cutting a portion of the cover film CIC_D, for example.

The cover film CIC_D may be bent at the same time when the second area A2 of the display module DM is bent, and when a tensile stress is caused around an upper surface of the cover film CIC_D that does not contact the display module DM during a bending process, a compression stress may be caused around a lower surface thereof. In the illustrated embodiment, flexibility may be enhanced by defining the cutoff groove GR3 in the area, in which the cover film CIC_D is bent, and the cover film CIC_D may be smoothly bent by reducing stresses caused by the tensile stress or the compression stress.

Figure 11:
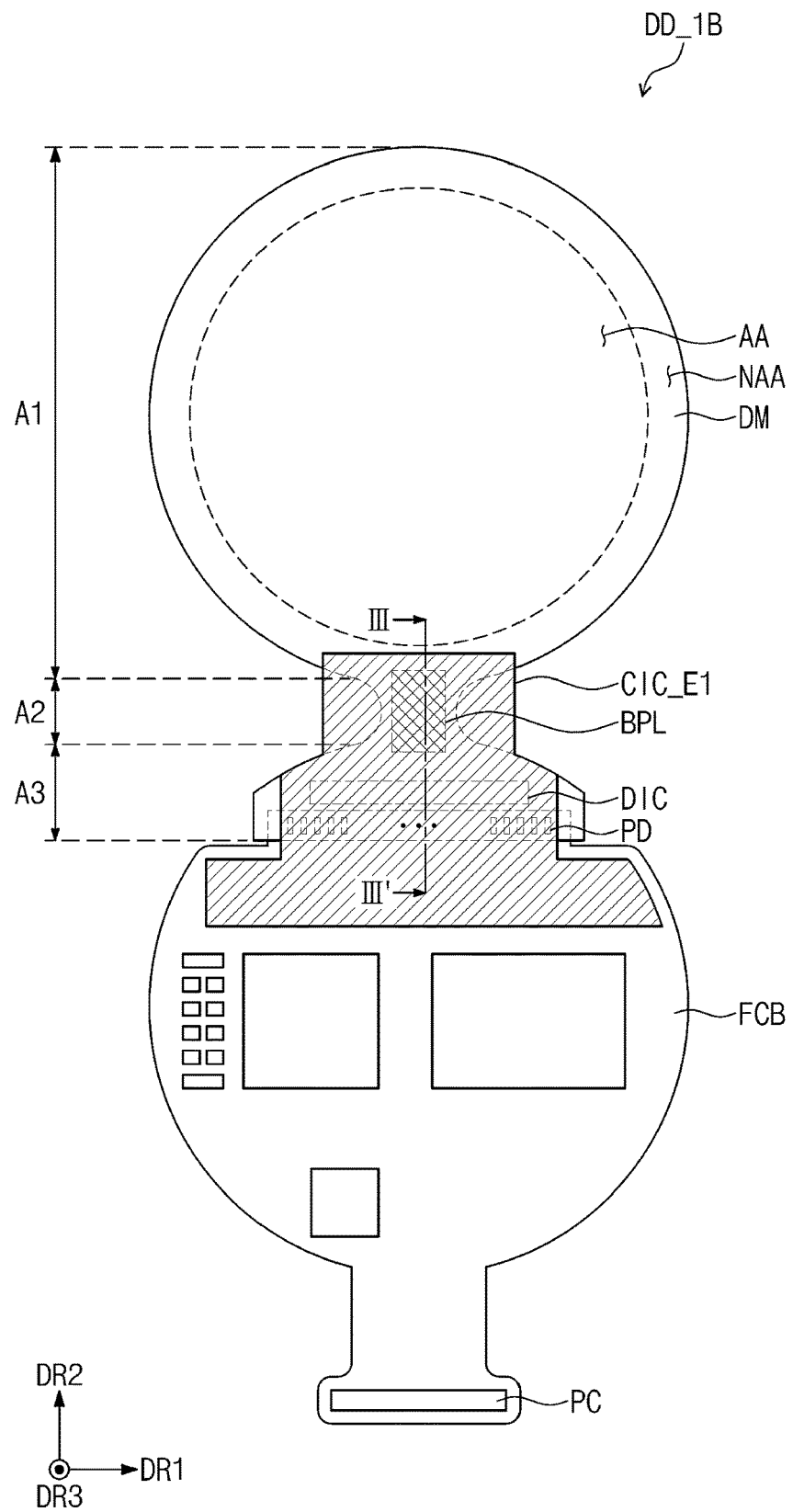
FIG. 11 is a plan view of an embodiment of some components of a display device according to the invention.
Figure 12A:
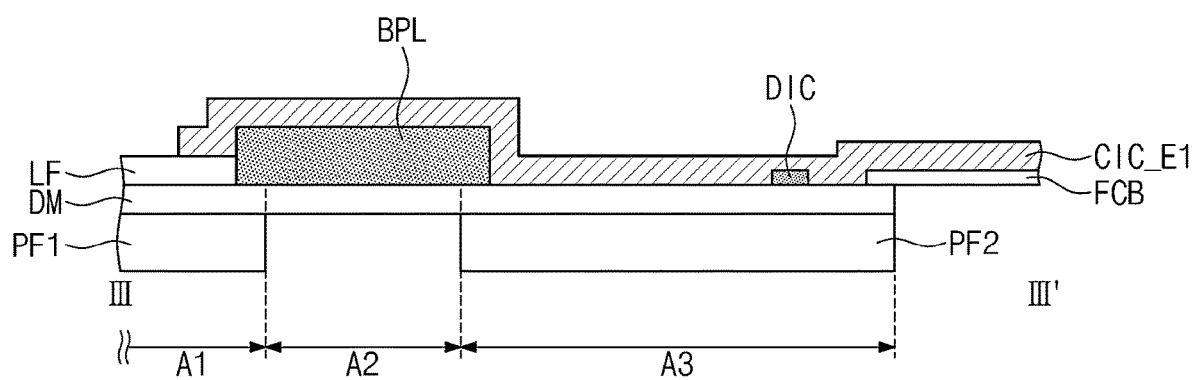
FIG. 12A is a cross-sectional view taken along cutting lie III-III' illustrated in FIG. 11.
Figure 12B:
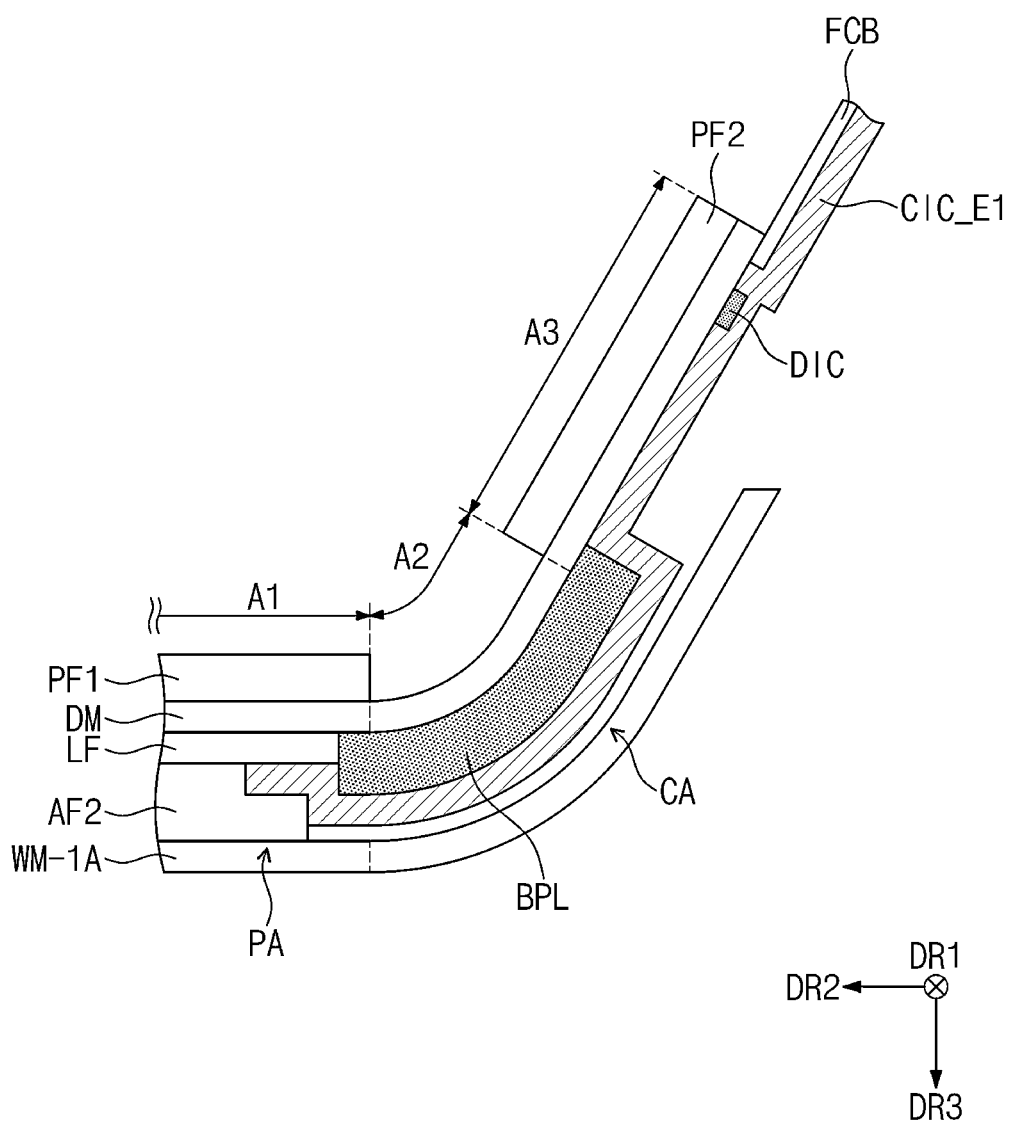
FIG. 12B is a cross-sectional view illustrating an embodiment of some components of a display device according to the invention.
Figure 13:
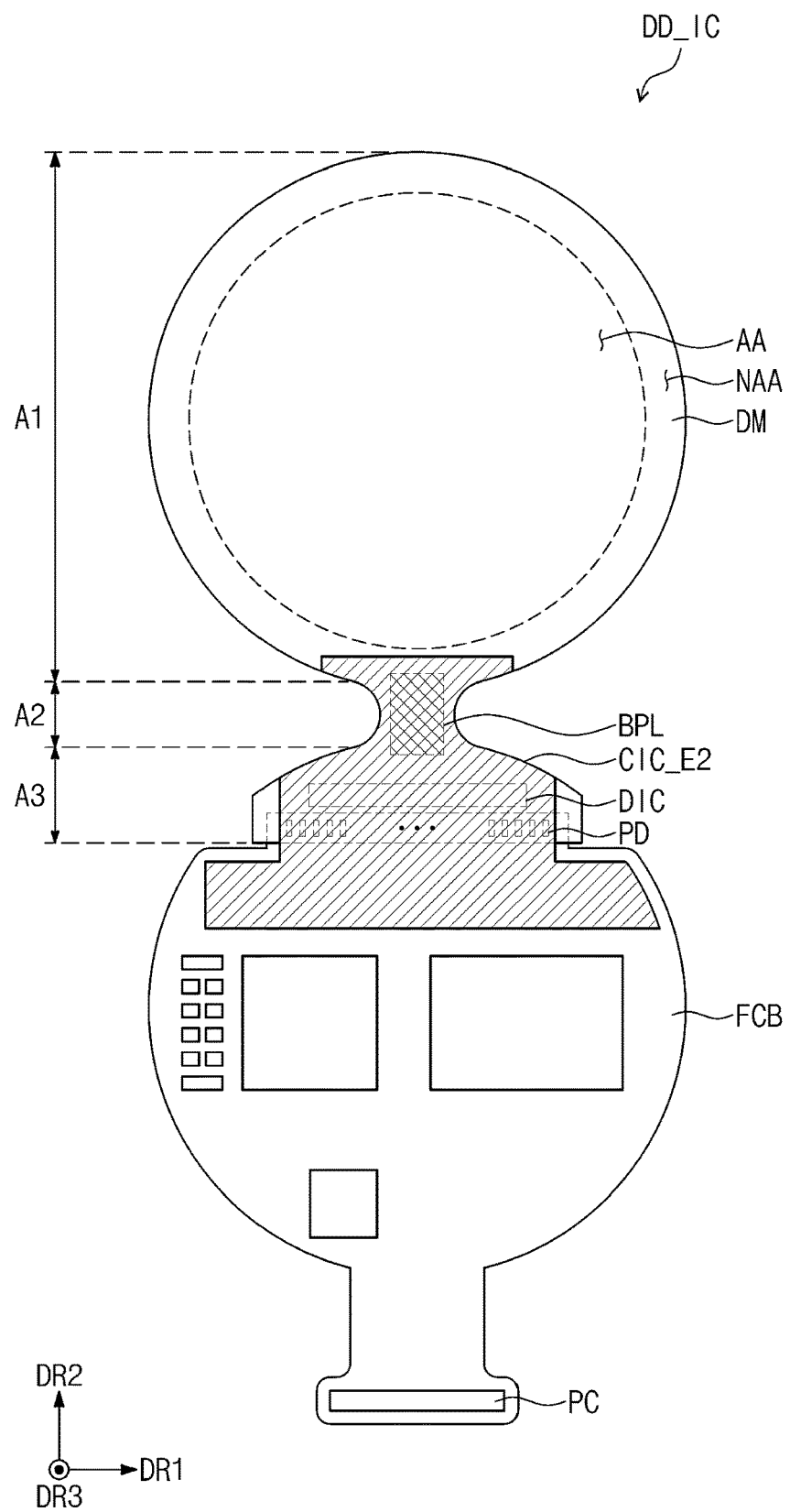
FIG. 13 is a plan view of some components of an embodiment of a display device according to the invention.

FIG. 11 is a plan view of an embodiment of some components of a display device according to the invention. FIG. 12A is a cross-sectional view taken along III-III' of FIG. 11. FIG. 12B is a cross-sectional view illustrating an embodiment of some components of a display device according to the invention. FIG. 13 is a plan view of an embodiment of some components of a display device according to the invention. FIGS. 11 and 13 illustrate plan views of the display modules DM, the flexible circuit films FCB, and the cover films CIC_E1 and CIC_E2 of the display devices DD_1B and DD_1C. The same or similar reference numerals are used for the configurations that are the same as or similar to the configurations described in FIGS. 7A to 9B, and a repeated description thereof will be omitted.

Referring to FIGS. 11 and 12A, the display device DD_1B in an embodiment may further include a bending protection layer BPL disposed between the display module DM and the cover film CIC_E1. The cover film CIC_E1 may be disposed on the bending protection layer BPL to cover the bending protection layer BPL.

The bending protection layer BPL may be disposed to overlap a portion of the first area A1, which is adjacent to the second area A2, and a portion of the third area A3, which is adjacent to the second area A2, as well as the second area A2 of the display module DM.

In an embodiment, a width of the bending protection layer BPL in the first direction DR1 may be smaller than or equal to a width of the second area A2. A width of the bending protection layer BPL in the second direction DR2 may be larger than a width of the second area A2 of the display module DM in the second direction DR2. Because a bonding force of the bending protection layer BPL with the display module DM in the illustrated embodiment may be higher than a bonding force of the bending protection layer BPL with the display module DM when the bending protection layer BPL is disposed to overlap only the second area A2, the bending protection layer BPL may be prevented from being lifted from the display module DM.

However, the invention is not limited thereto, and the bending protection layer BPL may be disposed to overlap only the second area A2 of the display module DM, and a width of the bending protection layer BPL in the second direction DR2 may be smaller than or equal to a width of the second area A2 of the display module DM.

In an embodiment, the bending protection layer BPL may include an organic material. The bending protection layer BPL may include an organic resin, e.g., an acrylic resin.

FIG. 12B illustrates a cross-sectional view after one process of coupling the display module DM to the window WM-1A in a state, in which the optical film LF, the cover film CIC_E1, the bending protection layer BPL, and the lower protection films PF1 and PF2 are attached to the display module DM, is performed. The cover film CIC_E1 and the bending protection layer BPL of FIG. 12B correspond to the cover film CIC_E1 and the bending protection layer BPL described in FIG. 12A.

Referring to FIG. 12B, the cover film CIC_E1 in the illustrated embodiment may be disposed on the second area A2 to cover the bending protection layer BPL. Accordingly, the second area A2 of the display module DM may be covered dually by the cover film CIC_E1 and the bending protection layer BPL.

In the illustrated embodiment, deflection of the third area A3 may be minimized as a support of the second area A2 that is bent along the curved part CA of the window WM-1A during the fabrication process is increased, and cracks that may be caused in the lines included in the display module DM may be minimized.

Referring to FIG. 13, the display device DD_1C in an embodiment may further include a bending protection layer BPL on the second area A2 of the display module DM, and the cover film CIC_E2 may be disposed on the bending protection layer BPL to cover the bending protection layer BPL. The same or similar reference numerals are used for the configurations that are the same as or similar to the configurations described in FIGS. 11 to 12B, and a repeated description thereof will be omitted.

The cover film CIC_E2 in an embodiment may have a shape that is the same as a shape of the second area A2 in a plan view at a portion that overlaps the second area A2. That is, in a plan view, a width of a part of the cover film CIC_E2, which overlaps the second area A2, in the first direction DR1 may be the same as a width of the second area A2 in the first direction DR1.

In the illustrated embodiment, as the second area A2 is dually covered by the bending protection layer BPL and the cover film CIC_E2, a support force that is strong enough to prevent defection of the third area A3, which may be caused as the second area A2 is bent during the fabrication process, may be provided even though a width of the cover film CIC_E2 that overlaps the second area A2 in the first direction DR1 is not larger than a width of the second area A2 in the first direction DR1.

FIG. 13 illustrates that the cover film CIC_E2 has the same shape as that of the second area A2, but the invention is not limited thereto. In an embodiment, a width of a part of the cover film CIC_E2, which overlaps the second area A2, in the first direction may be smaller than a width of the second area A2 in the first direction DR1. Furthermore, a portion of the cover film CIC_E2, which overlaps the second area A2, may have the same width as that of the second area A2 in the first direction DR1, and another portion thereof may have a width that is smaller than that of the second area A2 in the first direction DR1.

Figure 14:
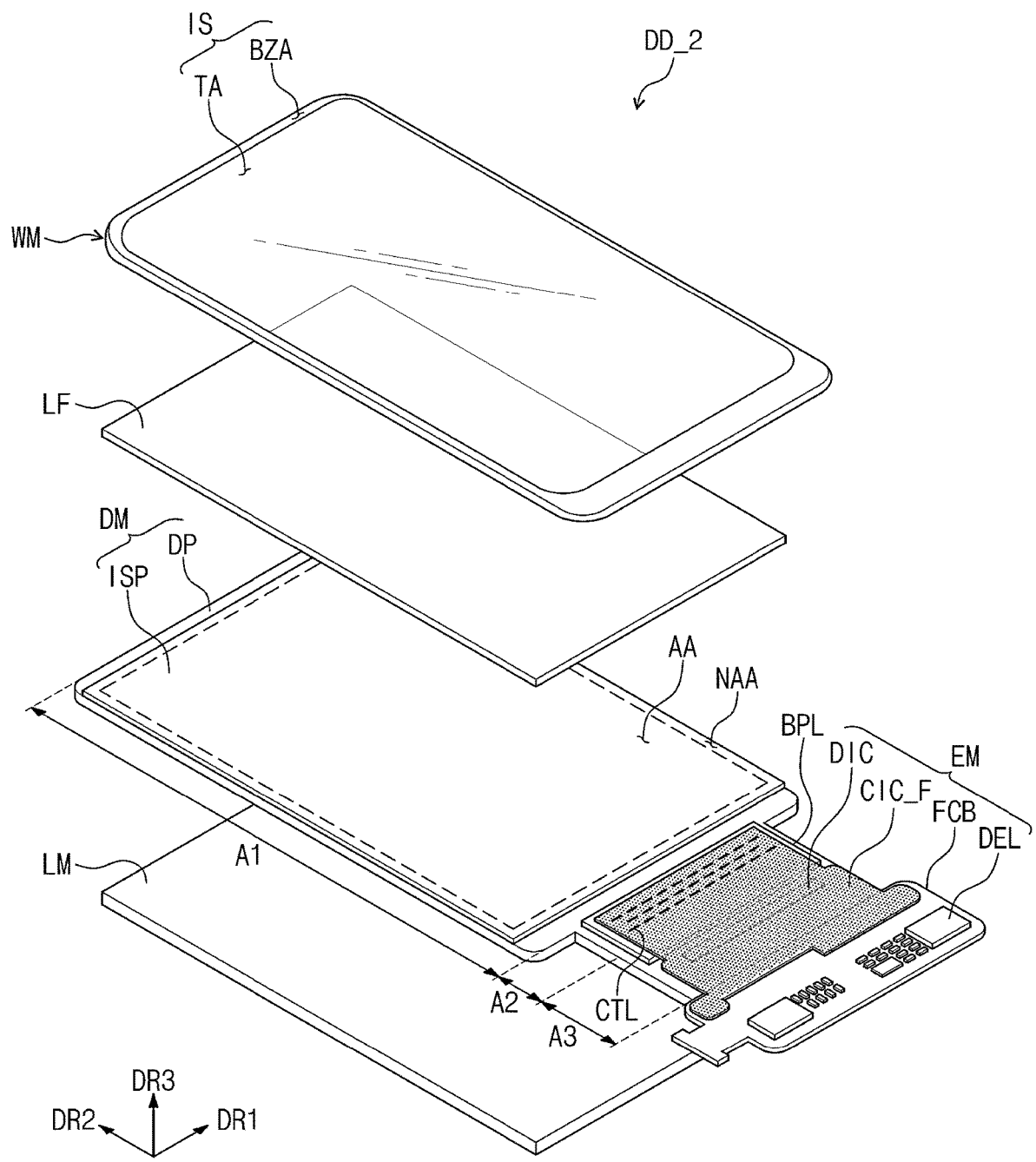
FIG. 14 is an exploded perspective view of an embodiment of a display device according to the invention.

FIG. 14 is an exploded perspective view of an embodiment of a display device according to the invention.

Referring to FIG. 14, a display device DD_2 may include the window WM, the display module DM, a driving module EM, the optical film LF, and a lower module LM. Among the elements illustrated in FIG. 14, the same elements as those illustrated in FIG. 1B will be denoted by the same reference numerals, and a detailed description thereof will be omitted.

The display device DD_2 may further include the bending protection layer BPL disposed on the second area A2 of the display module DM. The bending protection layer BPL may be further disposed on a portion of the first area A1 and a portion of the third area A3. The bending protection layer BPL may be bent together with the second area A2. The bending protection layer BPL protects the second area A2 from an external impact, and controls a neutral surface of the second area A2. The bending protection layer BPL controls stresses of the second area A2 such that the neutral surface becomes closer to the signal lines disposed in the second area A2.

The driving module EM may control driving of the display module DM. The driving module EM may include the flexible circuit film FCB, the driving chip DIC, and a cover film CIC_F. The flexible circuit film FCB may be electrically connected to the display panel DP. The flexible circuit film FCB may be coupled to an end of the third area A3 of the display module DM through a bonding process. The flexible circuit film FCB may be electrically connected to the display module DM through an anisotropic conductive adhesive layer. The driving chip DIC may be disposed (e.g., mounted) on the third area A3 of the display module DM. The driving chip DIC may include driving circuits for driving pixels of the display panel DP, e.g., a data driving circuit.

The driving module EM may further include a plurality of driving elements DEL disposed (e.g., mounted) on the flexible circuit film FCB. The plurality of driving elements DEL may include a circuit part for converting a signal input from an outside to a signal that is necessary for the driving chip DIC, or to a signal that is necessary for driving the display module DM. The flexible circuit film FCB may be disposed under the display module DM.

The cover film CIC_F is disposed in correspondence to the second area A2 and the third area A3 of the display module DM. The cover film CIC_F may cover the driving chip DIC disposed (e.g., mounted) on the display module DM and a portion of the flexible circuit film FCB. Furthermore, the cover film CIC_F may extend toward the second area A2 of the display module DM to cover the second area A2 of the display module DM. Accordingly, the cover film CIC_F may be bent together with the second area A2 of the display module DM. In an embodiment of the invention, the cover film CIC_F may be disposed on the bending protection layer BPL. The cover film CIC_F may protect the second area A2 of the display module DM together with the bending protection layer BPL. In an embodiment, a plurality of slits CTL may be defined in the cover film CIC_F in correspondence to the second area A2 of the display module DM.

The lower module LM is disposed on a rear surface of the display module DM. The lower module LM may be disposed on the rear surface of the display module DM to enhance an anti-impact property of the display device DD_2. The lower module LM may be fixed to the rear surface of the display module DM through an adhesive film. The adhesive film may be a PSA, an OCA, or an OCR. The third area A3 of the display module DM and the flexible circuit film FCB may be disposed on a rear surface of the lower module LM.

Figure 15A:
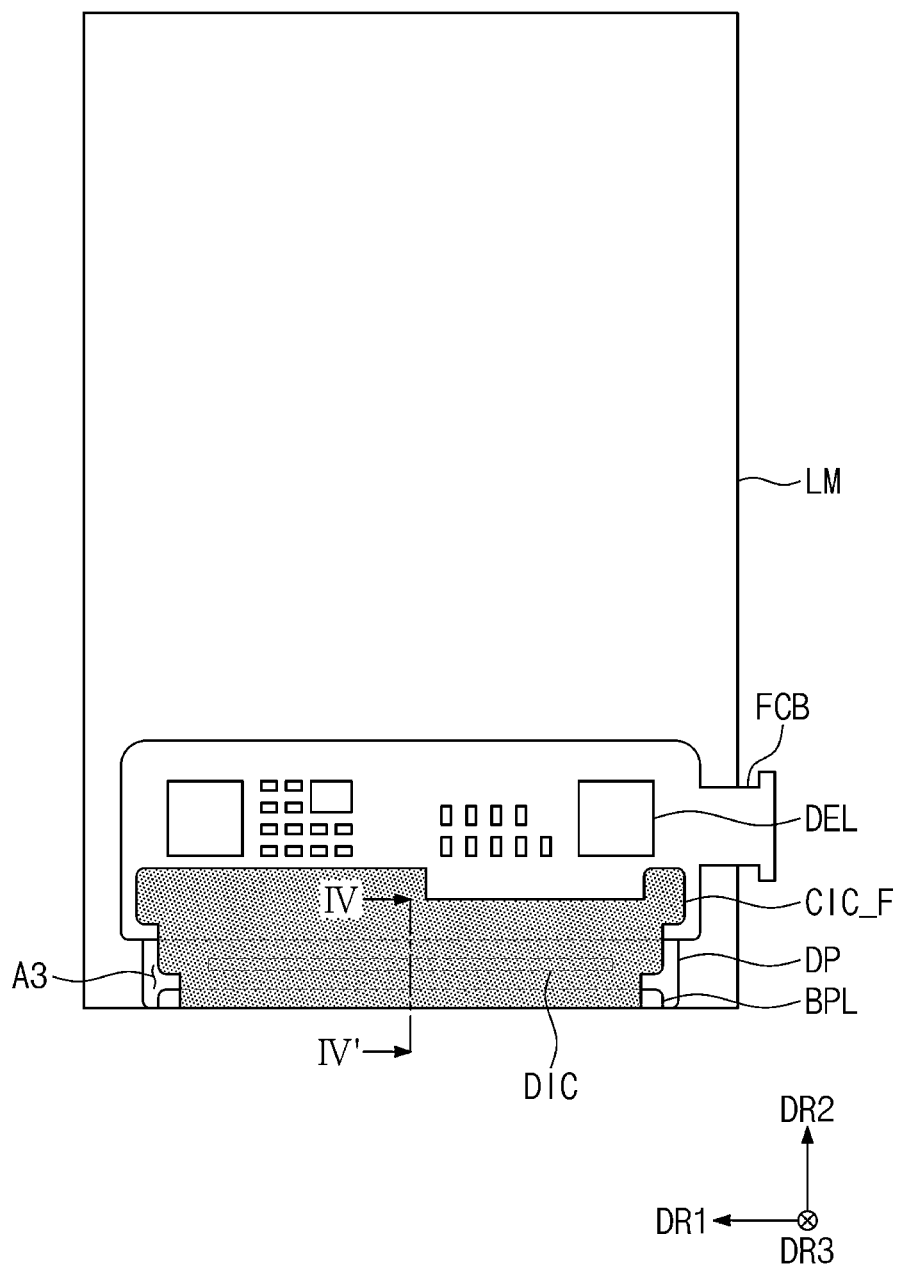
FIG. 15A is a rear view of an embodiment of a display device according to the invention.
Figure 15B:
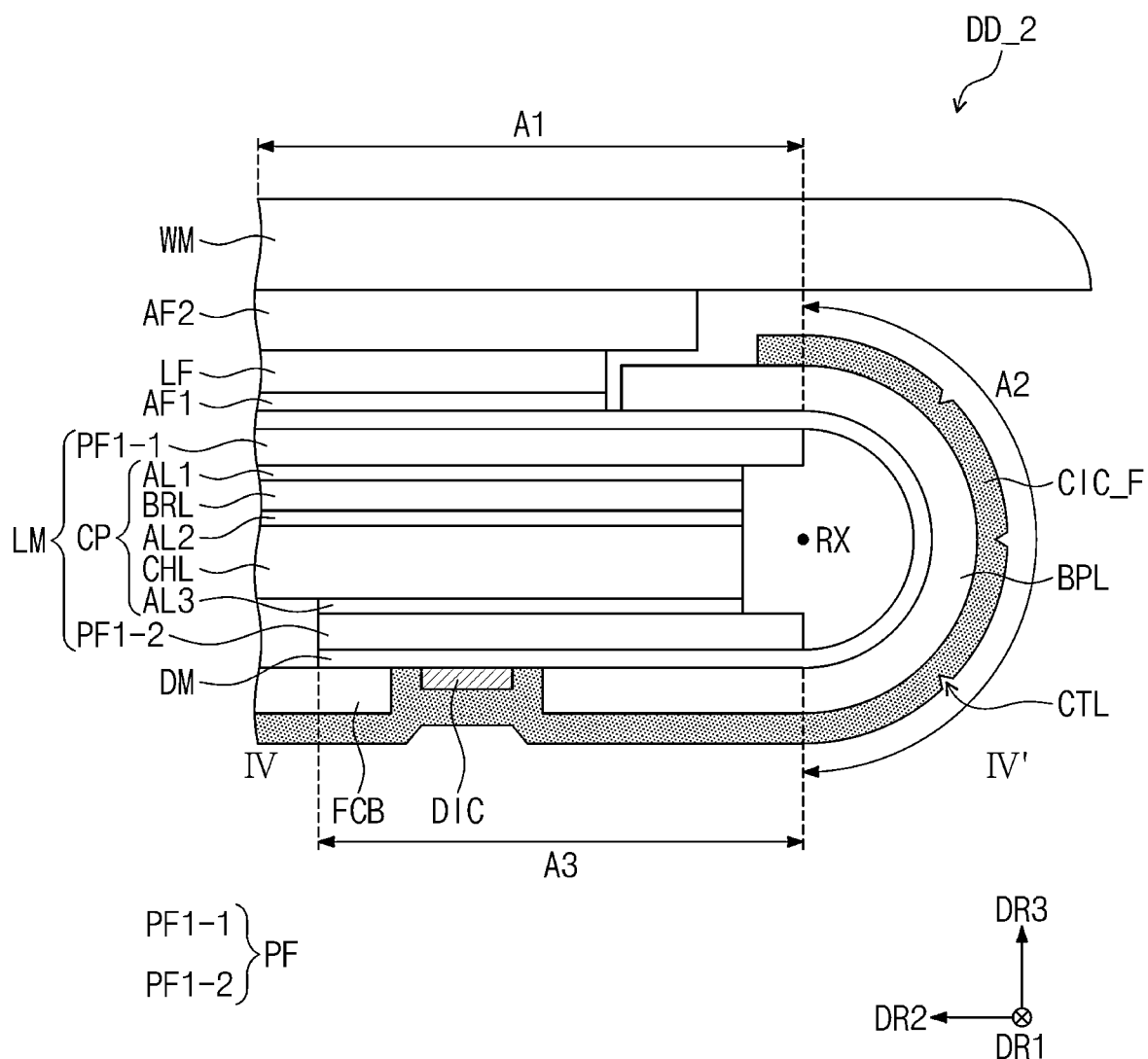
FIG. 15B is a cross-sectional view taken along cutting line IV-IV' illustrated in FIG. 15A.
Figure 15C:
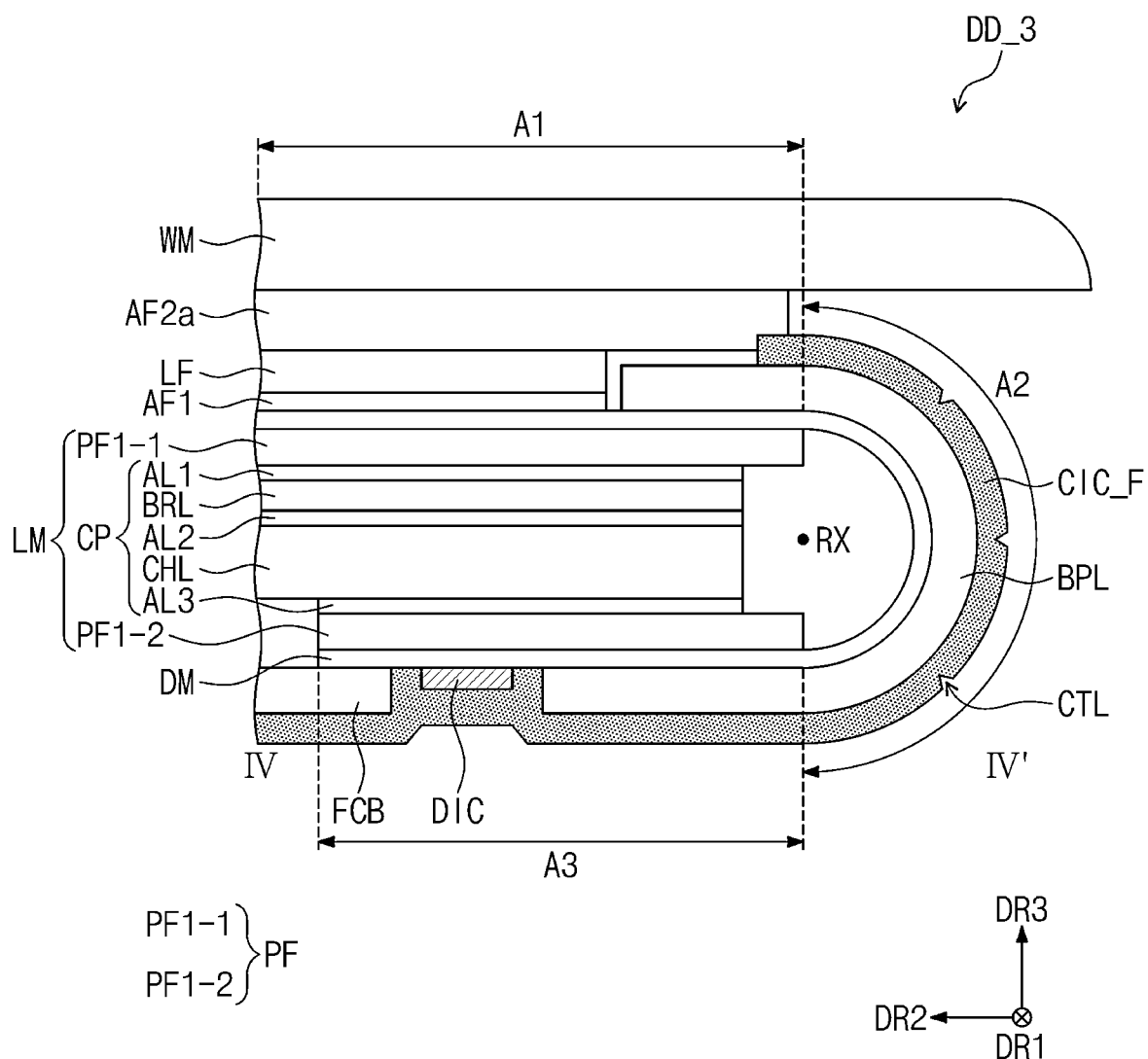
FIG. 15C is a cross-sectional view of an embodiment of a display device according to the invention.

FIG. 15A is a rear view of an embodiment of a display device according to the invention. FIG. 15B is a cross-sectional view taken along cutting line IV-IV illustrated in FIG. 15A. FIG. 15C is a cross-sectional view of an embodiment of a display device according to the invention.

Referring to FIGS. 14, 15A, and 15B, the second area A2 of the display module DM is bent with respect to the imaginary axis (also referred to as a bending axis) RX and is disposed on the rear surface of the lower module LM. The bending protection layer BPL is disposed on the second area A2 of the display module DM and is bent together with the second area A2. One end of the flexible circuit film FCB may be coupled to the third area A3 of the display module DM through a bonding process. The driving chip DIC may be disposed (e.g., mounted) on the third area A3 of the display module DM.

The cover film CIC_F may be coupled to the flexible circuit film FCB and the display module DM. In an embodiment, the cover film CIC_F may be fixed to the flexible circuit film FCB and the display module DM, through bonding. The cover film CIC_F may cover a portion of the flexible circuit film FCB, and may cover the driving chip DIC disposed (e.g., mounted) on the third area A3 of the display module DM. In an embodiment of the invention, the driving chip DIC may be covered by the cover film CIC_F as a whole. The plurality of driving elements DEL disposed (e.g., mounted) on the flexible circuit film FCB may be exposed while not being covered by the cover film CIC_F. The cover film CIC_F may extend to cover the second area A2 of the display module DM. The bending protection layer BPL may be disposed between the cover film CIC_F and the second area A2 of the display module DM. Accordingly, the cover film CIC_F may protect the second area A2 of the display module DM together with the bending protection layer BPL.

In another embodiment, when the bending protection layer BPL is omitted, the cover film CIC_F may directly cover the second area A2 of the display module DM. In this case, the second area A2 of the display module DM may be protected (or covered) by only the cover film CIC_F without the bending protection layer BPL.

The cover film CIC_F may overlap a portion of the first area A1. One end of the cover film CIC_F may extend to cover a portion of the first area A1. When one end of the cover film CIC_F is disposed in the second area A2, it may come over due to a tensile stress. However, when the one end of the cover film CIC_F is disposed in the first area A1 having a tensile stress that is lower than that of the second area A2, the lifting may be prevented.

A shape of the cover film CIC_F is not specifically limited. The cover film CIC_F may have various shapes as long as it has a size in a range that is large enough to cover a portion of the flexible circuit film FCB, the driving chip DIC, and the second area A2 of the display module DM.

The cover film CIC_F may have a predetermined thickness. When the thickness of the cover film CIC_F excessively decreases, a performance of protecting the second area A2 of the display module DM may be decreased. When the thickness of the cover film CIC_F excessively increases, a phenomenon, in which the cover film CIC_F is lifted from the second area A2 of the display module DM, may occur. Accordingly, the cover film CIC_F may have various thicknesses in a range, in which the lifting may be prevented while the protection performance is improved.

The plurality of slits CTL may be defined in the cover film CIC_F in correspondence to the second area A2 of the display module DM. The plurality of slits CTL may be cutoff grooves that are defined by cutting the cover film CIC_F. The plurality of slits CTL may overlap the second area A2 of the display module DM.

In an embodiment, the second area A2 of the display module DM may be bent with respect to the bending axis RX, and the plurality of the slits CTL may have a shape that extends in a direction that is parallel to the bending axis RX. In an embodiment of the invention, the bending axis RX may extend in the first direction DR1 and the plurality of slits CTL may have a shape that extends in parallel to the first direction DR1. The driving chip DIC also may have a shape that extends along the first direction DR1.

The plurality of slits CTL may be arranged to be spaced apart from each other in the first direction DR1 and the second direction DR2 that crosses the first direction DR1. The plurality of slits CTL may be defined in parallel to each other in the first direction DR1, and may be disposed in a zigzag form in the second direction DR2.

Because the plurality of slits CTL is widened when the cover film CIC_F is bent together with the second area A2 of the display module DM, a tensile stress that is caused in the cover film CIC_F in correspondence to the second area A2 of the display module DM may be reduced. Accordingly, the stresses delivered to the second area A2 of the display module DM coupled to the cover film CIC_F may be reduced, and as a result, the stresses applied to the lines disposed in the second area A2 of the display module DM may be reduced.

The cover film CIC_F may interrupt noise generated around the flexible circuit film FCB and the driving chip DIC, and may protect the flexible circuit film FCB and the driving chip DIC from a danger such as an impact provided from the outside. When the cover film CIC_F extends to the second area A2 of the display module DM to cover the second area A2 of the display module DM, the second area A2 of the display module DM may be protected from the outside. Furthermore, a process of coupling a separate protection member for protecting the second area A2 of the display module DM and the display module DM may be omitted, and the electronic device ED (refer to FIG. 1A) having reduced costs through the simplified process may be provided. Furthermore, the invention may provide the electronic device ED having an improved reliability by supplementing a strength of the second area A2 of the display module DM to prevent cracks of the lines disposed in the second area A2.

Referring back to FIG. 15A, the display device DD_2 may include the lower module LM disposed under the display module DM. The lower module LM may include a lower protection film PF and a cover panel CP. The cover panel CP may include a barrier layer BRL and a cushion layer CHL. The lower protection film PF may be disposed under the display module DM to protect the display module DM. The lower protection film PF may include polyethylene terephthalate. The lower protection film PF may include a first protection film PF1-1 that protects the first area A1 of the display module DM, and a second protection film PF1-2 that protects the third area A3 of the display module DM. Because the lower protection film PF is not disposed in the second area A2 of the display module DM, the second area A2 of the display module DM may be smoothly bent.

The barrier layer BRL may be disposed under the lower protection film PF. The barrier layer BRL may increase a resistant force to a compression force due to external pressing. Accordingly, the barrier layer BRL may function to prevent deformation of the display module DM. The barrier layer BRL may include a flexible plastic material such as polyimide or polyethylene terephthalate. Furthermore, the barrier layer BRL may be a colored film having a low light transmittance. The barrier layer BRL may absorb light that is input from the outside. In an embodiment, the barrier layer BRL may be a black-colored synthetic resin film, for example. When the display device DD_2 is viewed from an upper side of the window WM, the elements disposed under the barrier layer BRL may not be recognized by the user.

The cover panel CP further includes a first lower adhesive layer AL1 disposed between the first protection film PF1-1 and the barrier layer BRL to couple the first protection film PF1-1 and the barrier layer BRL, and a second lower adhesive layer AL2 disposed between the cushion layer CHL and the barrier layer BRL to couple the cushion layer CHL and the barrier layer BRL. The second protection film PF1-2 may be coupled to a rear surface of the cushion layer CHL by a third adhesive layer AL3.

The cushion layer CHL may protect the display module DM from an impact delivered from a lower side of the electronic device ED. That is, anti-impact characteristics of the electronic device ED may be improved by the cushion layer CHL.

A layer (e.g., a heat dissipating layer or the like) for another function, in addition to an impact absorbing function or a protection function, may be added to the cover panel CP.

The window WM is disposed on the display module DM. The optical film LF may be disposed between the window WM and the display module DM. The optical film LF and the display module DM may be coupled to each other by the first adhesive film AF1, and the window WM and the optical film LF may be coupled to each other by the second adhesive film AF2. In an embodiment of the invention, the optical film LF may not overlap the bending protection layer BPL and the cover film CIC_F. That is, the optical film LF may be spaced apart from one end of the bending protection layer BPL and one end of the cover film CIC_F in the second direction DR2.

An end of the window WM may extend further to the outside than the cover film CIC_F that covers the second area A2 of the display module DM. In an embodiment, the second adhesive film AF2 may not overlap the cover film CIC_F.

Referring to FIG. 15C, in a display device DD_3, a second adhesive film AF2a is disposed between the window WM and the optical film LF to couple the window WM and the optical film LF. The second adhesive film AF2a may overlap the cover film CIC_F. In this case, an end of the cover film CIC_F may extend to the second area A2 of the display module DM. The cover film CIC_F may be coupled to the window WM by the second adhesive film AF2a. Accordingly, because the cover film CIC_F is fixed by the second adhesive film AF2a, the cover film CIC_F may be prevented or restrained from being lifted from the second area A2 of the display module DM or the bending protection layer BPL.

Figure 16A:
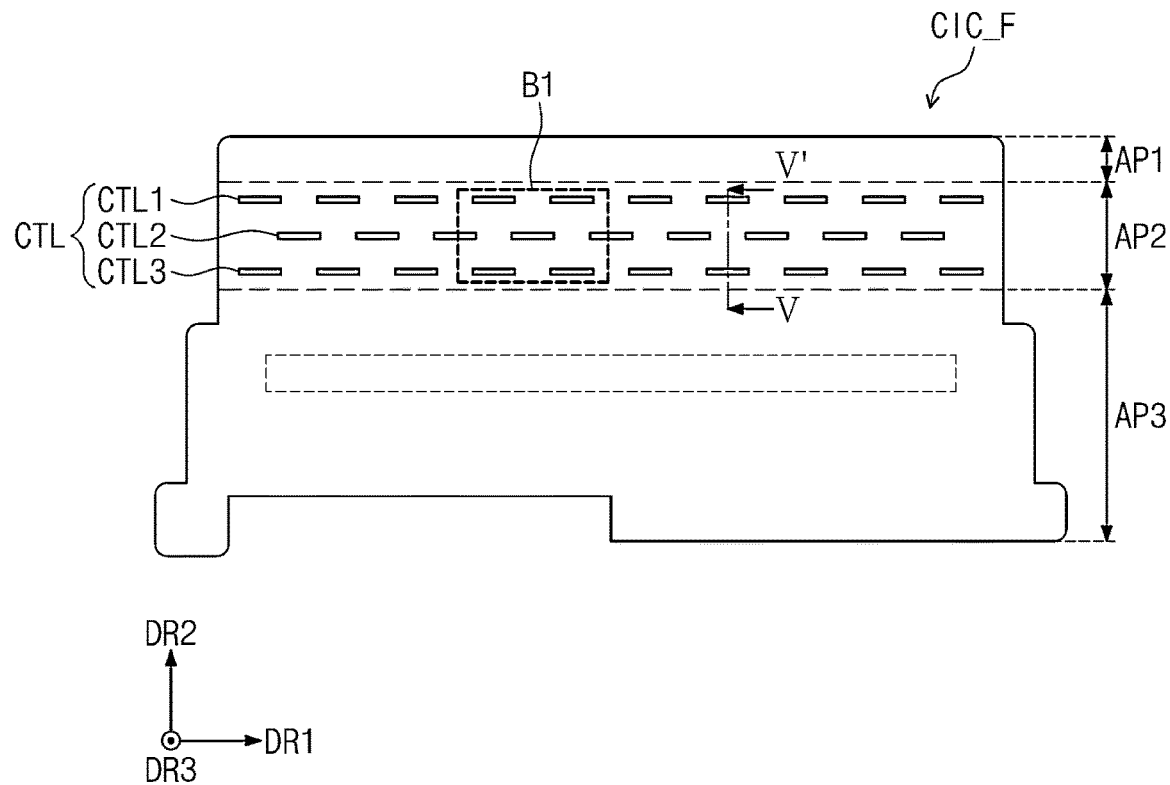
FIG. 16A is a plan view of a cover film illustrated in FIG. 14.
Figure 16B:
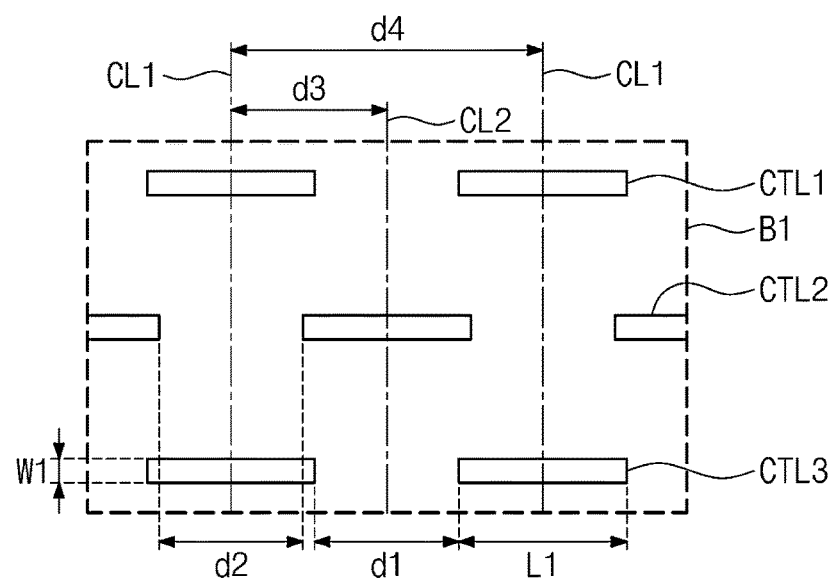
FIG. 16B is an enlarged view of an area illustrated in FIG. 16A.

FIG. 16A is a plan view of the cover film illustrated in FIG. 14, and FIG. 16B is an enlarged view of one area B1 illustrated in FIG. 16A.

Referring to FIGS. 15A, 16A, and 16B, the cover film CIC_F includes first to third parts AP1, AP2, and AP3 that are sequentially arranged in the second direction DR2. The first part AP1 corresponds to the first area A1 of the display module DM, the second part AP2 corresponds to the second area A2 of the display module DM, and the third part AP3 corresponds to the third area A3 of the display module DM and a portion of the flexible circuit film FCB. The first part AP1 may cover a portion of the first area A1 of the display module DM, the second part AP2 may cover the second area A2 of the display module DM, and the third part AP3 may cover a portion of the flexible circuit film FCB and the driving chip DIC. The first part AP1 may be omitted from the cover film CIC_F.

The plurality of slits CTL may be defined in the second part AP2 of the cover film CIC_F. In an embodiment, the plurality of slits CTL may include a plurality of first slits CTL1 disposed in a first row that is parallel to the first direction DR1, a plurality of second slits CTL2 disposed in a second row that is adjacent to the first row, and a plurality of third slits CTL3 disposed in a third row that is adjacent to the second row. The plurality of first slits CTL1 may be adjacent to the plurality of second slits CTL2 in the second direction DR2, and the plurality of second slits CTL2 may be adjacent to the plurality of first to third slits CTL1 and CTL3 in the second direction DR2.

The plurality of first to third slits CTL1, CTL2, and CTL3 may have a shape that extends along the first direction DR1. The plurality of first to third slits CTL1, CTL2, and CTL3 may have the same width W1 in the second direction DR2. In an embodiment of the invention, the width W1 may be approximately 0.15 millimeter (mm), but the invention is not limited thereto. The width W1 may be differently set according to a material and a modulus of the cover film CIC_F.

Two adjacent first slits of the plurality of first slits CTL1 may be spaced apart from each other by a first interval d1 in the first direction DR1. The plurality of first slits CTL1 may have the same length L1 in the first direction DR1. In an embodiment, the first interval d1 may be the same as the length L1. However, the invention is not limited thereto. The first interval d1 may be smaller than the length L1.

Two adjacent second slits of the plurality of second slits CTL2 may be spaced apart from each other by a second interval d2 in the first direction DR1. In an embodiment of the invention, the second interval d2 may be the same as the first interval d1. The plurality of second slits CTL2 may have the same length L1 in the first direction DR1. In an embodiment, the first and second intervals d1 and d2 may be the same as the length L1.

In an embodiment of the invention, the first interval d1, the second interval d2, and the length L1 may be approximately 2.5 mm, but the value is not limited thereto. The first interval d1, the second interval d2, and the length L1 may be set differently according to the material and the modulus of the cover film CIC_F.

The plurality of first slits CTL1 and the plurality of third slits CTL3 are disposed in the same column (e.g., an odd-numbered column) of the plurality of columns that are parallel to the second direction DR2, and the plurality of second slits CTL2 is disposed in a column that is different from that of the plurality of first slits CTL1 and the plurality of third slits CTL3. However, the disposition structure of the plurality of slits is not limited thereto. In an embodiment, the plurality of first to third slits CTL1, CTL2, and CTL3 may be disposed in the same column, for example.

In an embodiment, first center lines CL1 that pass through the centers of the plurality of first and third slits CTL1 and CTL3 in parallel to the second direction DR2 are spaced apart, in the first direction, from second center lines CL2 that pass through the centers of the plurality of second slits CTL2 in parallel to the second direction DR2. The first interval d1 may be smaller than or equal to an interval d3 between the first and second center lines CL1 and CL2 that are adjacent to each other. Furthermore, an interval d4 between two adjacent first center lines CL1 may be about twice as long as the interval d3 between the adjacent first and second center lines CL1 and CL2.

As the first interval d1 decreases and the length L2 increases, a tensile stress caused in the second part AP2 of the cover film CIC_F may decrease.

FIGS. 16A and 16B illustrate a structure, in which the plurality of slits CTL is defined in three rows, but the invention is not limited thereto. In an embodiment, the plurality of slits CTL may be defined in four rows or five rows, for example.

Figure 17A:
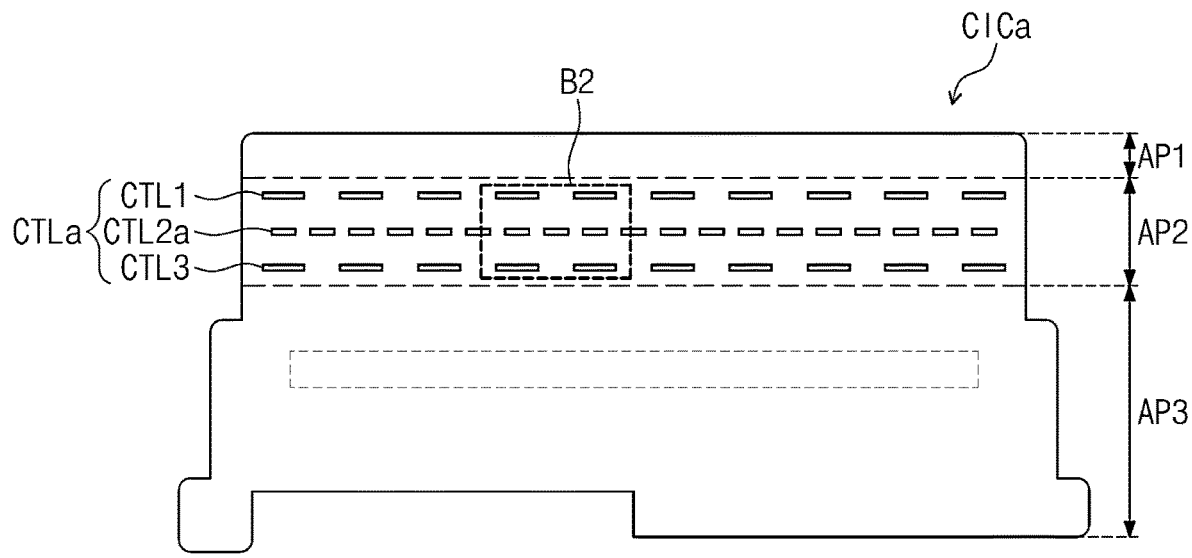
FIG. 17A is a plan view of an embodiment of a cover film according to the invention.
Figure 17B:
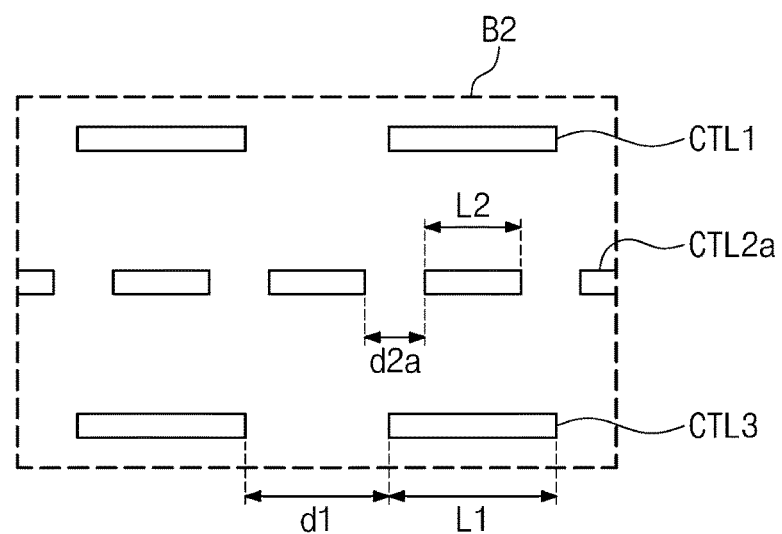
FIG. 17B is an enlarged view of an area illustrated in FIG. 17A.

FIG. 17A is a plan view of an embodiment of a cover film according to the invention, and FIG. 17B is an enlarged view of one area B2 illustrated in FIG. 17A. Among the elements illustrated in FIGS. 17A and 17B, the same elements as the elements illustrated in FIGS. 16A and 16B will be denoted by the same reference numerals, and a detailed description thereof will be omitted.

Referring to FIGS. 17A and 17B, a plurality of slits CTLa may be defined in the second part AP2 of a cover film CICa. In an embodiment, the plurality of slits CTLa may include a plurality of first slits CTL1 disposed in a first row that is parallel to the first direction DR1, a plurality of second slits CTL2a disposed in a second row that is adjacent to the first row, and a plurality of third slits CTL3 disposed in a third row that is adjacent to the second row. The plurality of first slits CTL1 may be adjacent to the plurality of second slits CTL2a in the second direction DR2, and the plurality of second slits CTL2a may be adjacent to the plurality of first and third slits CTL1 and CTL3 in the second direction DR2.

The number of the plurality of first slits CTL1 defined in the first row and the number of the plurality of second slits CTL2a defined in the second row may be different. In an embodiment, the number of the plurality of second slits CTL2a may be larger than the number of the plurality of first slits CTL1.

Two adjacent first slits of the plurality of first slits CTL1 may be spaced apart from each other at the first interval d1 in the first direction DR1, and two adjacent second slits of the plurality of second slits CTL2a may be spaced apart from each other at a second interval d2a in the first direction DR1. In an embodiment of the invention, the second interval d2a may be different from the first interval d1. In an embodiment, the second interval d2a may be smaller than the first interval d1, for example.

The plurality of first slits CTL1 may have the first length L1 in the first direction DR1, and the plurality of second slits CTL2a may have the second length L2 in the first direction DR1. In an embodiment of the invention, the second length L2 may be smaller than or equal to the first length L1.

The cover film CICa illustrated in FIG. 17A may have a decreased tensile stress at the center of the second part AP2 as compared with the cover film CIC illustrated in FIG. 16A. That is, because the plurality of second slits CTL2a may be more densely defined at the center of the second part AP2, a tensile stress applied to the center of the second part AP2 may be further alleviated by the plurality of second slits CTL2a.

Figure 18A:
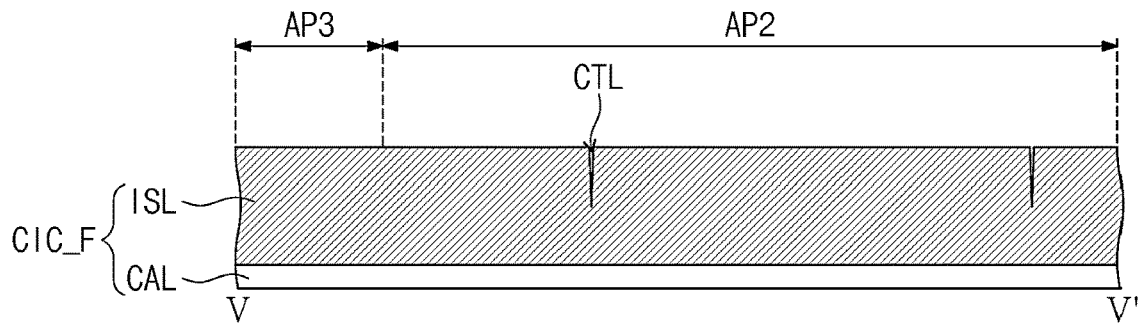
FIG. 18A is a cross-sectional view taken along cutting line V-V' illustrated in FIG. 16A.
Figure 18A:
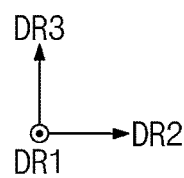

FIG. 18A is a cross-sectional view taken along cutting line V-V' illustrated in FIG. 16A. FIGS. 18B to 18E are cross-sectional views of embodiments of cover films according to the invention.

Referring to FIGS. 15A, 16A, and 18A, the cover film CIC_F may include a cover insulating layer ISL.

The cover insulating layer ISL may be disposed on the flexible circuit film FCB. In an embodiment, the cover insulating layer ISL may include an insulating material. In an embodiment, the cover insulating layer ISL may include a polymeric material, or a mesh fabric. In another embodiment, the cover layer ISL may include a flexible metallic material, for example. The polymeric material may include any one of PET and foam. The mesh fabric may have a modulus that is higher than that of the polymeric material. The polymeric material and the metallic material may enhance an anti-impact property and a protection function of the cover film CIC_F, and the mesh fabric may relatively reduce the tensile stress of the cover film CIC_F as compared with the polymeric material and the metallic material. Accordingly, a content of the materials included in the cover insulating layer ISL may be adjusted in consideration of the characteristics of the cover film CIC_F.

The cover film CIC_F further includes a cover adhesive layer CAL. The cover adhesive layer CAL may be disposed between the cover insulating layer ISL and the display module DM to couple the cover insulating layer ISL to the display module DM or the bending protection layer BPL. The cover adhesive layer CAL may include an insulating adhesive. However, the invention is not limited thereto, and the cover adhesive layer CAL may be omitted when the cover insulating layer ISL includes an adhesive insulation material.

The cover film CIC_F may include a third part AP3 corresponding to the third area A3 of the display module DM, and a second part AP2 corresponding to the second area A2 of the display module DM. In an embodiment, the third part AP3 and the second part AP2 may have the same thickness.

The plurality of slits CTL may be defined in the second part AP2 of the cover film CIC_F. The plurality of slits CTL may be cutoff grooves that are defined by partially cutting the cover insulating layer ISL.

Figure 18B:
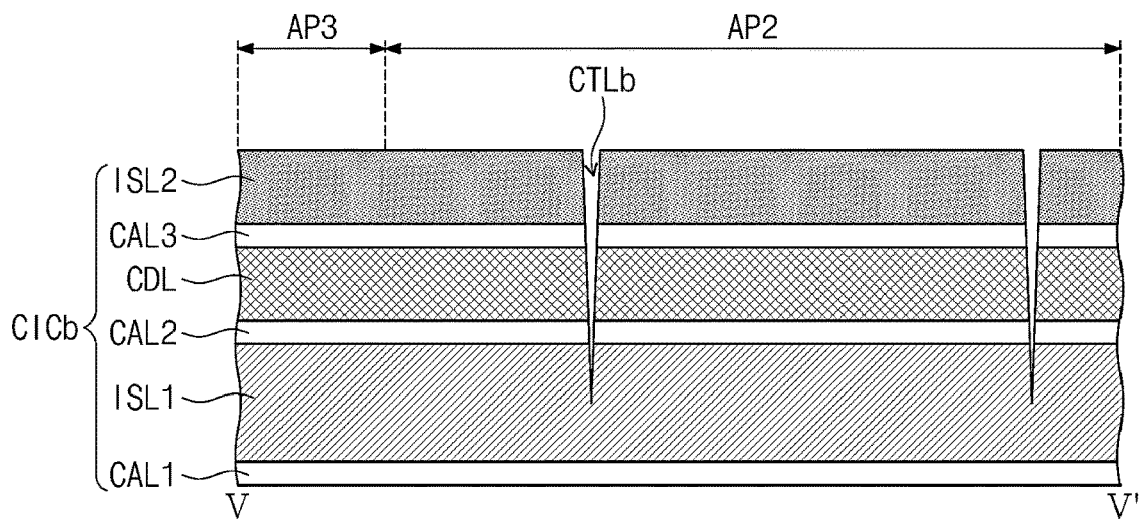
FIGS. 18B to 18E are cross-sectional views of embodiments of cover films according to the invention.
Figure 18B:
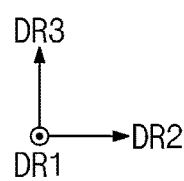

Referring to FIGS. 15A, 16A, and 18B, a cover film CICb may include the first cover insulating layer ISL1, the intermediate layer CDL, and the second cover insulating layer ISL2.

The first cover insulating layer ISL1 may be disposed on the display module DM. In an embodiment, the first cover insulating layer ISL1 may include an insulating material. In an embodiment, the first cover insulating layer ISL1 may include a polymeric material, or a mesh fabric. In another embodiment, the first cover insulating layer ISL1 may include a flexible metallic material, for example. The polymeric material may include any one of PET and foam. The mesh fabric may have a modulus that is higher than that of the polymeric material. The polymeric material and the metallic material may enhance an anti-impact property and a protection function of the cover film CICb, and the mesh fabric may relatively reduce the tensile stress of the cover film CICb as compared with the polymeric material and the metallic material. Accordingly, a content of the materials included in the first cover insulating layer ISL1 may be adjusted in consideration of the characteristics of the cover film CICb.

The cover film CICb further includes the first cover adhesive layer CAL1. The first cover adhesive layer CAL1 may be disposed between the first cover insulating layer ISL1 and the display module DM to couple the first cover insulating layer ISL1 to the display module DM or the bending protection layer BPL. The cover adhesive layer CAL1 may include an insulating adhesive. However, the invention is not limited thereto, and the cover adhesive layer CAL may be omitted when the first cover insulating layer ISL1 includes the bonding insulation material.

The intermediate layer CDL may be disposed on the first cover insulating layer ISL1. The intermediate layer CDL may include a conductive material. In an embodiment, the intermediate layer CDL may include any one of a metallic material and a conductive fiber, for example. The conductive fiber in an embodiment may include non-woven fabric. In an embodiment of the invention, the intermediate layer CDL may be electrically grounded. The intermediate layer CDL may be disposed between the first cover insulating layer ISL1 and the second cover adhesive layer CAL2 to shield static electricity. Accordingly, the cover film CICb may prevent the display module DM, the flexible circuit film FCB, and the driving chip DIC from being damaged by external static electricity.

The intermediate layer CDL and the first cover insulating layer ISL1 may be coupled to each other by the second cover adhesive layer CAL2. The second cover adhesive layer CAL2 may include an insulating adhesive material or a conductive adhesive material. In an embodiment, the second cover adhesive layer CAL2 may be a film that is formed or provided by dispersing metal particles in a synthetic resin, for example. In an embodiment, the metal particles may include gold, silver, platinum, nickel, copper, and carbon. In an embodiment, the synthetic resin may include a material such as epoxy, silicon, polyimide, or polyurethane.

The second cover insulating layer ISL2 may be disposed on the intermediate layer CDL. The second cover insulating layer ISL2 and the intermediate layer CDL may be coupled to each other by the third cover adhesive layer CAL3.

The second cover insulating layer ISL2 may include an insulating material. The second cover insulating layer ISL2 may include a polymeric material or a mesh fabric. In an embodiment, the polymeric material may include PET, for example. In an embodiment, the second cover insulating layer ISL2 may have a black color, and may function as a shield.

The cover film CICb may include a third part AP3 corresponding to the third area A3 of the display module DM, and a second part AP2 corresponding to the second area A2 of the display module DM. In an embodiment, the third part AP3 and the second part AP2 may have the same thickness.

A plurality of slits CTLb may be defined in the second part AP2 of the cover film CICb. The plurality of slits CTLb may be cutoff grooves that are defined by partially cutting the first and second cover insulating layers ISL1 and ISL2, the intermediate layer CDL, and the second and third adhesive layers CAL2 and CAL3.

Figure 18C:
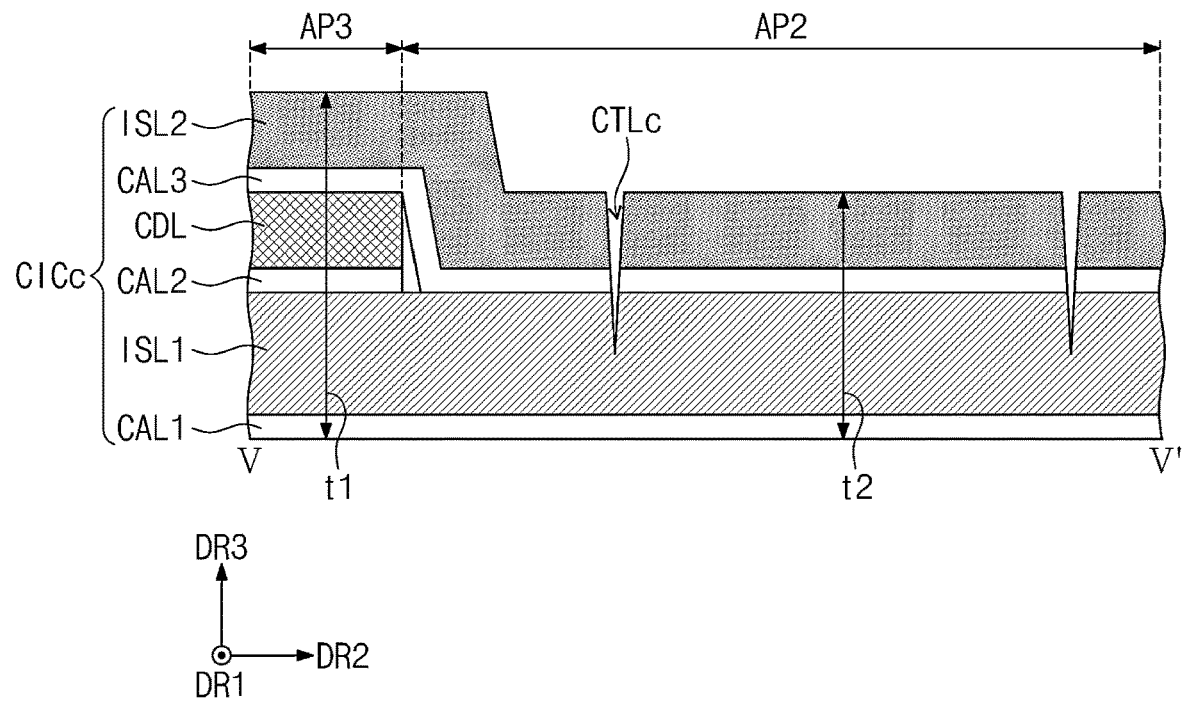

Referring to FIG. 18C, the second part AP2 of a cover film CICc may have a thickness that is smaller than that of the third part AP3. In detail, the intermediate layer CDL and the second cover adhesive layer CAL2 may be omitted from the second part AP2 of the cover film CICc. In this case, the third part AP3 of the cover film CICc may have a first thickness t1, and the second part AP2 of the cover film CICc may have a second thickness t2 that is smaller than the first thickness t1.

A plurality of slits CTLc may be defined in the second part AP2 of the cover film CICc. The plurality of slits CTLc may be cutoff grooves that are defined by partially cutting the first and second cover insulating layers ISL1 and ISL2, and the third cover adhesive layer CAL3.

Figure 18D:
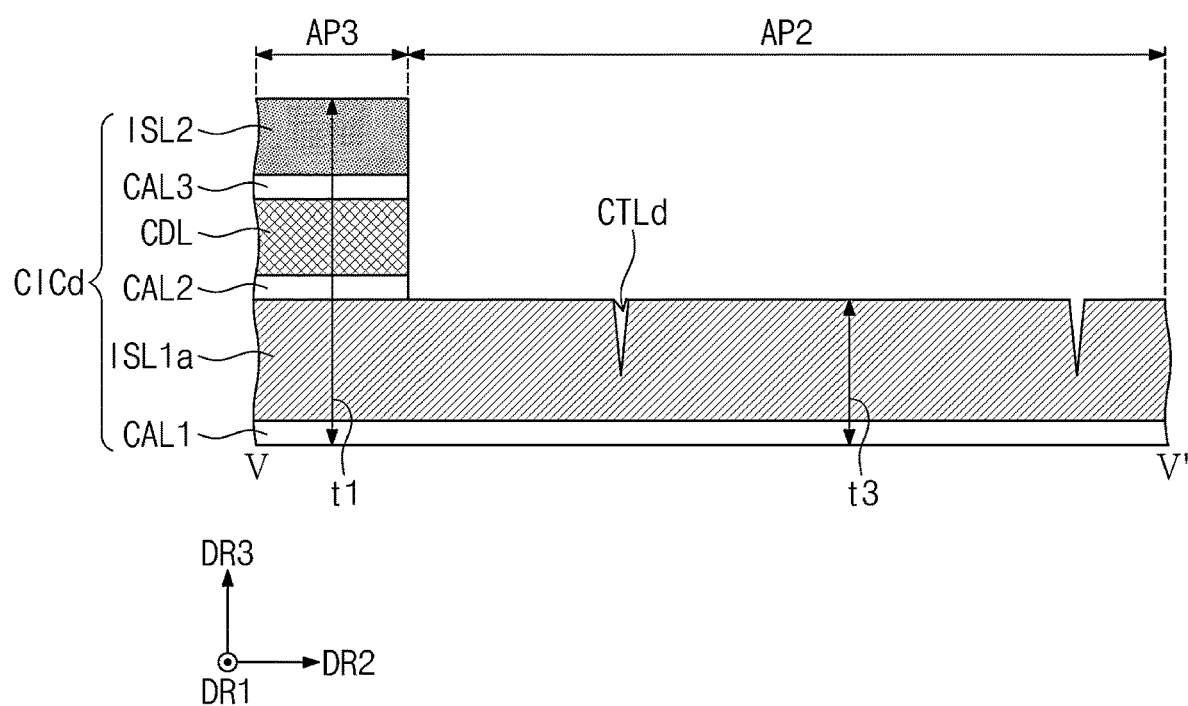

Referring to FIG. 18D, the second part AP2 of a cover film CICd may have a thickness that is smaller than that of the third part AP3. In detail, the second cover insulating layer ISL2, the intermediate layer CDL, and the second and third cover adhesive layers CAL2 and CAL3 may be omitted from the second part AP2 of the cover film CICd. That is, the second part AP2 of the cover film CICd may include a first cover insulating layer ISL1a and the first cover adhesive layer CAL1. In this case, the third part AP3 of the cover film CICd may have a first thickness t1, and the second part AP2 of the cover film CICd may have a third thickness t3 that is smaller than the first thickness t1.

A plurality of slits CTLd may be defined in the second part AP2 of the cover film CICd. The plurality of slits CTLd may be cutoff grooves that are defined by partially cutting the first cover insulating layer ISL1a.

Figure 18E:
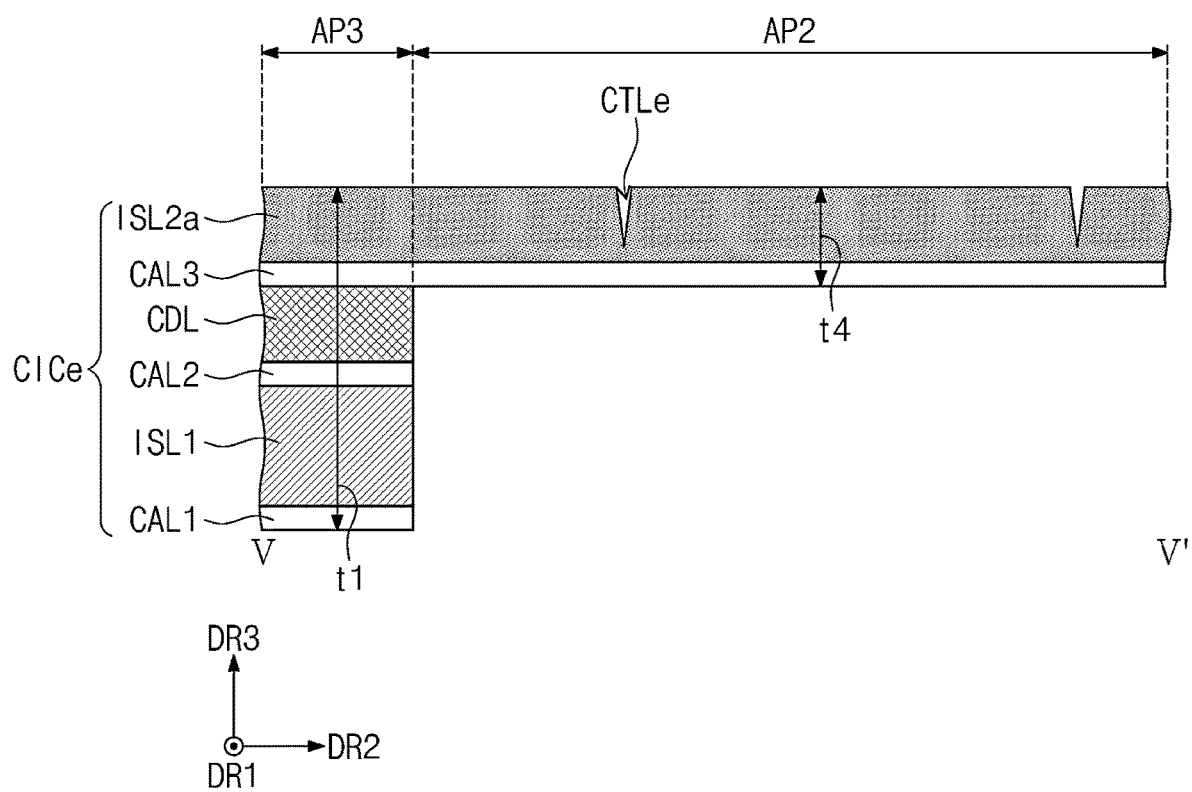

Referring to FIG. 18E, the second part AP2 of a cover film CICe may have a thickness that is smaller than that of the third part AP3. In detail, the first cover insulating layer ISL1, the intermediate layer CDL, and the first and second cover adhesive layers CAL1 and CAL2 may be omitted from the second part AP2 of the cover film CICe. That is, the second part AP2 of the cover film CICe may include a second cover insulating layer ISL2a and the third cover adhesive layer CAL3. In this case, the third part AP3 of the cover film CICe may have a first thickness t1, and the second part AP2 of the cover film CICe may have a fourth thickness t4 that is smaller than the first thickness t1.

A plurality of slits CTLe may be defined in the second part AP2 of the cover film CICe. The plurality of slits CTLe may be cutoff grooves that are defined by partially cutting the first cover insulating layer ISL2a.

Figure 19:
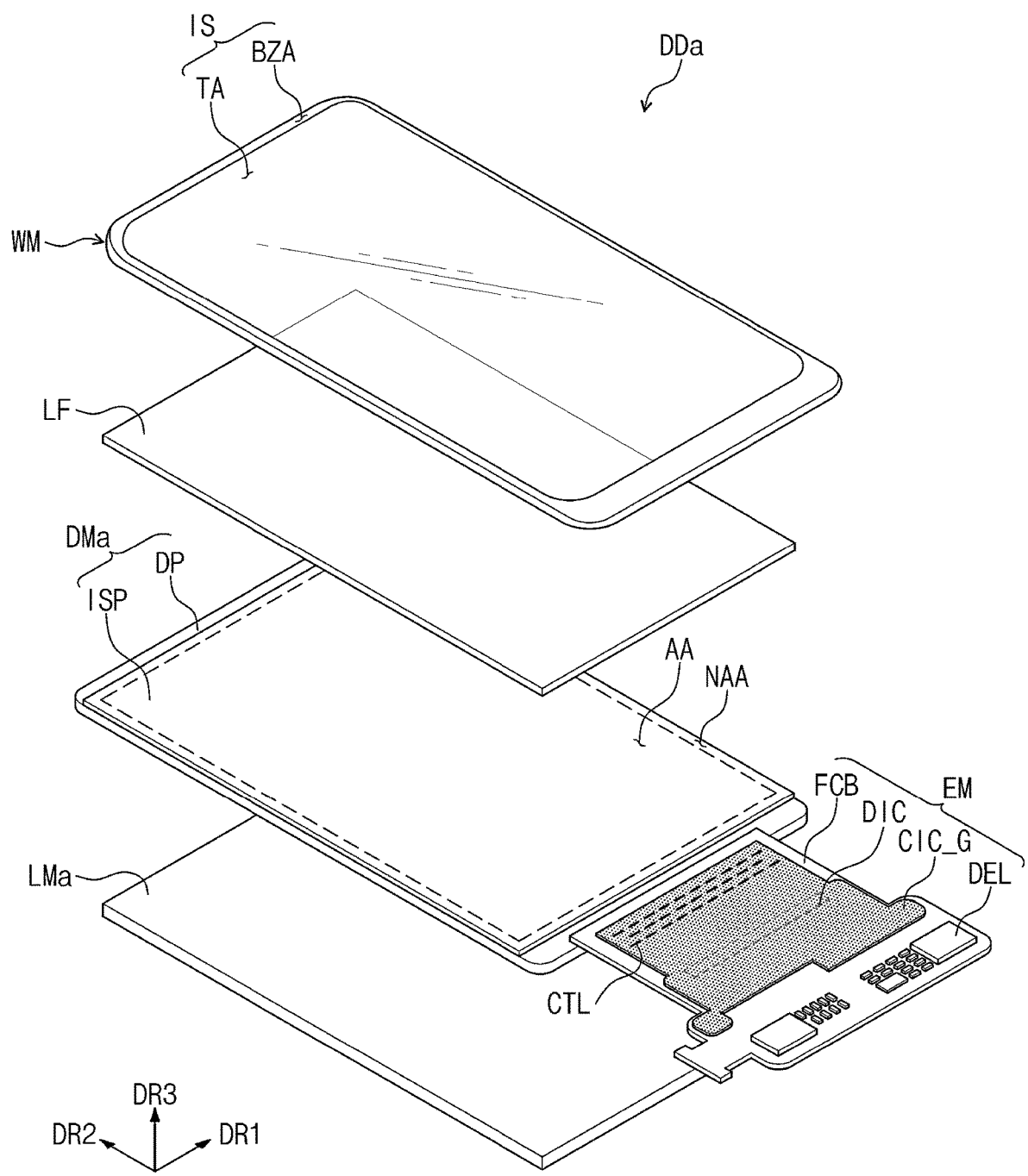
FIG. 19 is an exploded perspective view of an embodiment of a display device according to the invention.
Figure 20A:
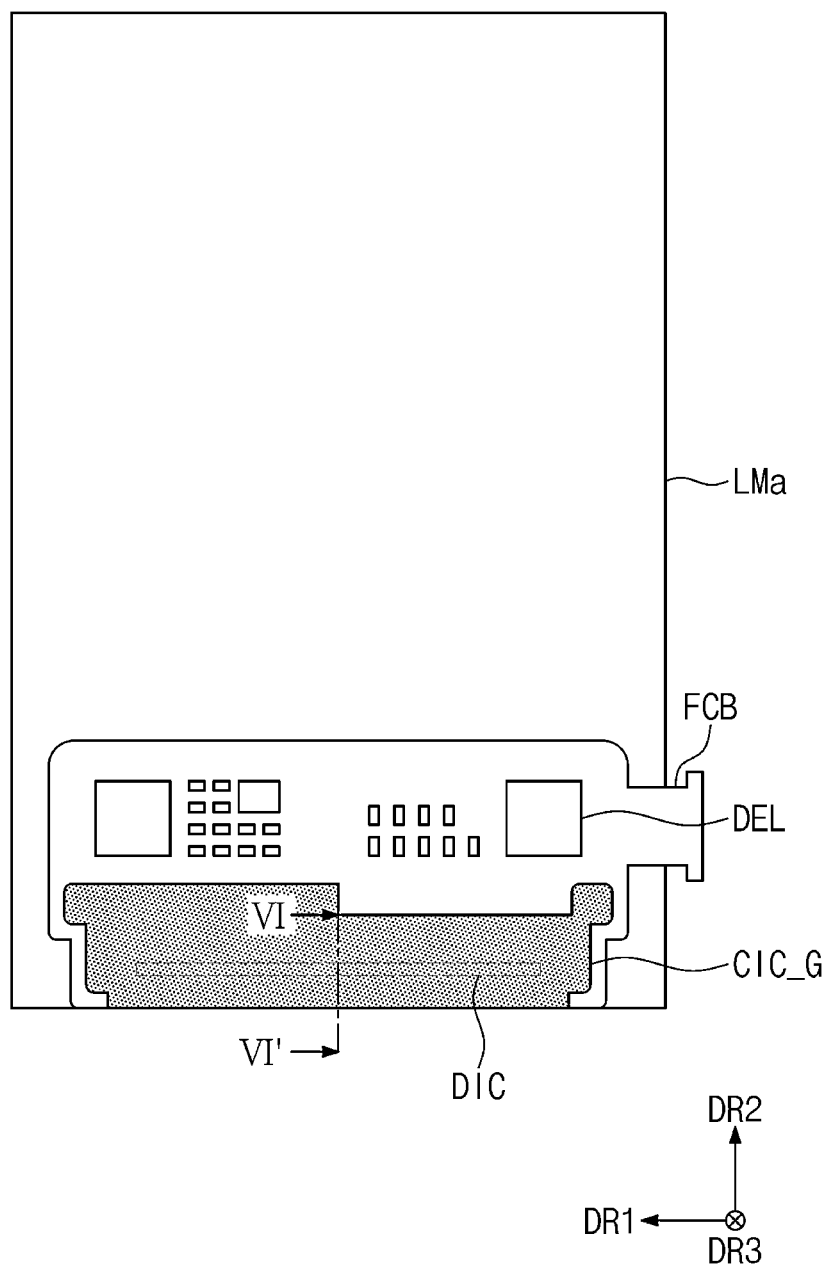
FIG. 20A is a rear view of an embodiment of a display device according to the invention.
Figure 20B:
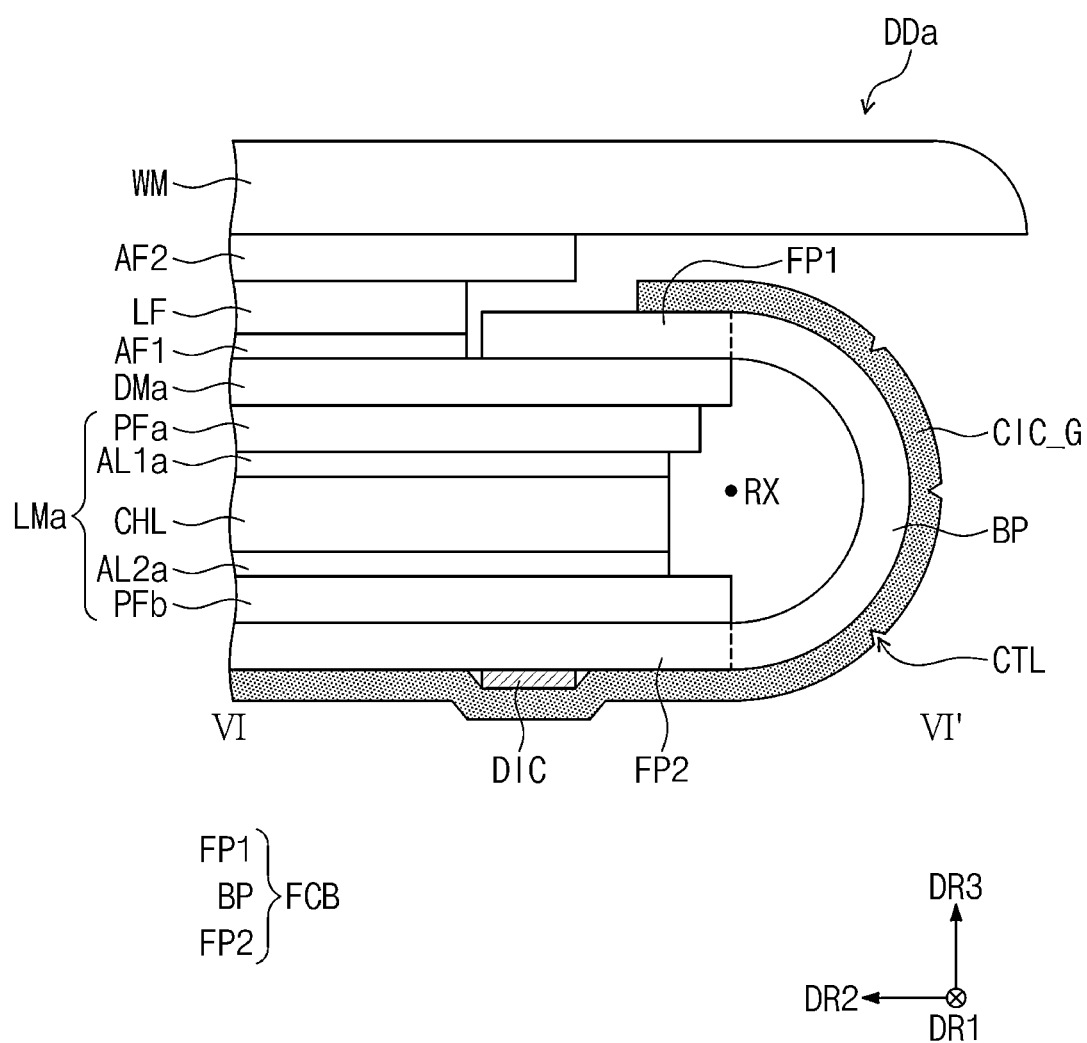
FIG. 20B is a cross-sectional view taken along cutting line VI-VI' illustrated in FIG. 20A.
Figure 20C:
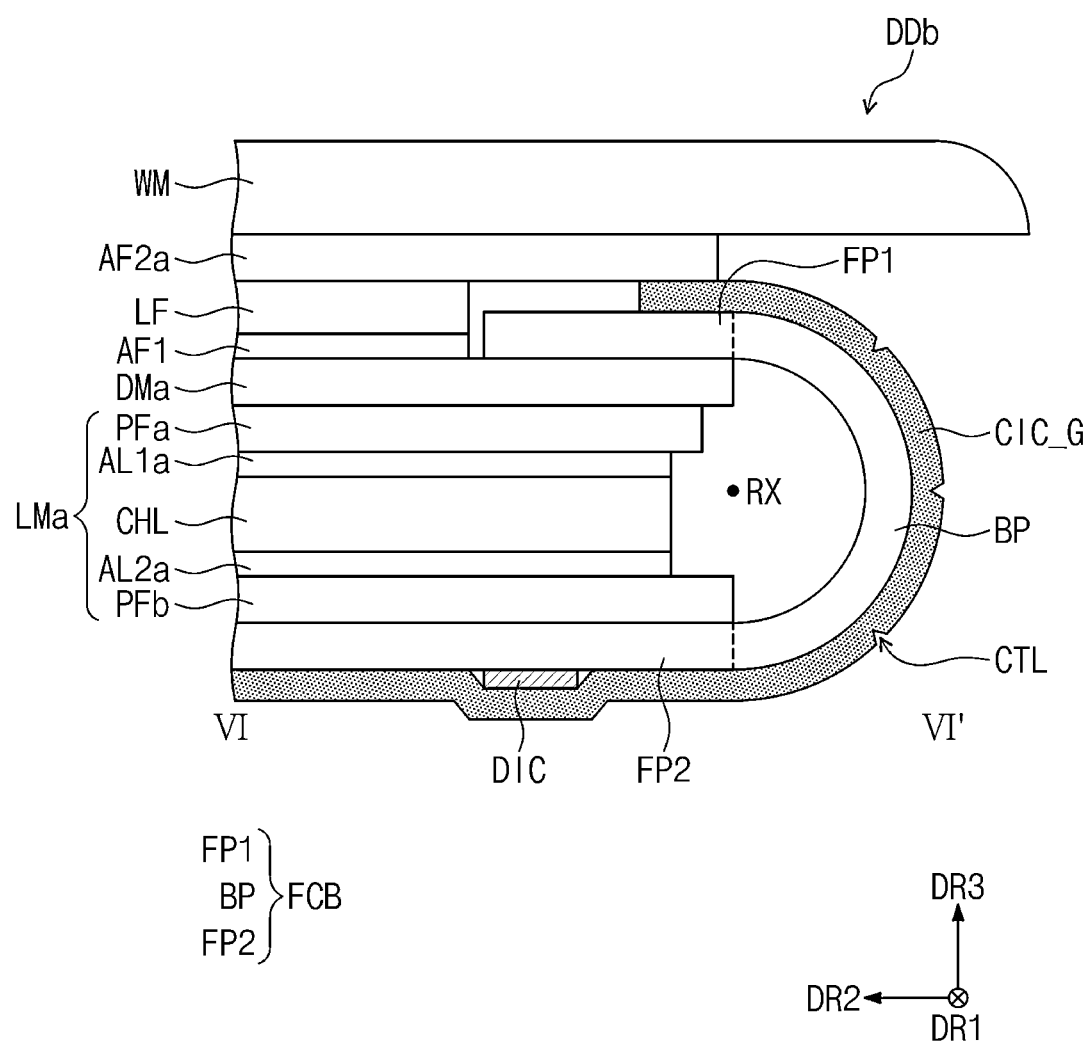
FIG. 20C is a cross-sectional view of an embodiment of a display device according to the invention.

FIG. 19 is an exploded perspective view of an embodiment of a display device according to the invention. FIG. 20A is a rear view of an embodiment of a display device according to the invention. FIG. 20B is a cross-sectional view taken along cutting line VI-VI' illustrated in FIG. 20A. FIG. 20C is a cross-sectional view of an embodiment of display device according to the invention.

Referring to FIGS. 19, 20A, and 20B, in a display device DDa in an embodiment of the invention, one end of the flexible circuit film FCB may be coupled to the non-active area NAA of the display panel DP through bonding. The driving chip DIC may be disposed (e.g., mounted) on the flexible circuit film FCB. The flexible circuit film FCB may be bent to surround a side surface of a display module DMa. Accordingly, another end of the flexible circuit film FCB is disposed on a rear surface of a lower module LMa. Here, the flexible circuit film FCB may include a first flat part FP1 coupled to the display module DMa and disposed in a flat form, a bending part BP disposed to be bent, and a second flat part FP2 disposed on a rear surface of a lower module LMa in a flat form. The bending part BP may be disposed between the first flat part FP1 and the second flat part FP2. In an embodiment, the driving chip DIC and the plurality of driving elements DEL may be disposed (e.g., mounted) on the second flat part FP2 of the flexible circuit film FCB.

A cover film CIC_G may be coupled to the flexible circuit film FCB. In an embodiment, the cover film CIC_G may be fixed to the flexible circuit film FCB, through bonding. The cover film CIC_F may cover the second flat part FP2 and the bending part BP of the flexible circuit film FCB. Furthermore, the cover film CIC_G may be disposed to cover the driving chip DIC in the second flat part FP2. In an embodiment of the invention, the driving chip DIC may be covered by the cover film CIC_G as a whole. The plurality of driving elements DEL may be exposed while not being covered by the cover film CIC_G. The cover film CIC_G may extend toward the bending part BP of the flexible circuit film FCB to cover the bending part BP of the flexible circuit film FCB. Accordingly, the cover film CIC_G may protect the bending part BP of the flexible circuit film FCB.

A shape of the cover film CIC_G is not specifically limited. The cover film CIC_G may have various shapes as long as it has a size that is large enough to cover the bending part BP of the flexible circuit film FCB and the driving chip DIC.

The cover film CIC_G may have a predetermined thickness. When the thickness of the cover film CIC_G excessively decreases, a performance of protecting the bending part BP of the flexible circuit film FCB may decrease. When the thickness of the cover film CIC_G excessively increases, a phenomenon, in which the cover film CIC_G is lifted from the bending part BP of the flexible circuit film FCB, may occur. Accordingly, the cover film CIC_G may have various thicknesses in a range, in which the lifting may be prevented while the protection performance is improved.

A plurality of slits CTL may be defined in the cover film CIC_G in correspondence to the bending part BP of the flexible circuit film FCB. The plurality of slits CTL may be cutoff grooves that are defined by cutting the cover film CIC_G. The plurality of slits CTL may overlap the bending part BP of the flexible circuit film FCB.

In an embodiment, the flexible circuit film FCB may be bent with respect to the bending axis RX, and the plurality of the slits CTL may have a shape that extends in a direction that is parallel to the bending axis RX. In an embodiment of the invention, the bending axis RX may extend in the first direction DR1 and the plurality of slits CTL may have a shape that extends in parallel to the first direction DR1. The driving chip DIC also may have a shape that extends along the first direction DR1.

The plurality of slits CTL may be arranged to be spaced apart from each other in the first direction DR1 and the second direction DR2 that crosses the first direction DR1. The plurality of slits CTL may be defined in parallel to each other in the first direction DR1, and may be disposed in a zigzag form in the second direction DR2.

When the cover film CIC_G is bent together with the flexible circuit film FCB, the plurality of slits CTL is widened, whereby a tensile stress caused in the cover film CIC_G in correspondence to the bending part BP may be reduced. Accordingly, a stress delivered to the flexible circuit film FCB coupled to the cover film CIC_G is reduced, and as a result, stresses applied to the lines disposed in the bending part BP of the flexible circuit film FCB may be reduced.

In an embodiment, the cover film CIC_G may partially overlap the first flat part FP1 of the flexible circuit film FCB. However, the invention is not limited thereto. In an embodiment, the cover film CIC_G may not overlap the first flat part FP1 of the flexible circuit film FCB.

The cover film CIC_G may interrupt noise generated around the flexible circuit film FCB and the driving chip DIC, and may protect the flexible circuit film FCB and the driving chip DIC from a danger such as an impact provided from an outside. When the cover film CIC_G extends toward the bending part BP of the flexible circuit film FCB to cover the bending part BP of the flexible circuit film FCB, it may protect the bending part BP of the flexible circuit film FCB from an external impact. Furthermore, a process of coupling a separate protection member for protecting the bending part BP of the flexible circuit film FCB and the display module DMa may be omitted, and the electronic device ED (refer to FIG. 1A) having reduced costs through the simplified process may be provided. Furthermore, the invention may provide the electronic device ED having an improved reliability by supplementing a strength of the bending part BP of the flexible circuit film FCB to prevent cracks of the lines disposed in the bending part BP of the flexible circuit film FCB.

Referring back to FIG. 20A, the lower module LMa is disposed under the display module DMa. The lower module LMa may include the cushion layer CHL, a first protection film PFa, and a second protection film PFb. The first protection film PFa may be disposed between the cushion layer CHL and the display module DMa, and the second protection film PFb may be disposed under the cushion layer CHL.

The lower module LMa further includes a first adhesive layer AL1a disposed between the first protection film PFa and the cushion layer CHL, and a second lower adhesive layer AL2a disposed between the cushion layer CHL and the second protection film PFb to couple the cushion layer CHL and the second protection film PFb.

The first and second protection films PFa and PFb may function to prevent a scratch from being caused on a rear surface of the display module DMa during a process of fabricating the display module DMa, or support the display module DMa. In an embodiment, the first and second protection films PFa and PFb may be polyimide films ("PIs"), but the materials thereof are not specially limited. The cushion layer CHL may protect the display module DMa from an impact delivered from a lower side of the display device DDa. That is, anti-impact characteristics of the display device DDa may be improved by the cushion layer CHL.

A layer (e.g., a heat dissipating layer or the like) for another function, in addition to an impact absorbing function or a protection function, may be added to the lower module LMa.

The window WM is disposed on the display module DMa. The optical film LF may be disposed between the window WM and the display module DMa. The optical film LF and the display module DMa may be coupled to each other by the first adhesive film AF1, and the window WM and the optical film LF may be coupled to each other by the second adhesive film AF2. In an embodiment of the invention, the optical film LF may not overlap the first flat part FP1 of the flexible circuit film FCB. That is, the optical film LF may be spaced apart from the first flat part FP1 of the flexible circuit film FCB in the second direction DR2.

An end of the window WM may extend further to the outside than the cover film CIC_G that covers the bending part BP of the flexible circuit film FCB. In an embodiment, the second adhesive film AF2 may not overlap the cover film CIC_G.

Referring to FIG. 20C, in a display device DDb, the second adhesive film AF2a is disposed between the window WM and the optical film LF to couple the window WM and the optical film LF. The second adhesive film AF2a may overlap the cover film CIC_G. In this case, the cover film CIC_G may extend to the first flat part FP1 of the flexible circuit film FCB. The cover film CIC_G may be coupled to the window WM by the second adhesive film AF2a. Accordingly, because the cover film CIC_G is fixed by the second adhesive film AF2a, the lifting of the cover film CIC_G from the flexible circuit film FCB may be prevented or alleviated.

Figure 21:
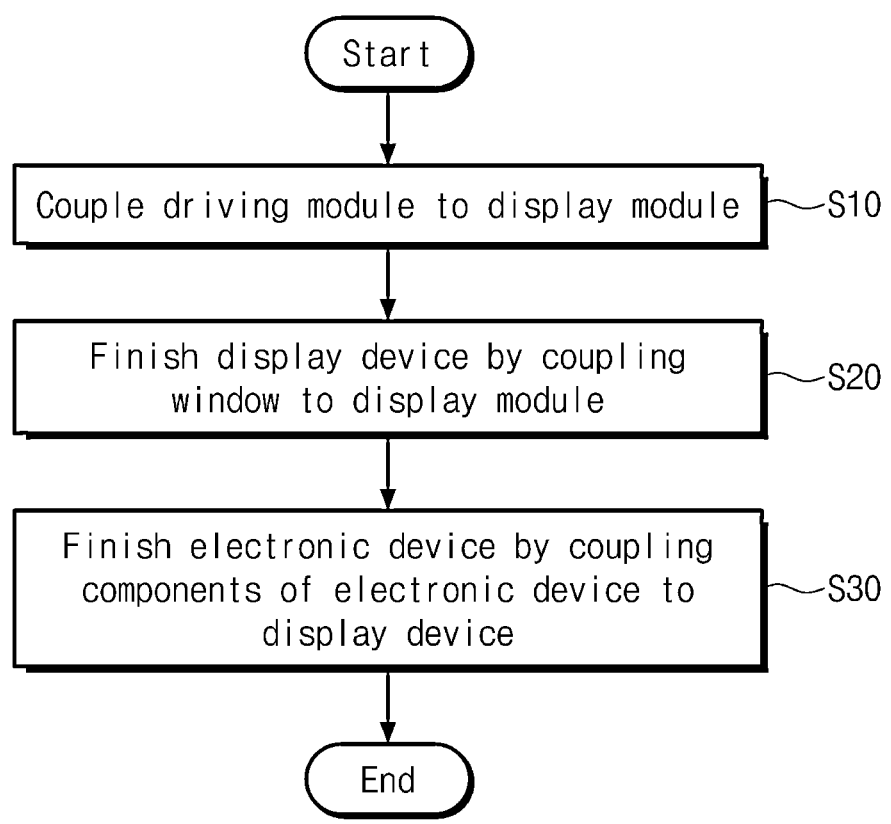
FIG. 21 is a flowchart of a method for fabricating an electronic device according to the invention.

FIG. 21 is a flowchart of an embodiment of a method for fabricating an electronic device according to the invention. FIG. 1A to FIG. 20C are referenced for the reference numerals.

First, referring to FIGS. 1A to 21, the driving module EM may be coupled to the display module DM (S10). The driving module EM may include the flexible circuit film FCB, the driving chip DIC, and the cover film CIC. The cover film CIC may be the cover films CIC_A1, CIC_A2, CIC_B1, CIC_B2, CIC_C, CIC_D, CIC_E1, CIC_E2, CIC_F, CIC_G, and CICa to CICe, which have been described with reference to FIGS. 1A to 20C.

The display device DD may be finished by coupling the window WM to the display module DM. After the window WM is coupled, the display module DM or the flexible circuit film FCB may be bent. Before the window WM is coupled to the display module DM, the lower module LM and the optical film LF may be further coupled to the display module DM.

The display device DD may be fed to be coupled to the components of the electronic device ED. In this case, the second area A2 of the display module DM or the bending part BP of the flexible circuit film FCB is covered by the cover film CIC. Accordingly, the second area A2 of the display module DM or the bending part BP of the flexible circuit film FCB may be protected by the cover film CIC to be prevented from being damaged by an external impact.

Thereafter, the components of the electronic device ED may be coupled to the display device DD (S30). The components of the electronic device ED may include the external case EDC (illustrated in FIG. 1B) physically coupled to the display device DD. When the components of the electronic device ED and the display device Dd are physically coupled to each other, an adhesive member and an additional structure may be used.

Even after the display device DD is coupled to the components of the electronic device ED, the cover film CIC may maintain a state, in which the cover film CIC is coupled to the display module DM or the flexible circuit film FCB. That is, the cover film CIC may be accommodated in the external case EDC in a state, in which the cover film CIC is coupled to the display module DM or the flexible circuit film FCB. Accordingly, even after the cover film CIC is accommodated as well as is fed, the second area A2 of the display module DM or the bending part BP of the flexible circuit film FCB may be protected.

Because the cover film CIC used to cover the driving chip DIC is used to protect the second area A2 of the display module DM or the bending part BP of the flexible circuit film FCB, a process of coupling a separate protection member for protecting the second area A2 of the display module DM or the bending part BP of the flexible circuit film FCB and the display module DM may be omitted, and the electronic device ED of reduced costs through the simplified process may be provided.

Embodiments of the invention may protect the bending area of the display module from an external impact by extending the cover film provided to cover the driving chip of the display device such that the cover film covers the bending area of the display module. Accordingly, a process of coupling a separate member for protecting the bending area of the display module and the display module may be omitted, and an electronic device having reduced costs may be provided through the simplified process.

In addition, embodiments of the invention may provide an electronic device having an improved reliability by supplementing a strength of the bending area of the display module to prevent cracks of lines disposed in the bending area.

Although the preferred embodiment of the invention has been described until now, it may be understood by an ordinary person in the art that the disclosure may be variously corrected and changed without departing from the spirit and area of the invention described in the claims. Accordingly, the technical scope of the invention is not limited to the contents descried in the detailed description, but should be determined by the claims.

What is claimed is:

1. A display device comprising:
  a display module comprising a first area including pixels, a second area bent with respect to an imaginary axis extending in a first direction, and a third area, on which a driving chip electrically connected to the pixels is disposed;
  a flexible circuit film disposed at at least a portion of the third area of the display module and including a first bottom surface attached to the display module; and
  a cover film physically contacting the second area of the display module, at least a portion of a first top surface of the flexible circuit film opposite to the first bottom surface and an entirety of a second top surface of the driving chip opposite to a second bottom surface of the driving chip facing the display module, the cover film including at least two of:
    a first cover insulating layer disposed on the second area of the display module, the portion of the first top surface of the flexible circuit film and the second top surface of the driving chip;
    an intermediate layer disposed on the first cover insulating layer and overlapping the second area of the display module, the portion of the flexible circuit film and the driving chip; and
    a second cover insulating layer disposed on the intermediate layer and overlapping the second area of the display module, the portion of the flexible circuit film and the driving chip.

2. The display device of claim 1, wherein the cover film includes the first cover insulating layer, the intermediate layer disposed on the first cover insulating layer; and the second cover insulating layer disposed on the intermediate layer.

3. The display device of claim 2, wherein the intermediate layer includes any one of a metal and a conductive fiber.

4. The display device of claim 2, wherein each of the first cover insulating layer and the second cover insulating layer includes a polymeric material.

5. The display device of claim 4, wherein the second cover insulating layer has a black color.

6. The display device of claim 2, wherein the cover film includes:
  a first cover adhesive layer disposed under the first cover insulating layer;
  a second cover adhesive layer disposed between the first cover insulating layer and the intermediate layer; and
  a third cover adhesive layer disposed between the intermediate layer and the second cover insulating layer.

7. The display device of claim 1, wherein the cover film includes a first cover layer including a metallic material and a first cover adhesive layer disposed under the first cover layer, and
  wherein the first cover adhesive layer includes an insulating adhesive.

8. The display device of claim 1, wherein the cover film has a thickness equal to or greater about 30 micrometers and equal to or less than about 120 micrometers.

9. The display device of claim 1, further comprising:
  a window disposed on the display module and including a bezel pattern,
  wherein one end of the bezel pattern defines a border of a transmission area which transmits light provided from the display module and a bezel area which shields the light.

10. The display device of claim 9, wherein the cover film extends to the first area, and one end of the cover film overlaps the bezel area.

11. The display device of claim 10, further comprising:
  an optical film disposed between the window and the display module.

12. The display device of claim 11, wherein one end of the optical film and the one end of the cover film, which face each other in the first area, are spaced apart from each other.

13. The display device of claim 11, wherein the optical film contacts the cover film in the bezel area.

14. The display device of claim 9, wherein the window includes:
  a flat part; and
  a curved part bent from the flat part while having a predetermined curvature.

15. The display device of claim 14, wherein a width of the cover film is larger than a width of the second area of the display module in the first direction.

16. The display device of claim 15, wherein a cutoff groove is defined in the cover film by removing at least a portion of the cover film, and
wherein the cutoff groove is spaced apart in the first direction from the second area of the display module and does not overlap the second area.

17. The display device of claim 1, wherein a shape of the first area of the display module is circular in a plan view, and
wherein a width of the second area of the display module in the first direction is smaller than a diameter of the first area of the display module.

18. The display device of claim 1, further comprising an optical film disposed on the display module,
wherein the cover film covers a portion of the optical film.

19. A display device comprising:
a display module comprising a first area including pixels, a second area bent with respect to an imaginary axis extending in a first direction, and a third area, on which a driving chip electrically connected to the pixels is disposed;
a flexible circuit film disposed at at least the portion of the third area of the display module and including a first bottom surface attached to the display module; and
a cover film physically contacting at least a portion of the third area, the second area, at least a portion of a first top surface of the flexible circuit film opposite to the first bottom surface and a second top surface of the driving chip opposite to a second bottom surface of the driving chip facing the display module,
wherein the cover film includes:
a first cover insulating layer disposed on the second area of the display module, the portion of the first top surface of the flexible circuit film and the second top surface of the driving chip;
an intermediate layer disposed on the first cover insulating layer and including the conductive material and overlapping the second area of the display module, the portion of the flexible circuit film and the driving chip; and
a second cover insulating layer disposed on the intermediate layer and overlapping the second area of the display module, the portion of the flexible circuit film and the driving chip.

20. The display device of claim 19, wherein each of the first cover insulating layer and the second cover insulating layer includes a polymeric material, and
wherein the conductive material includes any one of a metal and a conductive fiber.

21. The display device of claim 20, wherein the cover film includes:
a first cover adhesive layer disposed under the first cover insulating layer;
a second cover adhesive layer disposed between the first cover insulating layer and the intermediate layer, and
a third cover adhesive layer disposed between the intermediate layer and the second cover insulating layer, and
wherein the second cover adhesive layer includes a conductive adhesive.

22. The display device of claim 19, further comprising:
a window disposed on the display module, and including a flat part, and a curved part surrounding at least a portion of the flat part and bent while having a predetermined curvature.

23. The display device of claim 22, wherein a width of the cover film is larger than a width of the second area of the display module in the first direction.

24. The display device of claim 19, further comprising an optical film disposed on the display module,
wherein the cover film covers a portion of the optical film.

25. An electronic device comprising:
a display device comprising:
a display module comprising a first area including pixels, a second area bent with respect to an imaginary axis extending in a first direction, and a third area, on which a driving chip electrically connected to the pixels is disposed;
a flexible circuit film disposed at at least a portion of the third area of the display module and including a first bottom surface attached to the display module; and
a cover film physically contacting the second area of the display module, at least a portion of a first top surface of the flexible circuit film opposite to the first bottom surface and an entirety of a second top surface of the driving chip opposite to a second bottom surface of the driving chip facing the display module, the cover film including at least two of:
a first cover insulating layer disposed on the second area of the display module, the portion of the first top surface of the flexible circuit film and the second top surface of the driving chip; and
an intermediate layer disposed on the first cover insulating layer and overlapping the second area of the display module, the portion of the flexible circuit film and the driving chip; and
a second cover insulating layer disposed on the intermediate layer and overlapping the second area of the display module, the portion of the flexible circuit film and the driving chip.

* * * * *